(12) United States Patent
Takahashi

(10) Patent No.: US 6,188,109 B1
(45) Date of Patent: Feb. 13, 2001

(54) SEMICONDUCTOR DEVICE HAVING A SENSE ELECTRODE

(75) Inventor: Tetsuo Takahashi, Tokyo (JP)

(73) Assignee: Mitsubishi Denki Kabushiki Kaisha, Tokyo (JP)

(*) Notice: Under 35 U.S.C. 154(b), the term of this patent shall be extended for 0 days.

(21) Appl. No.: 09/212,263

(22) Filed: Dec. 16, 1998

(30) Foreign Application Priority Data

Jan. 13, 1998 (JP) .................................................... P10-4981
Sep. 1, 1998 (JP) ............................................ P10-246959

(51) Int. Cl.$^7$ .................................................. H01L 23/62
(52) U.S. Cl. .......................... 257/355; 257/153; 257/355
(58) Field of Search ..................................... 257/153, 328, 257/331, 333, 341, 355, 360

(56) References Cited

U.S. PATENT DOCUMENTS 5,623,152 * 4/1997 Majumdar et al. .................... 257/330

OTHER PUBLICATIONS

Y. Seki et al. "A New IGBT With A Monolithic Over–Current Protection Circuit", Proc. of the 6$^{th}$ Internat. Symposium on Power Semiconductor Devices & IC's, Davos, Switzerland May 31–Jun. 2, 1994, pp. 31–35.

Y. Shimizu, et al., "A High Performance Intelligent IGBT With Overcurrent Protection", Proc. of the 6$^{th}$ Internat. Symposium on Power Semiconductor Devices & IC's, Davos, Switzerland May 31–Jun. 2, 1994, pp. 37–39.

* cited by examiner

Primary Examiner—Mahshid Saadat
Assistant Examiner—George C. Eckert, II
(74) Attorney, Agent, or Firm—Oblon, Spivak, McClelland, Maier & Neustadt, P.C.

(57) ABSTRACT

A buried sense electrode (8) having the same structure as that of a buried gate electrode (7) is provided in an n$^-$ layer (3) of an IGBT with a sense oxide film (10) interposed therebetween. The buried sense electrode (8) senses an electric potential of the n$^-$ layer (3). If an electric potential sensed by the buried sense electrode (8) is increased to exceed a gate threshold voltage of a MOSFET (21) having an n$^+$ drain region (22), a p well region (23) and an n$^+$ source region (24), the MOSFET (21) is turned ON. At this time, a gate voltage applied across a gate electrode (13) and an emitter electrode (11) of the IGBT is reduced to a value obtained by a sum of an ON-state voltage of the MOSFET (21), a breakdown voltage of a Zener diode (16) having an n$^+$ cathode region (17) and a p$^+$ anode region (18), and a forward voltage of a diode (19) having the p$^+$ anode region (18) and an n$^+$ cathode region (20). As a result, various abnormalities such as overvoltage abnormalities as well as overcurrent abnormalities are detected.

20 Claims, 52 Drawing Sheets

US 6,188,109 B1

SEMICONDUCTOR DEVICE HAVING A SENSE ELECTRODE

BACKGROUND OF THE INVENTION

1. Field of the Invention

The present invention relates to a semiconductor device and a method for manufacturing the same, and more particularly to an improvement to enhance a protecting function against abnormalities.

2. Description of the Background Art

In general, a power semiconductor device must have excellent characteristics related to normal operation, for example, a low steady loss and a low switching loss. In addition, the power semiconductor device must have a performance to withstand to some extent or more when it is placed in unexpected abnormal conditions, for example, an overcurrent or an overvoltage is applied, that is, abnormalities are caused. In other words, the power semiconductor device must have a certain tolerance to the abnormalities.

As devices to meet such requirements, for example, a device 151 shown in FIG. 85 and a device 152 shown in FIG. 86 have been known. The devices 151 and 152 correspond to two typical examples of an IGBT (Insulated Gate Bipolar Transistor). While the device 151 is formed as an IGBT of a trench type, the device 152 is formed as an IGBT of a planar type. In this respect, the devices 151 and 152 are different from each other.

A semiconductor substrate 90 forming a main part of each of the devices 151 and 152 comprises a $p^+$ collector layer 1, an $n^+$ buffer layer 2 and an $n^-$ layer 3 sequentially provided from a lower major surface to an upper major surface. A p base layer 4 is selectively formed in an exposed surface of the $n^-$ layer 3, and an $n^+$ emitter layer 5 is selectively formed in an exposed surface of the p base layer 4. An emitter electrode 11 is connected with both the p base layer 4 and the $n^+$ emitter layer 5, and a collector electrode 12 is connected with the $p^+$ collector layer 1.

In the device 151, the p base layer 4 is connected to the emitter electrode 11L through a $p^+$ contact layer 6. A buried gate electrode 7 is provided on the inside of a gate trench 85 formed in the semiconductor substrate 90 with a gate oxide film 9 interposed therebetween. The buried gate electrode 7 is opposed to a portion of the p base layer 4 (a channel region) interposed between the $n^+$ emitter layer 5 and the $n^-$ layer 3. A gate electrode 13 is connected with the buried gate electrode 7. In the device 152, a p layer 42 is formed continuously to a lower portion of the p base layer 4. A gate electrode 13 is opposed to a portion of the exposed surface (the channel region) of the p base layer 4 provided between the $n^+$ emitter layer 5 and the $n^-$ layer 3 with the gate oxide film 9 interposed therebetween.

In both the devices 151 and 152, if a voltage which is equal to or higher than a threshold voltage is applied to the gate electrode 13 in a state in which a voltage is applied to the emitter electrode 11 and the collector electrode 12, a MOSFET including the $n^+$ emitter layer 5, the p base layer 4 and the $n^-$ layer 3 is turned ON. As a result, electrons and holes are injected into the $n^-$ layer 3 from the $n^+$ emitter layer 5 and the $p^+$ collector layer 1, respectively. Consequently, conductivity modulation is caused so that the IGBT is turned ON. If the voltage of the gate electrode 13 is changed lower than the threshold voltage, the MOSFET is turned OFF so that the injection of the electrons from the $n^+$ emitter layer 5 is stopped. As a result, the IGBT is turned OFF.

Since the device 151 has the trench type, a gate is formed along the gate trench 85 to set a high density of the channel region, that is, a high channel density. As a result, a steady loss and a switching loss can be reduced more than in the device 152 of the planar type. In the device 151, however, the channel density is set high so that a saturation current is increased in a MOSFET portion.

Consequently, when short-circuit abnormalities are caused (a load is short-circuited due to unexpected cause, or a supply voltage is applied to the device by a gate control circuit or the like in a state in which the channel is conducting), for example, a short-circuit current having an excessive magnitude flows into the device. In some cases, accordingly, a thermal runaway is caused by the short-circuit current so that the device 152 is broken, that is, a tolerance to short-circuit abnormalities (a short-circuit tolerance) is reduced.

In the device 152, the channel density is low so that the saturation current of the MOSFET has a small magnitude. Therefore, the short-circuit tolerance is higher than in the device 151. However, the steady loss and the switching loss are large and excellent characteristics cannot be obtained during normal operation.

As a technique to solve the problem of trade-off, devices shown in FIGS. 87 and 88, that is, devices having a protecting function against short-circuit abnormalities have been reported. These devices have been disclosed by Y. SEKI (p. 31–35) and Y. SHIMIZU (p. 37–39) in "Proceedings of The 6th International Symposium on Power Semiconductor Devices & IC's, (1994)".

The device indicated by a circuit symbol in FIG. 87 is formed in such a manner that a part of a main current (a collector current) flowing from a collector electrode C is split so that a small current which is proportional to the main current flowing out of an emitter electrode E, that is, a sense current can be taken out from a sense electrode SE in the devices 151 and 152 formed as the IGBTs. The emitter electrode E formed on a major surface of a semiconductor substrate is divided to form the so-called multiemitter form. A new emitter electrode E and a sense electrode SE having a parallel relationship with the emitter electrode E are formed so that the sense current can be taken out.

A device 153 shown in a circuit diagram of FIG. 88 comprises the IGBT shown in FIG. 87 as a main element, and further comprises a short-circuit protecting circuit connected with the IGBT. More specifically, a resistive element R4 is connected with the sense electrode SE of the IGBT, and a series circuit formed by a diode D12 and. a idtransistor M4 is connected with a gate electrode G and the emitter electrode E of the IGBT. The transistor M4 is formed as a MOSFET, and the sense electrode SE of the IGBT is connected with a gate electrode G of the transistor M4. The diode D12 is provided between the gate electrode G of the IGBT and a drain electrode D of the transistor M4 in a forward direction with respect to a current flowing from the gate electrode G toward the emitter electrode E of the IGBT.

FIG. 88 also shows the typical form of use of the device 153, that is, a half bridge circuit. An output of a gate power supply $V_G$ is connected with the gate electrode G of the device 153 through a gate resistive element $R_G$. A main power supply $V_{CC}$ is connected through a load L with the emitter electrode E and a collector electrode C of the device 153. A free wheel diode FWD is connected in parallel with the load L.

In the half bridge circuit, if the main current flowing in the device 153 is increased due to short-circuit of the load L, that is, short-circuit abnormalities, the sense current flowing through the sense electrode SE is also increased. Since the sense current flows into the resistive element $R_4$, a large voltage drop is generated across the resistive element $R_4$ with the increase in the sense current.

The voltage drop across the resistive element $R_4$ is input as a gate voltage to the gate electrode G of the transistor M4. Therefore, when the main current of the IGBT exceeds a certain level, the transistor M4 is short-circuited. As a result, an electric potential of the gate electrode G of the IGBT is lowered through the diode D12 so that a rise in the main current of the IGBT is suppressed. Thereafter, a gate voltage for cutting off the IGBT is supplied from the gate power supply $V_G$ to the gate electrode G of the IGBT within a certain time. Consequently, the IGBT can be cut off safely without damage.

In the device 153 according to the prior art described above, the tolerance of the main element to the short-circuit abnormalities can be increased by operation of the short-circuit protecting circuit. In respect of a structure of the main element such as the IGBT, however, it is not easy to take out the sense current having a magnitude which is proportional to a magnitude of the main current. In addition, since abnormalities caused on the main element are detected through the sense current, only overcurrant abnormalities caused by the short-circuit abnormalities or the like can effectively be detected and a tolerance to other abnormalities cannot be enhanced.

SUMMARY OF THE INVENTION

A first aspect of the present invention is directed to a semiconductor device comprising a semiconductor substrate defining a major surface and including a plurality of semiconductor regions, first and second main electrodes connected with the semiconductor substrate, and a control electrode attached to the semiconductor substrate, a main current flowing in the semiconductor substrate across the first and second main electrodes being controlled in response to a signal input to the control electrode, and a voltage sensing section opposed to a portion of one of the semiconductor regions in which an electric potential is changed depending on a change in an electric potential of the second main electrode defining a reference point thereof on the first main electrode with an insulating film interposed therebetween for sensing an electric potential of the portion.

A second aspect of the present invention is directed to the semiconductor device according to the first aspect of the present invention, wherein the voltage sensing section includes a conductor section forming a capacitor together with the portion and with the insulating film interposed therebetween.

A third aspect of the present invention is directed to the semiconductor device according to the second aspect of the present invention, further comprising a protecting circuit, the protecting circuit including a switching element having one main electrode and the other main electrode and an insulated gate and serving to conduct and cut off the one main electrode and the other main electrode in response to a voltage signal input to the insulated gate, and the insulated gate being connected with the conductor section.

A fourth aspect of the present invention is directed to the semiconductor device according to the third aspect of the present invention, wherein the one main electrode, is connected with the first main electrode, and the other main electrode is connected with the control electrode.

A fifth aspect of the present invention is directed to the semiconductor device according to the second aspect of the present invention, further comprising a protecting circuit, the protecting circuit including first to Nth (which is an integer not smaller than 2) switching elements, each of the 1st to Nth switching elements having one main electrode, the other main electrode and an insulated gate, and serving to conduct and cut off the one main electrode and the other main electrode in response to a voltage signal input to the insulated gate.

The first to Nth switching elements are connected with each other in such a manner that the Nth switching element is conducted and cut off if the first switching element is conducted and cut off, respectively, the insulated gate of the first switching element is connected with the conductor section, and the one of main electrodes and the other main electrode of the Nth switching element are connected with the first main electrode and the control electrode, respectively.

A sixth aspect of the present invention is directed to the semiconductor device according to the fourth or fifth aspect of the present invention, wherein the protecting circuit further includes a series circuit having a rectifying element and a voltage regulating element, the other main electrode is connected with the control electrode through the series circuit, and the rectifying element and the voltage regulating element are oriented in such a manner that an ON-state current of the switching element having the other main electrode connected with the control electrode flows in a forward direction in the rectifying element and a voltage drop caused by the ON-state current is kept constant by the voltage regulating element.

A seventh aspect of the present invention is directed to the semiconductor device according to the fourth or fifth aspect of the present invention, wherein the protecting circuit further includes a resistive element, and the other main electrode is connected with the control electrode through the resistive element.

An eighth aspect of the present invention is directed to the semiconductor device according to any of the third to seventh aspects of the present invention, wherein a gate threshold voltage of the switching element having the insulated gate connected with the conductor section is set to a value which is not larger than a maximum value of a voltage to be applied to the insulated gate within a range of a safety operating area defined by a voltage to be applied to the first and second main electrodes and a maximum value of the main current which can be cut off at the applied voltage.

A ninth aspect of the present invention is directed to the semiconductor device according to any of the third to eighth aspects of the present invention, further comprising an insulating layer formed on the major surface of the semiconductor substrate, wherein at least a part of the protecting circuit is formed as a thin film semiconductor circuit on the insulating layer.

A tenth aspect of the present invention is directed to the semiconductor device according to the ninth aspect of the present invention, wherein the conductor section and the insulated gate are integrally formed as one common portion.

An eleventh aspect of the present invention is directed to the semiconductor device according to any of the third to eighth aspects of the present invention, wherein the semiconductor substrate includes a junction isolation region selectively formed in the major surface as one of the plurality of semiconductor regions, the junction isolation region forms a pn-junction with a periphery surrounding the same, and at least a part of the protecting circuit is formed in the junction isolation region.

A twelfth aspect of the present invention is directed to the semiconductor device according to any of the second to eleventh aspects of the present invention, wherein the conductor section is buried from the major surface to an inner portion of the semiconductor substrate with said including film interposed therebetween.

A thirteenth aspect of the present invention is directed to the semiconductor device according to the twelfth aspect of the present invention, wherein the control electrode is buried from the major surface to the inner portion of the semiconductor substrate with another insulating film interposed therebetween.

A fourteenth aspect of the present invention is directed to the semiconductor device according to any of the second to eleventh aspects of the present invention, wherein the conductor section is opposed to the major surface of the semiconductor substrate with the insulating film interposed therebetween, and the control electrode is opposed to the major surface of the semiconductor substrate with another insulating film interposed therebetween.

A fifteenth aspect of the present invention is directed to the semiconductor device according to any of the third to fourteenth aspects of the present invention, wherein the major surface of the semiconductor substrate is divided into M (=plural number) blocks, the first main electrode, the second main electrode, the control electrode, the insulating film and the conductor section are divided into M unit first main electrodes, M unit second main electrodes, M unit control electrodes, M unit insulating films and M unit conductor sections, respectively, the protecting circuit, the switching element, the one of main electrodes, the other main electrode and the insulated gate are divided into M unit protecting circuits, M unit switching elements, M unit main electrodes, M unit other main electrodes and M unit insulated gates, respectively.

The M unit first main electrodes, the M unit second main electrodes, the M unit control electrodes, the M unit insulating films, the M unit conductor sections, the M unit protecting circuits, the M unit switching elements, the M unit main electrodes, the M unit other main electrodes and the M unit insulated gates are respectively arranged with one-to-one correspondence in the M blocks, and one of the M unit insulated gates and one of the M unit conductor sections which are arranged in each of the M blocks are connected with each other.

A sixteenth aspect of the present invention is directed to the semiconductor device according to the first aspect of the present invention, wherein the voltage sensing section includes a semiconductor section of a conductivity type which is opposed to the portion with the insulating film interposed therebetween and in which an inversion layer is formed by action of an electric potential of the portion.

A seventeenth aspect of the present invention is directed to the semiconductor device according to the sixteenth aspect of the present invention, wherein referring to the semiconductor section as a first semiconductor section, the device further comprising second and third semiconductor sections of conductivity types different from a conductivity type of the first semiconductor section which are joined with the first semiconductor section interposed therebetween, the second and third semiconductor sections being connected with the first main electrode and the control electrode, respectively.

An eighteenth aspect of the present invention is directed to the semiconductor device according to the sixteenth or seventeenth aspect of the present invention, wherein an impurity concentration of the semiconductor section is set such that an inversion layer is formed in the semiconductor section under rated conditions of the device.

A nineteenth aspect of the present invention is directed to the semiconductor device according to the ninth aspect of the present invention, wherein the semiconductor substrate includes, as one of the semiconductor regions, a potential fixing layer formed selectively in a region having a portion directly under the insulating layer in the major surface, the potential fixing layer forming a pn-junction with a periphery thereof and having a higher impurity concentration than the periphery, the semiconductor device further comprising a potential fixing electrode which is in contact with the potential fixing layer, the potential fixing electrode being connected with the first main electrode.

A twentieth aspect of the present invention is directed to the semiconductor device according to the nineteenth aspect of the present invention, wherein the control electrode is divided into a plurality of unit control electrodes along the major surface, and the conductor section is positioned between the whole unit control electrodes and the potential fixing layer.

A twenty-first aspect of the present invention is directed to the semiconductor device according to the nineteenth aspect of the present invention, wherein the control electrode is divided into a plurality of unit control electrodes along the major surface, and the conductor section is positioned between adjacent two of the unit control electrodes.

A twenty-second aspect of the present invention is directed to the semiconductor device according to any of the nineteenth to twenty-first aspects of the present invention, wherein the potential fixing electrode is positioned between the control electrode and the insulating layer.

A twenty-third aspect of the present invention is directed to any of the nineteenth to twenty-first aspects of the present invention, wherein the potential fixing electrode is annularly formed to surround the insulating layer.

A twenty-fourth aspect of the present invention is directed to the semiconductor device according to the eleventh aspect of the present invention, wherein the semiconductor substrate includes, as one of the semiconductor regions, a carrier removing layer of the same conductivity type as that of the junction isolation region which is selectively formed in the major surface to be isolated from the junction isolation region, the carrier removing layer forming a pn junction with a periphery thereof, having a higher impurity concentration than the periphery and being positioned between the control electrode and the junction isolation region, the semiconductor device further comprising a carrier removing electrode which is in contact with the carrier removing layer, the carrier removing electrode being connected with the first main electrode.

A twenty-fifth aspect of the present invention is directed to the semiconductor device according to the twenty-fourth aspect of the present invention, wherein the control electrode is divided into a plurality of unit control electrodes along the major surface, and the conductor section is positioned between the whole unit control electrodes and the carrier removing layer.

A twenty-sixth aspect of the present invention is directed to the semiconductor device according to the twenty-fourth aspect of the present invention, wherein the control electrode is divided into a plurality of unit control electrodes along the major surface, and the conductor section is positioned between adjacent two of the unit control electrodes.

A twenty-seventh aspect of the present invention is directed to the semiconductor device according to any of the twenty-fourth to twenty-sixth aspects of the present invention, further comprising another carrier removing electrode which is in contact with the junction isolation region, the another carrier removing electrode being connected with the first main electrode.

A twenty-eighth aspect of the present invention is directed to the semiconductor device according to any of the third to eighth aspects of the present invention, further comprising an insulating layer formed on the major surface of the semiconductor substrate, wherein a first section which is a part of the protecting circuit is formed as a thin film semiconductor circuit on the insulating layer, the semiconductor substrate includes, as one of the semiconductor regions, a junction isolation region which is selectively formed in the major surface, the junction isolation region forming a pn-junction with a periphery thereof, and a second section which is another part of the protecting circuit is formed in the junction isolation region, the first section being positioned between the control electrode and the second section.

A twenty-ninth aspect of the present invention is directed to the semiconductor device according to the twenty-eighth aspect of the present invention, wherein the semiconductor substrate includes, as one of the semiconductor regions, a potential fixing layer formed selectively in a region having a portion directly under the insulating layer in the major surface, the potential fixing layer forming a pn-junction with a periphery thereof and having a higher impurity concentration than the periphery, the semiconductor device further comprising a potential fixing electrode which is in contact with the potential fixing layer, the potential fixing electrode being connected with the first main electrode.

A thirtieth aspect of the present invention is directed to the semiconductor device according to the twenty-eighth or twenty-ninth aspect of the present invention, wherein the semiconductor substrate includes, as one of the semiconductor regions, a carrier removing layer of the same conductivity type as that of the junction isolation region which is selectively formed in the major surface to be isolated from the junction isolation region, the carrier removing layer forming a pn junction with a periphery thereof, having a higher impurity concentration than the periphery and being positioned between the control electrode and the insulating layer, the semiconductor device further comprising a carrier removing electrode which is in contact with the carrier removing layer, the carrier removing electrode being connected with the first main electrode.

A thirty-first aspect of the present invention is directed to the semiconductor device according to any of the ninth, eleventh, and nineteenth to thirtieth aspects of the present invention, wherein the semiconductor substrate, referring to the major surface as an upper major surface, further defines a lower major surface, the first main electrode, the control electrode and the conductor section are provided on an upper major surface side, the second main electrode is in contact with the lower major surface, the semiconductor substrate includes, as one of the semiconductor regions, a semiconductor layer which is exposed on the lower major surface and is in contact with the second main electrode, the semiconductor layer forming a pn junction with a periphery thereof, having a higher impurity concentration than the periphery, supplying minority carriers to the periphery, and having a thickness set larger in a first section including portions directly under the first main electrode and the control electrode than in a second section including a portion directly under the protecting circuit.

A thirty-second aspect of the present invention is directed to the semiconductor device according to any of the ninth, eleventh, and nineteenth to thirty-first aspects of the present invention, wherein the semiconductor substrate, referring to the major surface as an upper major surface, further defines a lower major surface, the first main electrode, the control electrode and the conductor section are provided on the upper major surface side, the second main electrode is in contact with the lower major surface, the semiconductor substrate includes, as one of the semiconductor regions, the semiconductor layer which is exposed on the lower major surface and is in contact with the second main electrode, the semiconductor layer forming the pn junction with the periphery thereof, having the higher impurity concentration than the periphery, supplying the minority carriers to the periphery, and having the impurity concentration set higher in a first section including the portions directly under the first main electrode and the control electrode than in a second section including the portion directly under the protecting circuit.

A thirty-third aspect of the present invention is directed to the semiconductor device according to the thirty-first or thirty-second aspect of the present invention, wherein the first section also includes a portion directly under the conductor section.

A thirty-fourth aspect of the present invention is directed to the semiconductor device according to any of the ninth, eleventh and nineteenth to thirty-third aspects of the present invention, wherein a lifetime killer is selectively introduced into a region directly under the protecting circuit except regions directly under the first main electrode and the control electrode in the semiconductor substrate.

A thirty-fifth aspect of the present invention is directed to the semiconductor device according to the thirty-fourth aspect of the present invention, wherein the lifetime killer is introduced also except a region directly under the conductor section.

A thirty-sixth aspect of the present invention is directed to a method for manufacturing a semiconductor device comprising a semiconductor substrate including a plurality of semiconductor regions, and first and second main electrodes and a control electrode connected with the semiconductor substrate, a main current flowing in the semiconductor substrate across the first and second main electrodes being controlled in response to a signal input to the control electrode, the method comprising the steps of forming the semiconductor substrate, connecting the first and second main electrodes and the control electrode with the semiconductor substrate, forming an insulating film oil a portion of one of the semiconductor regions in which an electric potential is changed depending on a change in an electric potential of the second main electrode defining a reference point thereof on the first main electrode, and forming, on the insulating film, a voltage sensing section opposed to the portion with the insulating film interposed therebetween for sensing an electric potential of the portion.

According to the first aspect of the present invention, the voltage sensing section is provided. It is possible to detect that the device performs normal or abnormal operation, providing that a magnitude of a voltage sensed by the voltage sensing section is discriminated by using the switching element and the like, for example. In other words, the voltage sensing section can be used for detecting abnormalities of the device. In place of the current flowing in the semiconductor substrate, the electric potential of the semiconductor substrate is used for detecting abnormalities. Therefore, it is also possible to detect other kinds of abnormalities such as overvoltage abnormalities as well as overcurrent abnormalities.

According to the second aspect of the present invention, the voltage sensing section includes the conductor section forming the capacitor together with the portion of the semiconductor region and with the insulating film interposed therebetween. Therefore, an excellent proportional characteristic can be obtained between the electric potential sensed by the conductor section and the electric potential of the portion of the semiconductor region. Consequently, abnormalities can be detected with high precision. It is sufficient that the conductor section is formed of polysilicon or a conductor such as metal. Thus, a structure can be simplified.

According to the third aspect of the present invention, the switching element having the insulated gate connected with the conductor section is provided. Therefore, abnormalities of the device can be detected through ON/OFF operation of the switching element, and feedback to a control circuit or the like can be performed. The insulated gate does not hinder the proportional characteristic between the electric potential sensed by the conductor section and the electric potential of the portion of the semiconductor region. Consequently, precision of abnormality detection can be kept high.

According to the fourth aspect of the present invention, the switching element is connected with the first main electrode and the control electrode. Therefore, when abnormalities are detected by the switching element, a magnitude of the main current flowing across the first and second main electrodes is limited. In other word, a tolerance to abnormalities of the device can be enhanced.

According to the fifth aspect of the present invention, the switching element for receiving the voltage signal of the conductor section and the switching element for limiting the main current of the device can be divided into the first and Nth switching elements. Therefore, a sensitivity to detect abnormalities and a limit value of the main current obtained when abnormalities are caused can be set independently. More specifically, flexibility of a design can be increased so that the device can easily be designed.

According to the sixth aspect of the present invention, the switching element and the control electrode are connected with each other through the series circuit having the rectifying element and the voltage regulating element. Therefore, the limit value of the main current obtained when abnormalities are detected can be set widely. Furthermore, the rectifying element can prevent a backward current from being applied to the switching element. In other words, a semiconductor device comprising a protecting circuit having a high usefulness can be obtained.

According to the seventh aspect of the present invention, the switching element and the control electrode are connected with each other through the resistive element. Therefore, the limit value of the main current obtained when abnormalities are detected can be set widely. In other words, it is possible to implement a semiconductor device comprising a protecting circuit which has a simple structure and can easily be manufactured.

According to the eighth aspect of the present invention, the gate threshold voltage of the switching element is related to a safety operating area of the device. Therefore, abnormalities can be detected within a range in which operation of the device does not exceed the safety operating area. By utilizing the abnormality detection performed by the switching element, accordingly, the operation of the device can be prevented from exceeding the safety operating area even if abnormalities are caused.

According to the ninth aspect of the present invention, at least a part of the protecting circuit is formed as the thin film semiconductor circuit over the major surface of the semiconductor substrate with the insulating layer interposed therebetween. Consequently, a portion corresponding to a main element and at least a part of the protecting circuit are incorporated in a single chip. Therefore, a capacitance and a resistance generated parasitically when the main element and the protecting circuit are connected with each other can be reduced and a size of the device can be decreased. Furthermore, the main element and a part of components of the protecting circuit can also be formed simultaneously at common manufacturing steps. Thus, a manufacturing process can be simplified as a whole device.

According to the tenth aspect of the present invention, the conductor section. and the insulated gate are integrally formed as one common portion. Therefore, it is not necessary to form the conductor section and the insulated gate separately. Consequently, A the manufacturing process can be simplified and a manufacturing cost can be reduced.

According to the eleventh aspect of the present invention, at least a part of the protecting circuit is formed in the junction isolation region of the semiconductor substrate. Consequently, a portion corresponding to the main element and at least a part of the protecting circuit are incorporated in a single chip. Therefore, a capacitance and a resistance generated parasitically when the main element and the protecting circuit are connected with each other can be reduced and a size of the device can be decreased. Furthermore, the main element and a part of the components of the protecting circuit can also be formed simultaneously at common manufacturing steps. Thus, a manufacturing process can be simplified as a whole device.

According to the twelfth aspect of the present invention, the conductor section is buried from the major surface to the inner portion of the semiconductor substrate. Therefore, an electrostatic capacitance between the conductor section and the portion of the semiconductor region can be increased while reducing an area of the conductor section occupying the major surface of the semiconductor substrate. Consequently, the influence of a capacitance generated when the switching element or the like is connected with the conductor section is reduced so that a sensitivity to detect abnormalities can be increased.

According to the thirteenth aspect of the present invention, since the control electrode is formed to have the same structure as that of the conductor section, both of them can be formed simultaneously at common manufacturing steps. In other words, the manufacturing process can be simplified.

According to the fourteenth aspect of the present invention, the conductor section and the control electrode have the simplest and common structure. Therefore, the manufacturing process can be simplified effectively.

According to the fifteenth aspect of the present invention, the portion corresponding to the main element and the protecting circuit are divided into a plurality of blocks, respectively. Therefore, it is possible to effectively reduce a capacitance and a resistance which are parasitically generated by connection of the main element and the protecting circuit. Consequently, a size of the device can be minimized providing that a size of the block is optimized within a range from a minimum size corresponding to a cell acting as a minimum unit of the main element to a maximum size made by dividing the main element into two portions.

According, to the sixteenth aspect of the present invention, since the semiconductor section is opposed to the portion of the semiconductor region with the insulating film interposed therebetween, the inversion layer is formed in the semiconductor section by action of the electric potential of the portion. Consequently, abnormalities of the device can be detected. In other words, it is possible to make. a decision whether or not the device is in an abnormal state as well as to simply sense a magnitude of the electric potential.

According to the seventeenth aspect of the present invention, since the switching element has the first to third semiconductor sections, abnormalities of the device can be detected through ON/OFF operation of the switching element. It is not necessary to provide the voltage sensing section separately from the first semiconductor section as a component of the switching element. In addition, a gate electrode of the, switching element is not necessary. Therefore, abnormalities of the device can be detected with a simple structure. Since the structure of the device is simple, the device can easily be manufactured.

According to the eighteenth aspect of the present invention, conditions for forming the inversion layer are related to the rated conditions of the device. Therefore, when the operation of the device reaches the rated conditions, abnormalities can be detected. By utilizing the abnormality detection performed by the switching element, accordingly, the operation of the device can be prevented from exceeding the rated range even if abnormalities are caused.

According to the nineteenth aspect of the present invention, the potential fixing layer having an electric potential fixed to the first main electrode is selectively formed in the region including the portion directly under the insulating layer in the upper major surface of the semiconductor substrate. Therefore, it is possible to suppress the influence of a fluctuation in the electric potential caused by the main current on the portion of the protecting circuit formed on the insulating layer. As a result, stability of operation of the protecting circuit can be enhanced.

According to the twentieth aspect of the present invention, the control electrode is divided into a plurality of unit control electrodes so that a main element is divided into a plurality of cells. Therefore, a high power device can be implemented. In addition, the conductor section is positioned between the whole unit control electrodes and, the potential fixing layer. Consequently, a wiring connecting the conductor section and the protecting circuit can be shortened. Thus, the stability of the operation of the protecting circuit can be enhanced still more.

According to the twenty-first aspect of the present invention, the control electrode is divided into a plurality of unit control electrodes so that the main element is divided into a plurality of cells. Therefore, a high power device can be implemented. In addition, since the conductor section is positioned in a portion interposed between the unit control electrodes, an electric potential inside the main element can be sensed. Consequently, abnormalities of the main element can be detected with higher precision.

According to the twenty-second aspect of the present invention, the potential fixing electrode for fixing the potential fixing layer to an electric potential of the first main electrode is positioned between the control electrode and the insulating layer, that is, in a portion which is the closest to the main element. Therefore, the electric potential of the potential fixing layer is fixed to the electric potential of the first main electrode more effectively.

According to the twenty-third aspect of the present invention, the potential fixing electrode is annularly formed to surround the insulating layer. Therefore, a fluctuation in the electric potential of the potential fixing layer is suppressed more effectively.

According to the twenty-fourth aspect of the present invention, the carrier removing layer which is electrically connected with the first main electrode is formed between the control electrode and the junction isolation region. Therefore, a part of the main current can effectively be prevented from flowing into the junction isolation region. Consequently, the stability of the operation of the protecting circuit can be enhanced.

According to the twenty-fifth aspect of the present invention, the control electrode is divided into a plurality of unit control electrodes so that the main element is divided into a plurality of cells. Therefore, a high power device can be implemented. In addition, the conductor section is positioned between the whole unit control electrodes and the carrier removing layer. Consequently, a wiring connecting the conductor section and the protecting circuit can be shortened. Thus, the stability of the operation of the protecting circuit can be enhanced still more.

According to the twenty-sixth aspect of the present invention, the control electrode is divided into a plurality of unit control electrodes so that the main element is divided into a plurality of cells. Therefore, a high power device can be implemented. In addition, since the conductor section is positioned in a portion interposed between the unit control electrodes, an electric potential inside the main element can be sensed. Consequently, abnormalities of the main element can be detected with higher precision.

According to the twenty-seventh aspect of the present invention, the junction isolation region is connected with the first main electrode through another carrier removing electrode. Therefore, a component of the main current flowing into the, junction isolation region is effectively removed into the first main electrode. Consequently, the stability of the operation of the protecting circuit can be enhanced more effectively.

According to the twenty-eighth aspect of the present invention, the first section of the protecting circuit which is formed as a thin film semiconductor circuit is provided between the control electrode and the second section of the protecting circuit which is formed in the semiconductor substrate, that is, in a portion closer to the main element. More specifically, the second section which is easily affected more sensitively by the main current is placed in a portion distant from the main element. Therefore, the stability of the operation of the whole protecting circuit can be enhanced without increasing an area of the semiconductor substrate.

According to the twenty-ninth aspect of the present invention, the potential fixing layer having an electric potential fixed to the first main electrode is selectively formed in the region including the portion directly under the insulating layer in the upper major surface of the semiconductor substrate. Therefore, it is possible to suppress the influence of a fluctuation in the electric potential caused by the main current on the portion of the protecting circuit which is formed on the insulating layer. As a result, the stability of the operation of the protecting circuit can be enhanced still more.

According to the thirtieth aspect of the present invention, the carrier removing layer which is electrically connected with the first main electrode is formed between the control electrode and the insulating layer. Therefore, a part of the main current can effectively be prevented from flowing into the junction isolation region. Consequently, the stability of the operation of the protecting circuit can be enhanced still more.

According to the thirty-first aspect of the present invention, the semiconductor layer which is in contact with the second main electrode and supplies the minority carriers has the thickness set larger in the first section than in the second section. Therefore, the component of the main current flowing toward the protecting circuit can be reduced effectively. Consequently, the stability of the operation of the protecting circuit can be enhanced still more.

According to the thirty-second aspect of the present invention, the semiconductor layer which is in contact with the second main electrode and supplies the minority carriers has the impurity concentration set higher in the first section than in the second section. Therefore, the component of the main current flowing toward the protecting circuit can be reduced effectively. Consequently, the stability of the operation of the protecting circuit can be enhanced still more.

According to the thirty-third aspect of the present invention, the semiconductor layer directly under the conductor section is within the first section similarly to the main element. Therefore, precision in detection of abnormalities of the main element which is performed by the conductor section can be increased effectively.

According to the thirty-fourth aspect of the present invention, the lifetime killer is introduced into the region directly under the protecting circuit except the regions directly under the first main electrode and the control electrode in the semiconductor substrate, that is, a region where the main element is placed. Consequently, the component of the main current flowing in the region directly under the protecting circuit is reduced. As a result, the stability of the operation of the protecting circuit can be enhanced still more.

According to the thirty-fifth aspect of the present invention, the lifetime killer is, introduced also except the region directly under the conductor section. Therefore, the precision in the detection of the abnormalities of the main element which is performed by the conductor section can be increased effectively.

According to the thirty-sixth aspect of the present invention, the device according to the first aspect of the present invention can be manufactured easily. Thus, it is an object of the present invention to provide a semiconductor device with high precision which can detect various abnormalities as well as overcurrert abnormalities, and a suitable method for manufacturing the semiconductor device.

These and other objects, features, aspects and advantages of the present invention will become more apparent from the following detailed description of the present invention when taken in conjunction with the accompanying drawings.

DESCRIPTION OF THE PREFERRED EMBODIMENTS

<1. First Embodiment>

First of all, a device according to a first embodiment will be described below.

<1-1. Structure.>

Figure 1:
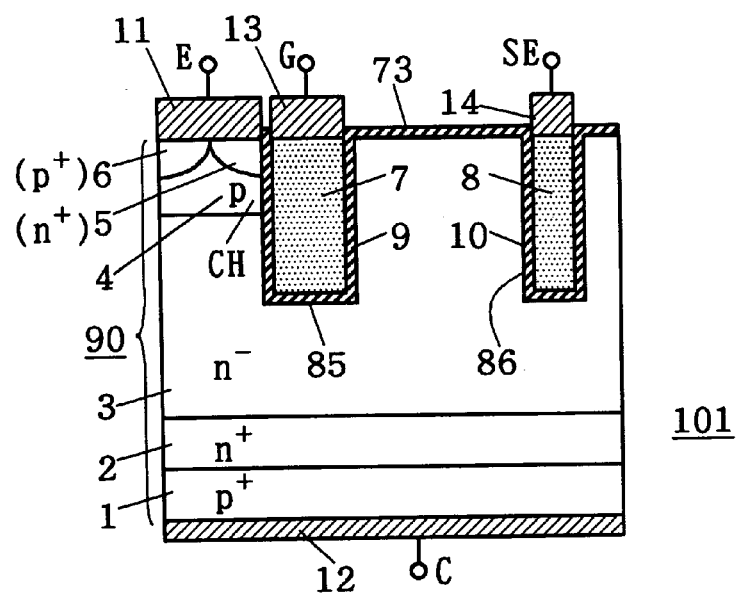
FIG. 1 is a sectional front view showing a device according to a fi:st embodiment.

FIG. 1 is a sectional front view showing a semiconductor device according to the first embodiment. A device 101 is formed as an IGBT. As will be described below, the device 101 is characteristically different from the conventional device 151 in that a sense electrode 14, a buried sense electrode 8, a trench (referred to as a "sense trench" in the present specification) 86 into which the buried sense electrode 8 is buried, and an oxide film (referred to as a "sense oxide film" in the present specification) 10 interposed between the buried sense electrode 8 and an inner surface of the sense trench 86 are provided.

A $p^+$ collector layer 1, an $n^+$ buffer layer 2 and an $n^-$ layer 3 are sequentially provided in the form of stacked layers from a lower major surface to an upper major surface in a semiconductor substrate 90 including silicon as a base material. The $p^+$ collector layer 1 is exposed to the lower major surface of the semiconductor substrate 90, and the $n^-$ layer 3 is exposed to the upper major surface of the semiconductor substrate 90. A p base layer 4 is selectively formed in an exposed surface of the n layer 3 more shallowly than the $n^-$ layer 3.

Furthermore, an $n^+$ emitter layer 5 and a $p^+$ contact layer 6 are selectively formed in an exposed surface of the p base layer 4 side by side more shallowly than the p base layer 4 so as not to protrude into the $n^-$ layer 3 provided around the p base layer 4. On the upper major surface of the semiconductor substrate 90, an emitter electrode (E) 11 is connected with the $n^+$ emitter layer 5 and the $p^+$ contact layer 6. On the lower major surface of the semiconductor substrate 90, a collector electrode (C) 12 is connected with the $p^+$ collector layer 1.

A gate trench 85 is formed in the upper major surface of the semiconductor substrate 90. The gate trench 85 is opened on the upper major surface of the semiconductor substrate 90, and has a sidewall formed to face a region of the p base layer 4 interposed between the $n^+$ emitter layer 5 and the $n^-$ layer 3, that is, a channel region CH. In addition, the gate trench 85 is formed more deeply than the p base layer 4 in such a manner that at least a part thereof reaches the $n^-$ layer 3. A buried gate electrode 7 is provided on the inside of the gate trench 85 with a gate oxide film 9 acting as an insulating film interposed therebetween.

In other words, the buried gate electrode 7 faces the channel region CH with the gate oxide film 9 interposed therebetween. A gate electrode (G) 13 is connected with a, top portion of the buried gate electrode 7. Thus, the $n^+$ emitter layer 5, the channel region CH, and the $n^-$ layer 3 together with the buried gate electrode 7 form a MOSFET.

Another trench similar to the gate trench 85 is further formed as the sense trench 86 in the upper major surface of the semiconductor substrate 90. The sense trench 86 is opened on the upper major surface of the semiconductor substrate 90 and is provided in an exposed surface of the $n^-$ layer 3 so as not to be adjacent to the channel region CH differently from the gate trench 85. The sense trench 86 is formed more deeply than the p base layer 4 such that at least a part thereof reaches the $n^-$ layer 3 in the same manner as the gate trench 85. However, a depth of the sense trench 86 does not need to be equal to that of the gate trench 85. It is, however, desirable that their depths should be so equal to each other that the gate trench 85 and the sense trench 86 can be formed simultaneously at the same manufacturing step.

The buried sense electrode 8 is buried in the sense trench 86 with the sense oxide film 10 as an insulating film interposed therebetween. In other words, the buried sense electrode 8 faces the $n^-$ layer 3 with the sense oxide film 10 interposed therebetween. A sense electrode (SE) 14 is connected with a top portion of the buried sense electrode 8. The buried gate electrode 7 and the buried sense electrode 8 are formed of polysilicon doped with an impurity having a high concentration.

That part of the upper major surface of the semiconductor substrate 90 which is not covered with the emitter electrode 11 is covered with an oxide film 73. As will be described later, the oxide film 73 is so formed as to cover inner surfaces of the gate trench 85 and the sense trench 86 as well as the upper major surface of the semiconductor substrate 90 in a process for forming the oxide film 73. Namely, the gate oxide film 9 and the sense oxide film 10 are formed as a part of the oxide film 73.

The emitter electrode 11 includes an electrode portion which is directly in contact with the n+ emitter layer 5 and the p+ contact layer 6, an emitter wiring connected with the electrode portion, and a terminal connected with the emitter wiring (a pad or the like). Similarly, the collector electrode 12 includes an electrode portion which is directly in contact with the p+ contact layer 1, a collector wiring connected with the electrode portion, and a terminal connected with the collector wiring.

The gate electrode 13 includes an electrode portion which is directly in contact with the buried gate electrode 7, a gate wiring connected with the electrode portion, and a terminal connected with the gate wiring. Similarly, the sense electrode 14 includes an electrode portion which is directly in contact with the buried sense electrode 8, a sense wiring connected with the electrode portion, and a terminal connected with the sense wiring.

The emitter electrode 11, the collector electrode 12, the gate electrode 13 and the sense electrode 14 are formed of metal including aluminum as a base material, or other conductive materials. The gate electrode 13 and the sense electrode 14 may be formed of the same materials as those of the buried gate electrode 7 and the buried sense electrode 8 with which they are connected, for example, polysilicon doped with an impurity having a high concentration, respectively.

Figure 2:
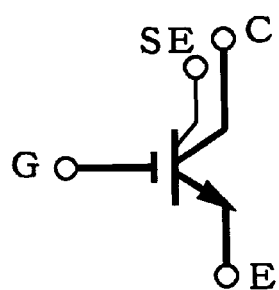
FIG. 2 is a diagram showing a circuit symbol of the device according to the first embodiment.

FIG. 2 shows a circuit symbol of the device 101. The circuit symbol shown in FIG. 2 directly represents a characteristic of the device 101 that another electrode, that is, a sense electrode SE is formed on a part of the semiconductor substrate in parallel with a gate electrode G of the IGBT according to the prior art with an insulating film interposed therebetween.

<1-2. Operation>

Figure 3:
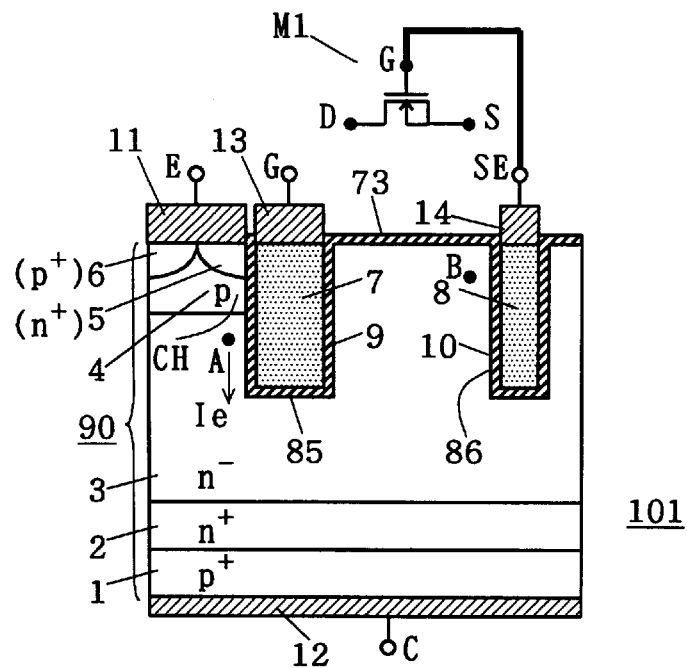
FIG. 3 is a view showing the form of use of the device according to the first embodiment.

FIG. 3 is a view illustrating the form of use of the device 101. In the form of use illustrated in FIG. 3, the sense electrode 14 is connected with a gate electrode (an insulating gate) G of a transistor (a switching element) M1 for detecting abnormalities of the device 101. In this example, the transistor M1 is formed as a MOSFET and has a source electrode S connected with the emitter electrode 11 of the device 101, which is not shown. A signal for detecting abnormalities of the device 101 is taken out through a drain electrode D of the transistor M1.

Figure 4:
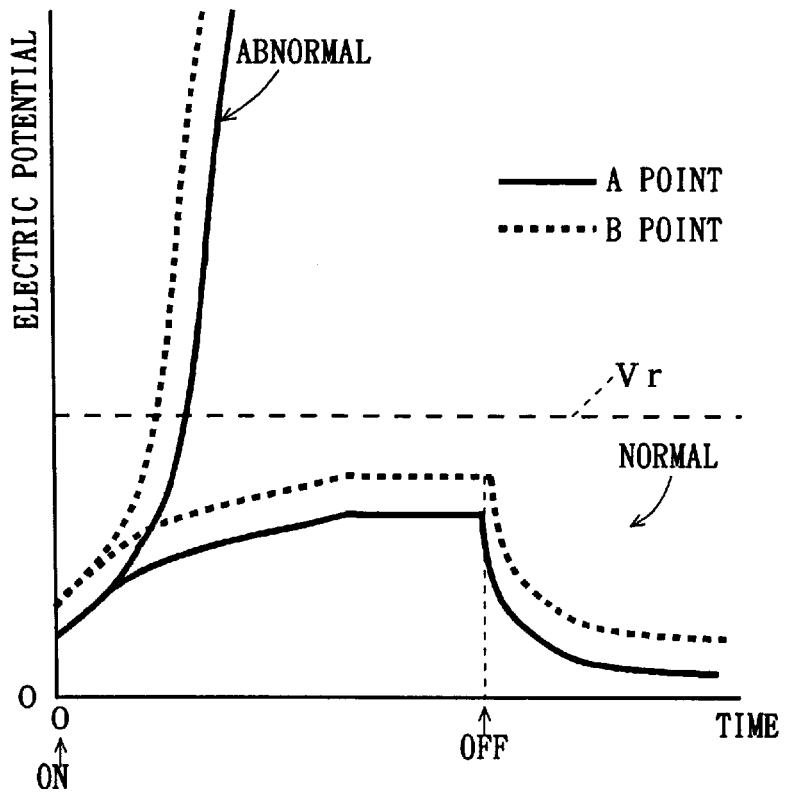
FIG. 4 is a graph for explaining operation of the device according to the first embodiment.

FIG. 4 is a graph showing operation of the device 101 and representing a charge in an electric potential on A and B points in FIG. 3. The A and B points correspond to a portion of the n[] layer 3 which faces the buried gate electrode 7 and a portion facing the buried sense electrode 8, respectively. The electric potential shown in FIG. 4 defines its reference point on the emitter electrode 11. Operation of the device 101 will be described below with reference to FIGS. 3 and 4.

The operation of the device 101 as the IGBT excluding the operation of the buried sense electrode 8 and the sense electrode 14 is the same as that of the device 151 according to the prior art. More specifically, if a gate voltage (an electric potential of the gate electrode 13 defining its reference point at the emitter electrode 11) which exceeds a positive gate threshold voltage inherent in the device 101 is applied to the gate electrode 13 in a state in which a supply voltage is applied through a load across the emitter electrode 11 and the collector electrode 12 (in such a manner that the voltage becomes positive on the collector electrode 12 side), an n-type inversion layer is formed in the channel region CH.

As a result, the n+ emitter layer 5 and the n− layer 3 are conducted through the channel region CH. More specifically, a MOSFET formed by the n− layer 3, the p base layer 4, the n+ emitter layer 5, the gate oxide film 9 and the buried gate electrode 7 is turned ON. Consequently, electrons are injected from the n+ emitter layer 5 and holes, are injected from the p+ collector layer 1. Therefore, conductivity modulation is caused in the n− layer 3 so that the emitter electrode 11 and the collector electrode 12 are conducted. In other words, the device 101 is turned ON.

If the gate voltage to be applied across the collector electrode 12 and the gate electrode 13 is returned to a value which is lower than the gate threshold voltage, for example, zero or a negative value, the inversion layer formed in the channel region CH disappears so that a portion between the n+ emitter layer 5 and the n− layer 3 is cut off. As a result, excess carriers in the n− layer 3 are swept out so that the conductivity modulation of the n− layer 3 is eliminated so that a portion between the emitter electrode 11 and the collector electrode 12 is cut off. More specifically, the device 101 is turned OFF.

During normal operation of the device 101, a channel current Ie flowing across the emitter electrode 11 and the collector electrode 12 forming a pair of main electrodes is equal to or smaller than a rated operating current, and a voltage $V_{CE}$ across the collector electrode 12 and the emitter electrode 11 is equal to or smaller than a rated operating voltage. The rated operating current has a value of a current which should flow across the main electrodes of the device 101 in a normal steady ON state, and the rated operating voltage should be held across the main electrodes of the device 101 in a normal OFF state in a circuit including the device 101. Accordingly, the electric potentials on the A and B points remain in a region having a voltage which is equal to or lower than a certain reference voltage Vr, that is, a region corresponding to the normal operation as shown in FIG. 4.

On the other hand, when the device 101 is brought into a short-circuit state, that is, the rated operating voltage is applied across the collector electrode 12 and the emitter electrode 11 and the channel is turned ON, the electric potential on the A point is rapidly raised as shown in FIG. 4. Consequently, the electric potential on the B point is also raised rapidly. If appropriate protective measures are not taken, the electric potential considerably exceeds the reference voltage Vr defining the normal operation as in the devices 151 and 152 according to the prior art and the device is broken in a short time.

The buried sense electrode 8 (and the sense electrode 14 connected thereto) form a capacitor together with the n− layer 3 with the sense oxide film 10 interposed therebetween. Consequently, the change in the electric potential on the B point can be detected through the sense electrode 14. In other words, the buried sense electrode 8 and the sense electrode 14 function as voltage sensing sections for sensing the electric potential at the B point. As shown in FIG. 3, when the sense electrode 14 is connected with the gate electrode G of the transistor M1, a gate voltage V (MOSFET gate) of the transistor M1 is obtained as expressed by Equation 1.

$$V(\text{MOSFET·gate}) = V(\text{B point}) \cdot C(\text{sense})/\{C(\text{sense}) + C(\text{MOSFET})\} \quad (1)$$

The voltage V (B point) represents an electric potential at the B point, the capacitance C (sense) represents an electrostatic capacitance across the buried sense electrode 8 and the n⁻ layer 3, and the capacitance C (MOSFET) represents an electrostatic capacitance which is incidental to the gate electrode G of the transistor M1.

In other words, the capacitance C (sense) represents a capacitance of the sense oxide film 10 interposed between the buried sense electrode 8 and the n⁻ layer 3, and the capacitance C (MOSFET) represents a capacitance of a gate oxide film (not shown) which is interposed between the gate electrode G and a semiconductor layer of the transistor M1. The Equation 1 indicates that the gate voltage V (MOSFET-gate) is obtained by dividing the voltage V (B point) by the capacitance C (sense) and the capacitance C (MOSFET). More specifically, if the capacitance C (sense) and the capacitance C (MOSFET) are properly set, a sensitivity of the sense electrode 14 to the voltage V (B point) of the n⁻ layer 3, that is, the gate voltage V (MOSFET gate) can freely be determined.

Accordingly, a gate threshold voltage of the transistor M1 may be set to a value of the gate voltage V (MOSFET·gate) obtained when the device 101 falls onto the boundary between normal and abnormal states, that is, a value of the gate voltage V (MOSFET·gate) obtained when the voltage V (B point) is coincident with the reference voltage Vr. It is preferable that the boundary between the normal and abnormal states should correspond to rated conditions of the device 101. The gate threshold voltage can freely be set according to a thickness of the gate oxide film of the transistor M1 and an impurity concentration of the channel region to which the gate electrode is opposed.

When the gate threshold voltage of the transistor M1 is set to such a magnitude, the transistor M1 stays OFF if the device 101 operates within a normal operation range, and is turned ON if the device 101 reaches an abnormal operation range. In other words, abnormalities of the device 101 can be detected by the transistor M1.

Even if the gate threshold voltage of the transistor M1 is set to a value which is equal to or greater than the reference voltage Vr, abnormalities can be detected. More specifically, it is preferable that the gate voltage V (MOSFET·gate) which is higher than the reference voltage Vr and has a sufficient margin for breakage of the device should be set to the threshold voltage of the transistor M1. In general, examples of an index of a limit to safely cut off a current without breakage include a SOA (Safety Operating Area) such as a short-circuit SOA, a switching SOA or the like.

Figure 5:
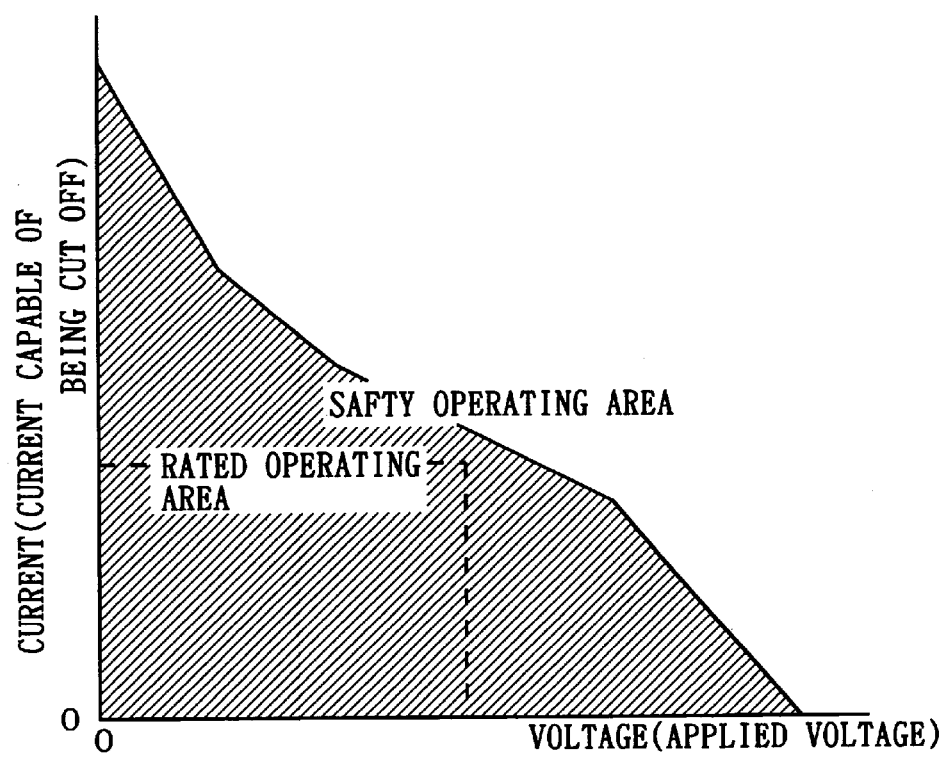
FIG. 5 is a graph for explaining the operation of the device according to the, first embodiment.

As shown in FIG. 5, general circuit elements are often fabricated with some margin for the rated operating area. In such a case, accordingly, if the highest voltage at the B point during operation within the safety operating area is referred to with Vr', the threshold voltage of the transistor M1 is preferably set to the voltage Vr'. By performing such a design, a difference is made between the voltage Vr' acting as a maximum voltage at the B point during the normal operation and the threshold voltage of the transistor M1 so that a margin for a malfunction of the transistor M1 can be increased.

It is important that the design should be performed in such a manner that the value of the gate voltage V (MOSFET·gate) exceeds the gate threshold voltage of the transistor M1 on a certain point during abnormal operation.

<1-3. Advantage>

As described above, the capacitor is formed by the buried sense electrode 8, the sense oxide film 10 and the n⁻ layer 3, and a magnitude of a voltage signal detected by the sense electrode 14 through the buried sense electrode 8 is discriminated by using the transistor M1, for example. Thus, it is possible to detect whether the device 101 is in the normal or abnormal state. As expressed by the Equation 1, the gate voltage V (MOSFET·gate) is proportional to the voltage V (B point) with a value defined by two capacitances as a proportional coefficient. The capacitances are specific constants for the device 101 and the transistor M1, respectively.

In the device 101, an excellent proportional characteristic can be obtained between the electric potential of the n⁻ layer 3 and the detected electric potential. For this reason, abnormalities can be detected with high precision. Since the abnormaliides are detected based on the electric potential of the n⁻ layer 3, it is possible to detect other abnormalities such as overvoltage abnormalities and the like as well as the overcurrent abnormalities caused by the short-circuit of the load or the like.

The gate electrode is also buried as the buried gate electrode 7 into the gate trench 85. In the same manner as in the device 151 according to the prior art, therefore, it is possible to gain an advantage that the steady loss and the switching loss are reduced as compared with those in the conventional device 152 and a high main current density is obtained at the same time. Furthermore, the device 101 can be formed by additionally providing the buried sense electrode 8 which is formed in the same manner as the buried gate electrode 7. Therefore, especially complicated manufacturing steps are not necessary differently from the device 151 according to the prior art.

More specifically, the sense oxide film 10, the buried sense electrode 8 and the sense electrode 14 can be formed simultaneously at the steps of forming the gate oxide film 9, the buried gate electrode 7 and the gate electrode 13, respectively. In particular, the gate trench 85 and the sense trench 86 can be formed simultaneously at the same step if they are set to have the same depth.

As described above, the device 101 can detect various abnormalities with high precision without damaging advantages of the characteristics, a shape and dimension, and a manufacturing method in the device 151 according to the prior art.

<1-4. Manufacturing Method>

FIGS. 6 to 11 are views showing a preferred method for manufacturing the device 101. As will be described below with reference to the drawings, the device 101 can be manufactured by using a well-known conventional wafer process without requiring a complicated step in the same manner as the device 151 according to the prior art.

Figure 6:
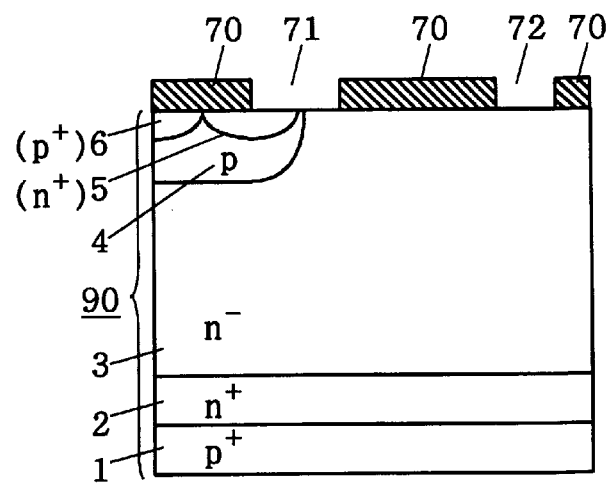
FIGS. 6 to 11 are views showing processes for manufacturing the device according to the first embodiment.

In order to manufacture the device 101, a step shown in FIG. 6 is first executed. At the step shown in FIG. 6, a semiconductor substrate 90 is first formed. Since the step of forming the semiconductor substrate 90 is the same as the step of forming the semiconductor substrate 90 of the device 151 according to the prior art, its detailed description will be omitted. A p⁺ collector layer 1, an n⁺ buffer layer 2 and an n⁻ layer 3 are provided in this order from a lower major surface toward an upper major surface in the semiconductor substrate 90.

Then, a p base layer 4 is selectively formed in an exposed surface of the n⁻ layer 3, and an n⁺ emitter layer 5 and a p⁺ contact layer 6 are selectively formed within an exposed surface of the p base layer 4 more shallowly than the p base layer 4, respectively. The p base layer 4, the n⁺ emitter layer 5 and the p⁺ contact layer 6 can selectively be formed by selectively implanting p-type or n-type impurities using a shield patterned by a well-known patterning technique, and by then diffusing the implanted impurities. The p⁺ contact layer 6 may be formed at subsequent stages of the manufacturing process instead of this stage.

Thereafter, an oxide film mask 70 for trench etching is formed on the upper major surface of the semiconductor substrate 90. The oxide film mask 70 is formed in the following manner. An oxide film is formed over the upper major surface of the semiconductor substrate 90. Then, the oxide film is subjected to patterning by using ordinary photolithography. Thus, the oxide film mask 70 is formed. As a result, openings 71 and 72 are selectively formed on the oxide film mask 70. Positions of the openings 71 and 72 correspond to a gate trench 85 and a sense trench 86, respectively.

More specifically, the opening 71 is formed in a position where the gate trench 85 provided thereunder can penetrate the p⁺ contact layer 6 and the n⁺ emitter layer 5, or a position where at least a sidewall of the gate trench 85 can be opposed to a portion of the p base layer 4 interposed between the n⁺ emitter layer 5 and the n⁻ layer 3, that is, the channel region CH (FIG. 1). The opening 72 is formed in a position where the sense trench 86 provided thereunder can penetrate the n⁻ layer 3, that is, a position where the n⁻ layer 3 is exposed outside of the p base layer 4.

Figure 7:
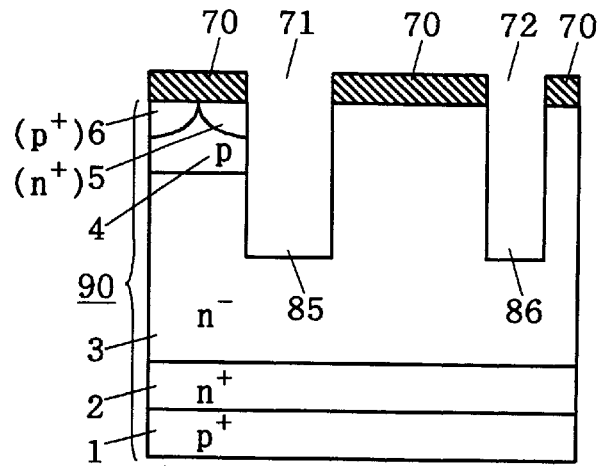
Figure 8:
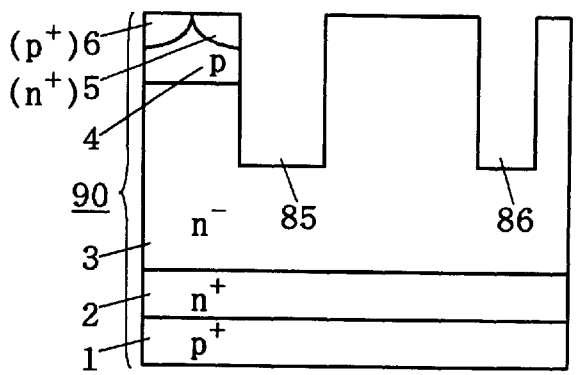

Next, anisotropic etching is executed by using the oxide film mask 70 as a shield so that the gate trench 85 and the sense trench 86 are formed as shown in FIG. 7. At this time, the gate trench 85 and the sense trench 86 have the same depth. Subsequently, oxide film etching is performed so that the oxide film mask 70 is removed as shown in FIG. 8. In this case, a so-called sacrificial oxidation step may be added to remove defects formed on internal walls of the gate trench 85 and the sense trench 86, and the like.

Figure 9:
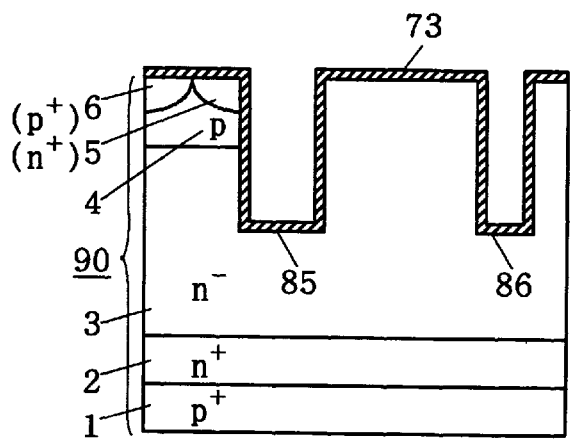
Figure 10:
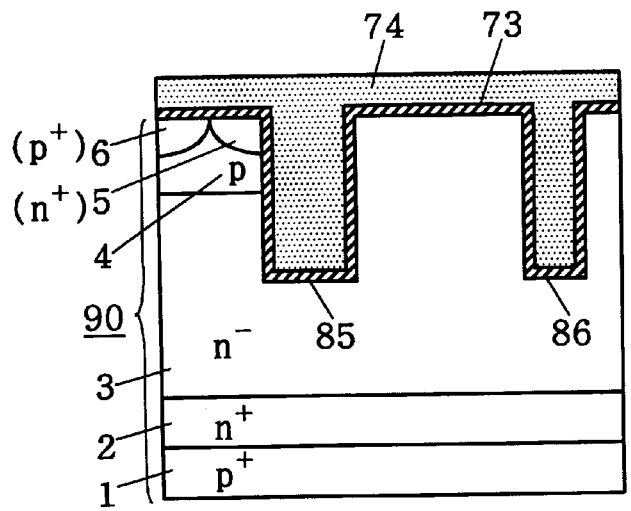

Then, an oxide film 73 is formed over a whole upper surface of the semiconductor substrate 90 including the internal walls of the gate trench 85 and the; sense trench 86 as shown in FIG. 9. A portion of the oxide film 73 covering the internal wall of the gate trench 85 corresponds to a gate oxide film 9, and a portion of the oxide film 73 covering the internal wall of the sense trench 86 corresponds to the sense oxide film 10. Subsequently, a polysilicon layer 74 doped with an impurity having a high concentration is formed on the oxide film 73 covering the upper major surface of the semiconductor substrate 90, the gate trench 85 and the sense trench 86 as shown in FIG. 10.

Figure 11:
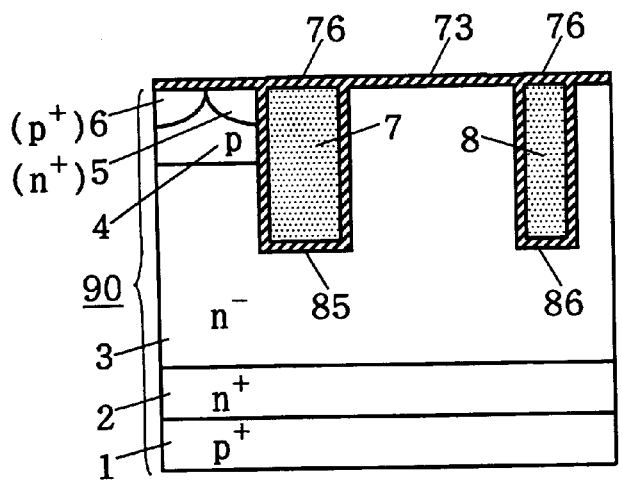

Thereafter, the polysilicon layer 74 is removed leaving portions buried in the gate trench 85 and the sense trench 86 so that a buried gate electrode 7 and a buried sense electrode 8 are formed as shown in FIG. 11. The polysilicon layer 74 is removed by polysilicon etching. Thereafter, oxidation process is performed so that exposed surfaces (i.e. tops) of the buried gate electrode 7 and the buried sense electrode 8 are covered with oxide films 76 as caps.

Subsequently, various kinds of electrodes are formed as shown in FIG. 1. More specifically, the oxide film 73 is selectively removed and an emitter electrode 11 is connected with exposed surfaces of the n⁺ emitter layer 5 and the p⁺ contact layer 6. Furthermore, after the oxide film 73 is removed, a gate electrode 13 and a sense electrode 14 are connected with the buried gate electrode 7 and the buried sense electrode 8, respectively. A collector electrode 12 is connected with the lower major surface of the semiconductor substrate 90, that is, an exposed surface of the p⁺ collector layer 1.

By performing the above-mentioned steps, the device 101 shown in FIG. 1 can be manufactured. According to the above-mentioned manufacturing method, the sense trench 86, the sense oxide film 10, the buried sense electrode 8 and the sense electrode 14 are formed simultaneously at the steps of forming the gate trench 85, the gate oxide film 9, the buried gate electrode 7 and the gate electrode 13, respectively. In other words, the device 101 can be manufactured without adding a new step as compared with the device 151 according to the prior art.

It is not necessary that the depth of the sense trench 86 is set identical with that of the gate trench 85. In order to set the depths different from each other, it is necessary to separately perform the same step as the step of forming the gate trench 85. Also in this case, however, the sense oxide film 10, the buried sense electrode 8 and the sense electrode 14 can be formed simultaneously at the steps of forming the gate oxide film 9, the buried gate electrode 7 and the gate electrode 13, respectively.

<2. Second Embodiment>

Figure 12:
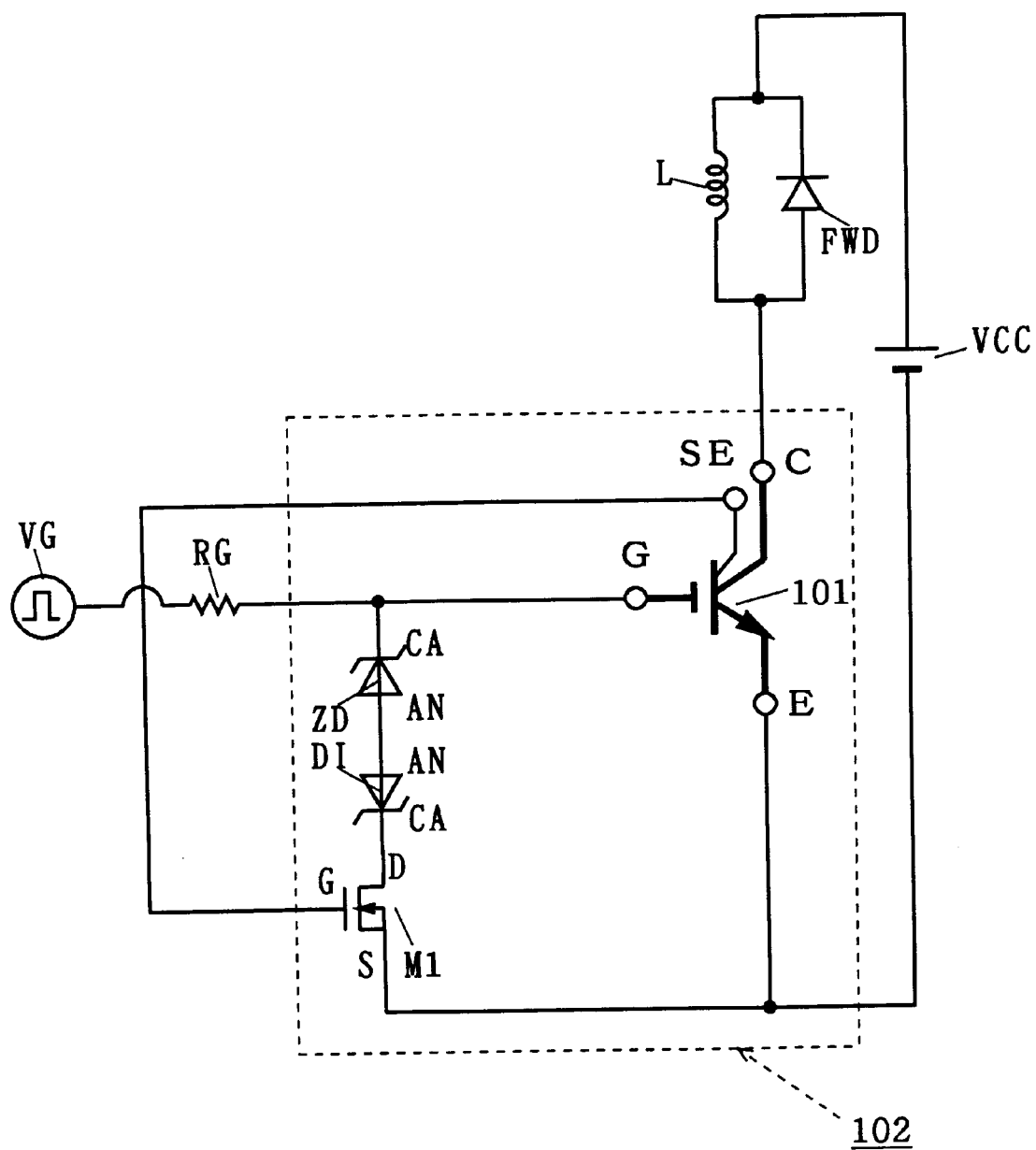
FIG. 12 is a circuit diagram showing a device according to a second embodiment.

FIG. 12 is a circuit diagram showing a structure of a device according to a second embodiment. A device 102 comprises, as a main element, the device 101 of the first embodiment and further comprises a protection circuit for protecting the main element at the time abnormality occurring. More specifically, the device 102 comprises a transistor M1 formed as a MOSFET, a diode (a rectifying element) DI and a Zener diode (a voltage regulating element) ZD in addition to the device 101. In the transistor M1, a source electrode S is connected with the emitter electrode E of the device 101, and a drain electrode D is connected with the gate electrode G of the device 101 through a series circuit formed by the Zener diode ZD and the diode DI which are connected in series. As described here, both of direct and indirect connections are expressed as "connection" in the present specification. A gate electrode G of the transistor M1 is connected with the sense electrode SE of the device 101.

The diode DI and the Zener diode ZD are connected with each other in forward and backward directions with respect to a current flowing from the gate electrode G of the device 101 toward the drain electrode D of the transistor M1, respectively. In FIG. 12, the designations "AN" and "CA" denote an anode electrode and a cathode electrode, respectively. The diode DI is provided to block conduction in the backward direction, and the Zener diode ZD is provided to hold a gate voltage of the device 101 to have a predetermined value when the transistor M1 is turned ON.

In order to prevent a negative bias having a certain magnitude or more from being applied as a gate voltage to the gate electrode G of the device 101, the diode DI is preferably formed as the Zener diode as shown in FIG. 12. Since the diode DI and the Zener diode ZD have different purposes, it is not necessary to make characteristics such as a breakdown voltage and the like coincident with each other.

The transistor M1, the diode DI and the Zener diode ZD function as a protecting circuit for dropping the gate voltage of the device 101 to reduce the collector current (main current) of the device 101 and prevent breakage of the device 101 when abnormalities are caused on the device 101. More specifically, as mentioned above, the device 102 is formed by adding, to the device 101, the protecting circuit for protecting the device 101 when abnormalities, e.g. short-circuit abnormalities, are caused.

FIG. 12 also shows the typical form of use of the device 102. More specifically, an output of a gate power supply $V_G$ is connected with the gate electrode Cr of the device 101 through a gate resistive element $R_G$. A main power supply $V_{CC}$ is connected, through a load L, with the emitter electrode E and the collector electrode C which form a pair of main electrodes of the device 101. The load L is an inductive load, for example. A free wheel diode FWD for causing a current to circulate in the load 1, when the device 101 is cut off is connected in parallel with the load L having an induction. In this form of use, a half bridge circuit using the device 102 is formed.

Operation of the device 102 will be described below. For example, if the load L is short-circuited (i.e. short-circuit abnormality takes place), a main current flowing in the device 101 is increased so that an electric potential of the n⁻ layer 3 (FIG. 3) is raised remarkably. Consequently, an electric potential of the sense electrode SE is raised. In this case, a gate voltage V (MOSFET·gate) of the transistor M1 is given by the Equation 1. As described in the first embodiment, if the gate threshold voltage of the transistor M1 is set to the gate voltage V (MOSFET·gate) obtained when the voltage V (B point) is coincident with the reference voltage Vr, the abnormalities of the device 101 can be detected by the transistor M1.

When the voltage V (B point) is raised beyond the reference voltage Vr so that the transistor M1 is turned ON, a gate current is bypassed to the transistor M1, the diode DI and the Zener diode ZD and the gate voltage of the device 101 is dropped to a predetermined electric potential determined by the transistor M1, the diode DI and the Zener diode ZD. Consequently, the main current flowing in the device 101 can be prevented from being increased excessively. As a result, a short-circuit tolerance is increased.

When the device 101 is in a normal state, the transistor M1 keeps OFF Therefore, the protecting circuit formed by the transistor M1, the Zener diode ZD and the diode DI does not affect the operation of the device 101. In other words, the device 102' protects the device 101 from the breakage caused by the generation of abnormalities without damaging performance of the device 101 in the normal state.

Figure 13:
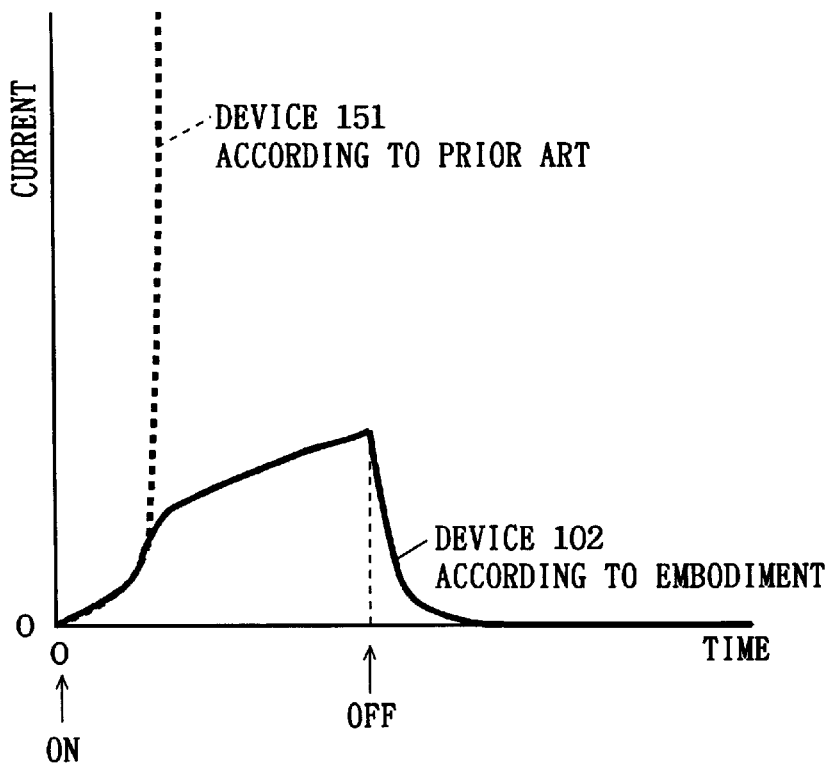
FIG. 13 is a graph for explaining operation of the device according to the second embodiment.

FIG. 13 is a graph showing a comparison of the operation of the device 102 performed when abnormalities are caused with that of the device 151 according to the prior art. When the device is short-circuited, a magnitude of the main current is raised without limit in the device 151 according to the prior art. As a result, the device 151 according to the prior art causes a thermal runaway and is broken. On the other hand, the main current is held within a certain limit value in the device 102. Then, when the device 101 is turned OFF by the gate power supply $V_G$, the main current is attenuated to zero in the same manner as in the normal state. In other words, the device 101 can safely be turned OFF with a margin before the device 101 is broken.

In the device 102 described above, the gate voltage V (MOSFET·gate) is determined by the Equation 1. Therefore, a sensitivity to detect abnormalities is determined by a combination of three variables, that is, a capacitance C (sense), a capacitance C (MOSFET) and a gate threshold voltage of the transistor M1. In other words, a high detection sensitivity can be obtained by freely selecting these three variables.

A gate voltage V (IGBT·gate) defining a magnitude of the main current of tine device 101 is determined as a sum of a forward voltage Vf (DI) of the diode DI, a breakdown voltage BV (ZD) of the Zener diode ZD and an ON-state voltage VCIN (MOSFET) of the transistor M1 as expressed by Equation 2. In the Equation 2, the form of ordinary use is set as a premise, that is, current capacitances of the transistor M1, the diode DI and the Zener diode ZD are sufficiently large and are supposed to be hardly influenced by a resistance value of the gate resistive element $R_G$.

$$V \text{ (IGBT·gate)}=Vf \text{ (DI)}+BV \text{ (ZD)}+VON \text{ (MOSFET)} \quad (2)$$

For example, if the breakdown voltage BV (ZD) is set lower, the gate voltage V (IGBT·gate) is reduced to a lower value when abnormalities are detected. As a result, a magnitude of the main current is limited to a smaller value. Thus, a limit value of the main current obtained when abnormalities are detected can be set widely by freely selecting the combination of three variables forming the right side of the Equation 2. In addition, the Zener diode ZD is excellent in a temperature characteristic of the breakdown voltage, that is, stability against a temperature. Therefore, the device 102 can stably realize the protecting function for the device 101.

The diode DI and the Zener diode ZD can be removed to obtain a desired gate voltage with only the ON-state voltage VON (MOSFET). The gate voltage V (IGBT·gate) can also be determined substantially with only the breakdown voltage BV (ZD) by setting the forward voltage Vf (DI) and the ON-state voltage VON (MOSFET) sufficiently low. In this case, it is sufficient that only the breakdown voltage BV (ZD) is regulated with high precision. Therefore, the device 102 can be designed more easily.

Furthermore, the IGBT acting as a main element and the protecting circuit for protecting the IGBT are incorporated in the device 102. Therefore, when forming a half bridge circuit as a component of an inverter, for example, it is possible to save a user a lot of time and trouble to prepare the protecting circuit separately from the IGBT and to connect them. In other words, the device 102 has a high usefulness for the user.

<3. Third Embodiment>

Figure 14:
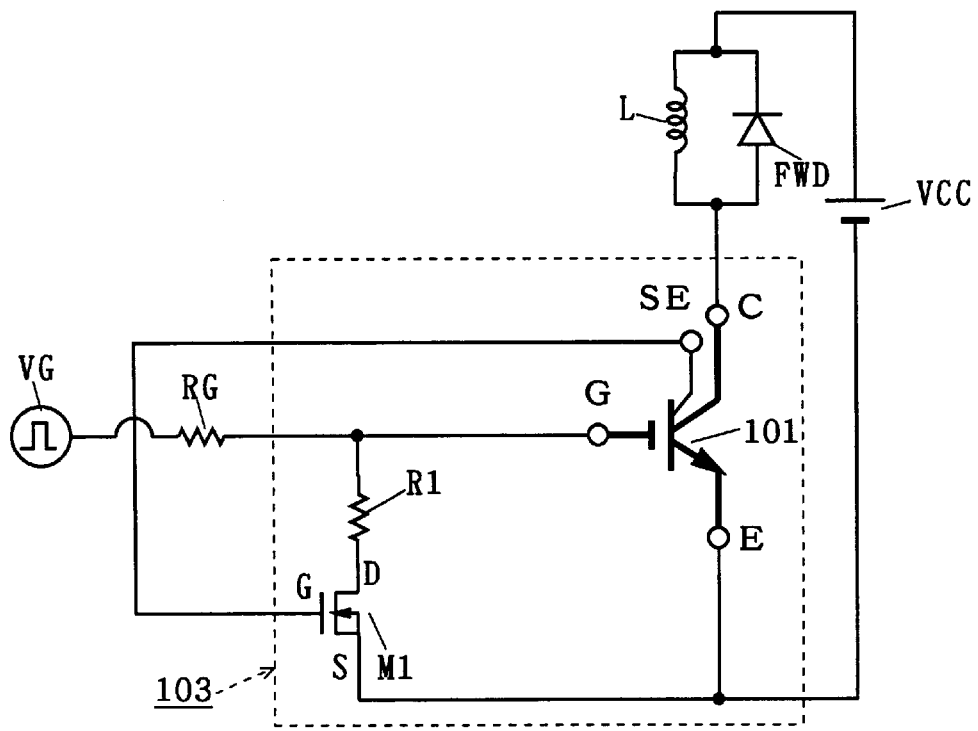
FIG. 14 is a circuit diagram showing a device according to a third embodiment.

FIG. 14 is a circuit diagram showing a structure of a device according to a third embodiment and the typical form of use of the device acting as a half bridge circuit. A device 103 is formed by adding a protecting circuit to the device 101 acting as a main element in the same manner as the device 102. The device 103 is characteristically different from the device 102 in that the protecting circuit includes a transistor M1 and a resistive element $R_1$.

More specifically, while the transistor M1 has a source electrode S connected with the emitter electrode E of the device 101 and a gate electrode G connected with the sense electrode SE of the device 101, the resistive element $R_1$ is provided between a drain electrode D of the transistor M1 and the gate electrode G of the device 101. In other words, the drain electrode D of the transistor M1 is connected with the gate electrode G of the device 101 through the resistive element $R_1$ having a simple structure.

In the same manner as in the device 102, the transistor M1 is turned ON or OFF in response to the normal or abnormal state of the device 101. However, a gate voltage V (IGBT·gate) defining a magnitude of a main current of the device 101 obtained when abnormalities are detected is given by Equation 3 in place of the Equation 2. More specifically, the gate voltage V (IGBT gate) is determined as a voltage obtained by dividing an ON-state voltage VON (MOSFEI) and a voltage VG of a gate power supply $V_G$ by a resistance value RG of a gate resistive element $R_G$ and a resistance value R1 of the resistive element $R_1$.

$$V \text{ (IGBT·gate)}=\{VG\times R1+VON \text{ (MOSFET)}\times RG\}/\{R1+RG\} \quad (3)$$

For example, when the resistance value R1 of the resistive element $R_1$ is set lower, the gate voltage V (IGBT·gate) obtained when abnormalities are detected is reduced to a smaller value. As a result, the magnitude of the main current is limited to a smaller value. Thus, a limit value of the main current obtained when the abnormalities are caused can be set widely for the voltage VG having a given predetermined magnitude by freely selecting a combination of three variables included in the right side of the Equation 3, that is, the resistance values RG and R1 and the ON-state voltage VON (MOSFET).

Usually, an ON-state resistance of the transistor M1 is much lower than the resistance values RG and R1. Therefore, the limit value of the main current can easily be set to a predetermined magnitude by substantially selecting only the resistance values, RG and R1. When the resistive element $R_1$ is to be formed, a step of implanting an impurity is not necessary and the resistance value can be set with a mask pattern. In this respect, the device 103 has advantages of a manufacturing method.

<4. Fourth Embodiment>

Figure 15:
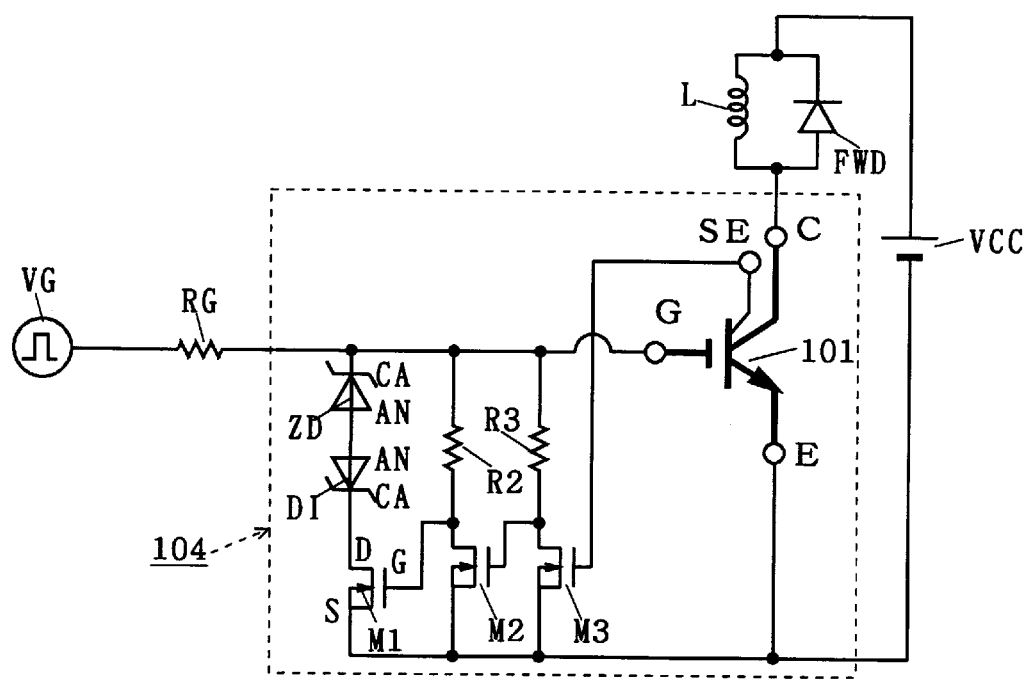
FIG. 15 is a circuit diagram showing a device according a fourth embodiment.

FIG. 15 is a circuit diagram showing a structure of a device according to a fourth embodiment and the typical form of use of the device acting as a half bridge circuit. A device 104 is formed by adding a protecting circuit to the device 101 acting as a main element in the same manner as the device 102. The protecting circuit of the device 104 includes circuits which are cascade-connected in three stages.

In a first stage circuit, a transistor M3 formed as a MOSFET and a resistive element $R_3$ are connected in series. In a second stage circuit, a transistor M2 formed as a MOSFET and a resistive element $R_2$ are connected in series in the same manner as in the first stage circuit. On the other hand, a third stage circuit is formed equivalently to the protecting circuit provided in the device 102 according to the second embodiment.

The transistors M1 to M3 have source electrodes connected with the emitter electrode E of the device 101. The transistors M1 to M3 have drain electrodes E1 connected with the gate electrode G of the device 101 through a series circuit formed by a diode DI and a Zener diode ZD, the resistive element $R_2$ and the resistive element $R_3$, respectively. A gate electrode of the transistor M1 is connected with the drain electrode of the transistor M2, a gate electrode of the transistor M2 is connected with the drain electrode of the transistor M3, and a gate electrode of the transistor M3 is connected with the sense electrode SE of the device 101.

More specifically, the protecting circuit of the device 104 is characteristically different from the protecting circuit of the device 102 in that the transistor M3 for receiving a voltage signal of the sense electrode SE of the device 101 is isolated from the transistor M1 for pulling down an electric potential of the gate electrode G of the device 101. The transistor M2 in the second stage serves to invert a polarity of an output signal appearing on the drain electrode of the transistor M3 in the first stage and to perform transmission to the gate electrode of the transistor M1 in the third stage.

Since the device 104 has the above-mentioned structure, it operates in the following manner. Abnormalities such as short-circuit abnormalities are caused so that an electric potential of an n⁻ layer 3 is raised. Consequently, an electric potential of the sense electrode SE is raised beyond a gate threshold voltage of the transistor M3 so that the transistor M3 is turned ON. As a result, the main current flows into the transistor M3 so that a voltage drop is generated on the resistive element $R_3$. Thus, an electric potential of the gate electrode of the transistor M2 is dropped down. Consequently, the transistor M2 is turned OFF.

When the transistor M2 is turned OFF, the current stops flowing into the resistive element $R_2$. For this reason, an electric potential of the drain electrode D of the transistor M2 is raised up. As a result, an electric potential of the gate electrode of the transistor M1 is raised up beyond a gate threshold voltage of the transistor M1 so that the transistor M1 is turned ON. Consequently, the gate voltage V (IGBT·gate) of the device 101 is reduced to the value given by the Equation 2. Therefore, the magnitude oil the main current of the device 101 is limited to a value corresponding to the gate voltage V (IGBT·gate). Consequently, a tolerance to abnormalities such as a short-circuit tolerance can be enhanced so that the device 101 can be prevented from being broken when abnormalities are caused.

A gate voltage V (MOSFET·gate) of the transistor M3 is given by the Equation 1. By setting the gate threshold voltage of the transistor M3 to the gate voltage V (MOSFET·gate) obtained when the voltage V (B point) of the device 101 is coincident with a reference voltage Vr, the device 101 can properly be protected from abnormalities in the same manner as the device 102.

The gate voltage V (MOSFET·gate) of the transistor M3 is determined by the Equation 1. Therefore, a sensitivity to detect abnormalities is determined by a combination of three variables, that is, a capacitance C (sense) of the device 101, a capacitance C (MOSFET) of the transistor M3, and the gate threshold voltage of the transistor M3. In other words, a great detection sensitivity can be obtained by freely selecting these three variables.

Thus, the detection sensitivity and the limit value of the main current obtained when abnormalities are caused are individually defined by the two transistors M3 and M1. Consequently, a size of the transistor M3 can freely be set in consideration of only the detection sensitivity, and the transistor M1 can be set to have a size necessary for pulling down an electric potential of the gate electrode G of the device 101 irrespective of the detection sensitivity.

In general, if an element area (a chip area) of the device 101 is larger, the magnitude of the main current flowing in the device 101 is increased. Consequently, a short-circuit current flowing across the gate electrode G and the emitter electrode E which is necessary for pulling down the electric potential of the gate electrode G to limit the main current when abnormalities are caused, that is, a current flowing in the protecting circuit is increased in magnitude. In order to obtain the short-circuit current having a, large magnitude, an element area of the transistor M1 of the protecting circuit cannot but be increased.

In the device 104, such requirements for a size of the element and for an abnormality detection sensitivity can be met individually and independently by the different elements M1 and M3. In other words, flexibility of a design can be enhanced and the device 104 can be designed more easily.

While the transistor M2 in the second stage has been used for inversion of the output voltage in the device 104, other forms which do not have the transistor M2 call also be used. For example, if a polarity of the transistor M1 is changed from an n-channel type to a p-channel type according to the present embodiment and the drain of the transistor M3 is connected with the gate electrode of the transistor M1, the same effects as in the device 104 can be obtained. It is important that a transistor for performing detection should be provided separately from a transistor for making the gate electrode 03 and the emitter electrode E of the device 101 conducted to pull down the electric potential of the gate electrode G.

<5. Fifth Embodiment>

Figure 16:
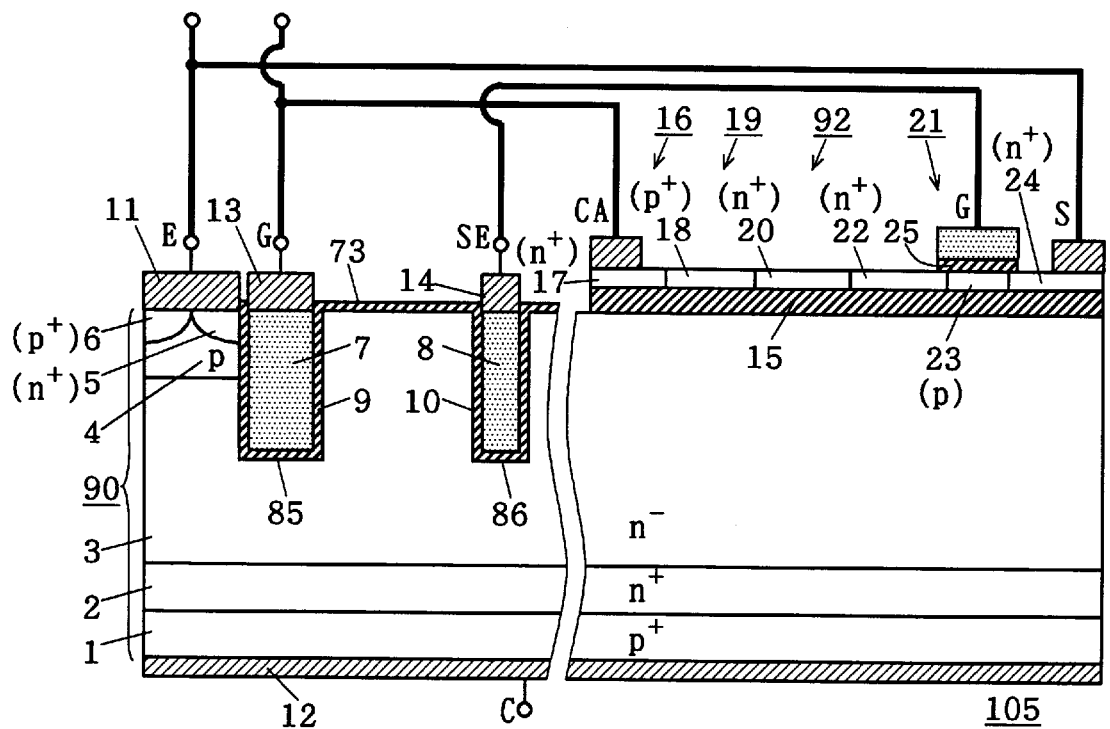
FIG. 16 is a sectional front view showing a device according to a fifth embodiment.

FIG. 16 is a sectional front view showing a semiconductor device according to a fifth embodiment. In a device 105, an IGBT acting as a main element and a protecting circuit for protecting the IGBT are formed in/on the same semiconductor substrate, and are incorporated in a so-called single chip. As shown in FIG. 16, the IGBT is formed identically to the device 101, and the protecting circuit is formed as a thin film semiconductor circuit on an upper major surface of a semiconductor substrate 90 by using a TFT (thin film transistor) technique.

More specifically, a field oxide film (an insulating layer) 15 is selectively formed on a portion of the upper major surface of the semiconductor substrate 90 which corresponds to an exposed surface of an n⁻ layer 3. A thin film semiconductor 92 is formed on the field oxide film 15. In each portion of the thin film semiconductor 92, n-type and p-type impurities are selectively implanted. As. a result, an n⁻ cathode region 17, a p⁺ anode region 18, an n⁺ cathode region 20, an n⁺ drain region 22, a p well region 23 and an n⁺ source region 24 are sequentially formed from one end to the other end on the thin film semiconductor 92.

Consequently, a protecting circuit equivalent to the protecting circuit of the device 102 (FIG. 12) can be obtained on the field oxide film 15. More specifically, the n⁺ cathode region 17 and the p⁺ anode region 18 act as components of a Zener diode 16, and the p⁺ anode region 18 and the n⁺ cathode region 20 act as components of a diode 19. Furthermore, the n⁺ drain region 22, the p well region 23 and the n⁺ source region 24 act as components of a MOSFET 21.

The Zener diode 16, the diode 19 and the MOSFET 21 are connected in this order in series. While the p⁺ anode region 18 is shared by the Zener diode 16 and the diode 19 in an example of FIG. 16, they can be formed separately and can be connected with each other through an aluminum wiring, for example. In the example of FIG. 16, manufacture can easily be performed and a manufacturing cost can be reduced.

A cathode electrode CA is connected onto the n⁺ cathode region 17, and a source electrode S is connected onto the n⁺ source region 24. A gate electrode G is formed on the p well region 23 with a gate oxide film 25 interposed therebetween. The cathode electrode CA is connected with a gate electrode 13 of the IGBT through a wiring, and the gate electrode G is connected with a sense electrode 14 of the IGBT through a wiring. The source electrode S is connected with an emitter electrode 11 of the IGBI through a wiring.

Accordingly, the Zener diode 16, the diode 19 and the MOSFET 21 correspond to the Zener diode ZD, the diode DI and the transistor M1 of the device 102, respectively. As a result, the protecting circuit of the device 105 operates in the same manner as theprotecting circuit of the device 102. The IGBT acting as the main element and the protecting circuit are provided in the same device. Therefore, a high usefulness can be obtained as in the device 102.

In addition, since the IGBT acting as the main element and the protecting circuit are incorporated in the single chip, a capacitance and a resistance generated parasitically on the wiring between the main element and the protecting circuit and on a connecting portion of each element in the protecting circuit can be reduced. As a result, performance of the protecting function can be enhanced. Furthermore, since the main element and the protecting circuit are incorporated in the single chip, a size of the device can be reduced. In addition, a manufacturing processes are shared so that the manufacturing cost can be reduced as will be described later.

The protecting circuit is electrically insulated from the semiconductor substrate 90 by the field oxide film 15 formed much more thickly than a gate oxide film 9 and a sense oxide film 10. For this reason, there is no possibility that a main current flowing in the main element might flow into the protecting circuit to cause a malfunction even if the main element and the protecting circuit are incorporated in the single chip. In other words, the device 105 can realize a usefulness, a reduction in a size, a low cost and excellent protecting performance while keeping high reliability for the protecting function.

Figure 17:
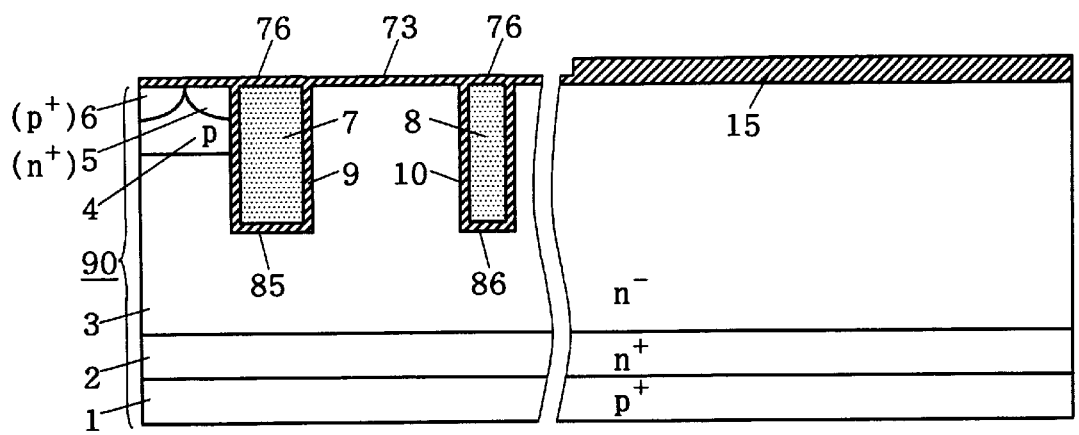
FIGS. 17 to 20 are views showing processes for manufacturing the device according to the fifth embodiment.

FIGS. 17 to 20 are views showing a preferred method for manufacturing the device 105. First of all, the steps shown in FIGS. 6 to 11 according to the first embodiment are performed in order to manufacture the device 105. Then, a field oxide film 15 is selectively formed on a portion in an upper major surface of a semiconductor substrate 90 to which an n⁻ layer 3 is exposed as shown in FIG. 17. Alternatively, the field oxide film 15 may be formed at any of the steps shown in FIGS. 6 to 11, for example, before a gate trench 85 and a sense trench 86 are formed.

The field oxide film 15 is formed by using a well-known LOCOS method (Local Oxidation of Silicon). More specifically, a nitride film is selectively formed on regions in the upper major surface of the semiconductor substrate 90 which exclude a region where the field oxide film 15 is to be formed. Then, an oxide film is selectively formed on the upper major surface of the semiconductor substrate 90 by using the nitride film as a shield, and thereby the field oxide film 15 is formed. The field oxide film 15 is formed much more thickly than an oxide film 73.

Figure 18:
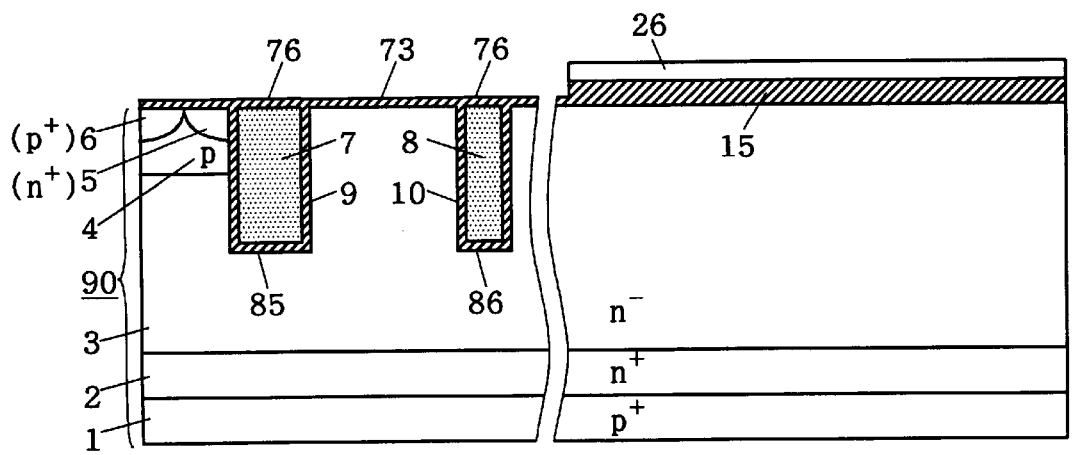

After the step shown in FIG. 17 is completed, a thin film semiconductor 26 is formed on the field oxide film 15 as shown in FIG. 18. In order to form the thin film semiconductor 26, first of all, (non-doped) polysilicon which is not doped with impurities is provided like a thin film on whole exposed surfaces over the semiconductor substrate 90, for example, the oxide film 73, and an oxide film 76 which are covering a buried gate electrode 7 and a buried sense electrode 8, as well as the field oxide film 15. Then, the provided polysilicon is patterned through selective etching. Consequently, the thin film semiconductor 26 is selectively formed only on the field oxide film 15.

Figure 19:
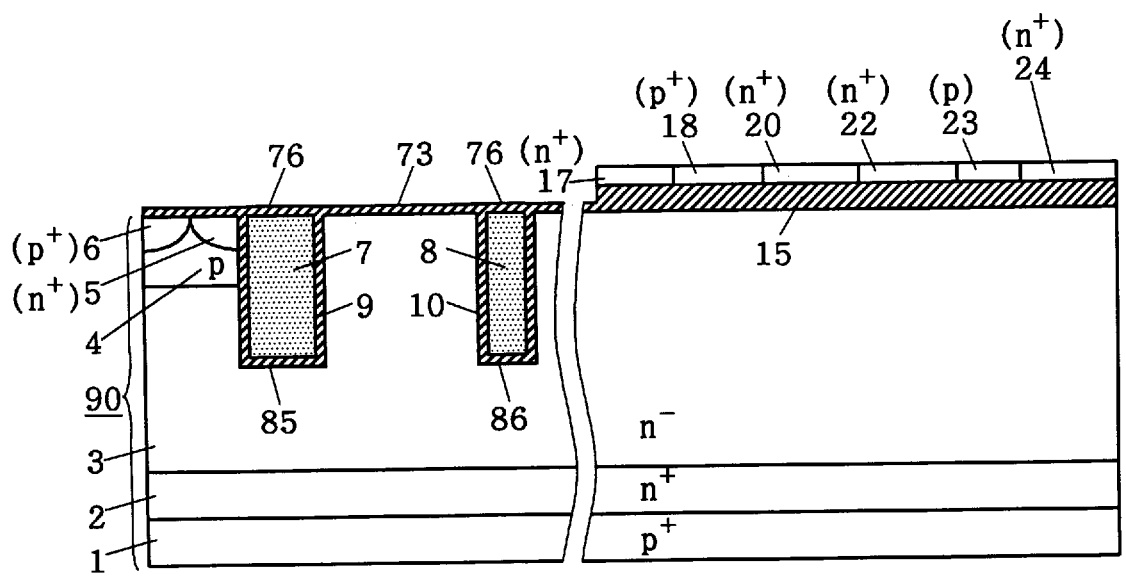

Next, a p-type impurity and an n-type impurity are selectively implanted into the thin film semiconductor 26 so that a series of semiconductor regions from an n⁺ cathode region 17 to an n⁺ source region 24 is formed as shown in FIG. 19. Each semiconductor region is formed by selectively implanting the p-type or n-type impurity by using a shield patterned by a well-known patterning technique, and by then diffusing the implanted impurity.

Figure 20:
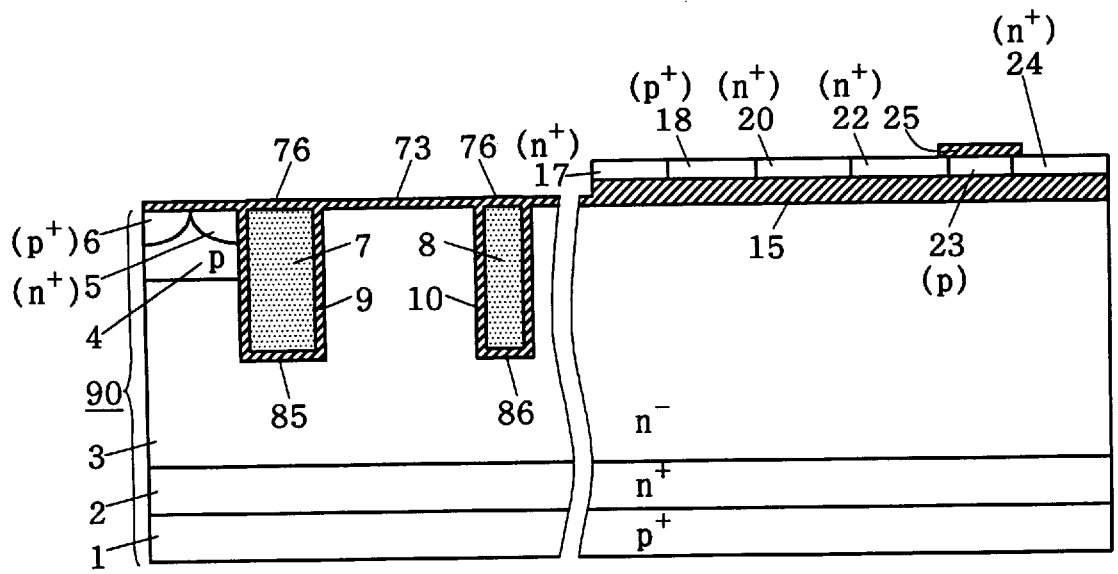

Subsequently, a gate oxide film 25 is formed on a p well region 23 to cover the p well region 23 as shown in FIG. 20. The gate oxide film 25 is formed in the following manner. An oxide film is formed on whole exposed surfaces over the semiconductor substrate 90 which include a top face of the thin film semiconductor 26 by using a CVD technique, for example. Then, etching is selectively executed by using a shield patterned by the well-known patterning technique. Thus, the gate oxide film 25 is formed.

Thereafter, a gate electrode G is selectively formed on the gate oxide film 25 as shown in FIG. 16. The gate electrode G is formed in the following manner. For example, polysilicon doped with an impurity having a high concentration is provided is provided on the whole surface over the semiconductor substrate 90. Alternatively, non-doped polysilicon is provided on the whole surface over the semiconductor substrate 90 and then an impurity is selectively implanted. Thereafter, the polysilicon is subjected to selective etching. Thus, the gate electrode G is formed.

Subsequently, a cathode electrode CA and a source electrode S of the protecting circuit are formed simultaneously at steps of forming an emitter electrode 11, a gate electrode 13 and a sense electrode 14 of the IGBT. In this process, the emitter electrode 11 and the source electrode S, the gate electrode 13 and the cathode electrode CA, and the sense electrode 14 and the gate electrode G are connected with each other through patterned wirings, respectively. Then, a collector electrode 12 is formed on an exposed surface of a p⁺ collector layer 1. Thus, the device 105 is finished.

As described above, the device 105 can be manufactured without requiring especially complicated steps by a combination of the same wafer process as the technique for manufacturing the device 151 according to the prior art and a well-known conventional technique for manufacturing a thin film transistor. A part of the manufacturing steps, for example, the steps of forming the electrodes can be shared Consequently, the manufacturing cost can also be reduced.

In the device 105, the thin film semiconductor 92 is formed on the field oxide film 15 in the form of a plane. Therefore, the polysilicon has excellent crystalline properties. Consequently, characteristics of the MOSFET 21 such as a mobility of carriers and the like can be enhanced.

<6. Sixth Embodiment>

Figure 21:
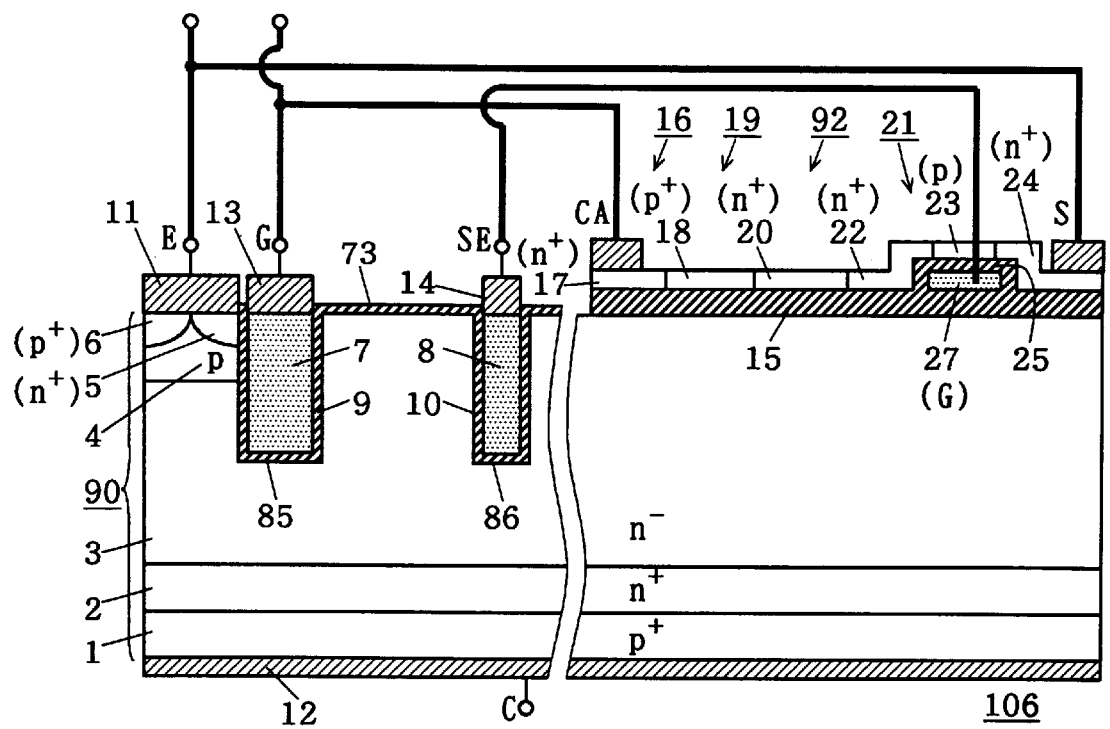
FIG. 21 is a sectional front view showing a device according to a sixth embodiment.

FIG. 21 is a sectional front view showing a semiconductor device according to a sixth embodiment. Also in a device 106, a protecting circuit for protecting an IGBT acting as a main element is formed as a thin film semiconductor circuit on an upper major surface of a semiconductor substrate 90 in the same manner as in the device 105. The device 106 is characteristically different from the device 105 in that a gate electrode G opposed to a p well region 23 is buried as a gate electrode 27 in an oxide film provided under the p well region 23.

More specifically, the gate electrode 27 is interposed between a field oxide film 15 and a thin film semiconductor 92. Furthermore, a gate oxide film 25 is provided between the gate electrode 27 and the thin film semiconductor 92. Consequently, the gate electrode 27 is electrically insulated from the semiconductor substrate 90 by the field oxide film 15, and is opposed to the p well region 23 with the gate oxide film 25 interposed therebetween. The gate electrode 27 is connected with a sense electrode 14 of the IGBT through a wiring in the same manner as the gate electrode G of the device 105.

Accordingly, the protecting circuit of the device 106 operates in the same manner as the protecting circuit of the device 105. Similarly to the device 105, furthermore, a capacitance and a resistance generated parasitically can be reduced, and Et decrease in a size, a reduction in a manufacturing cost and excellent protecting performance can be obtained. In particular, the gate electrode 27, together with a buried gate electrode 7 of the main element and the like, can be formed simultaneously at the same steps as will be described below. Therefore, a manufacturing process can further be simplified and the manufacturing cost can be reduced more.

Figure 22:
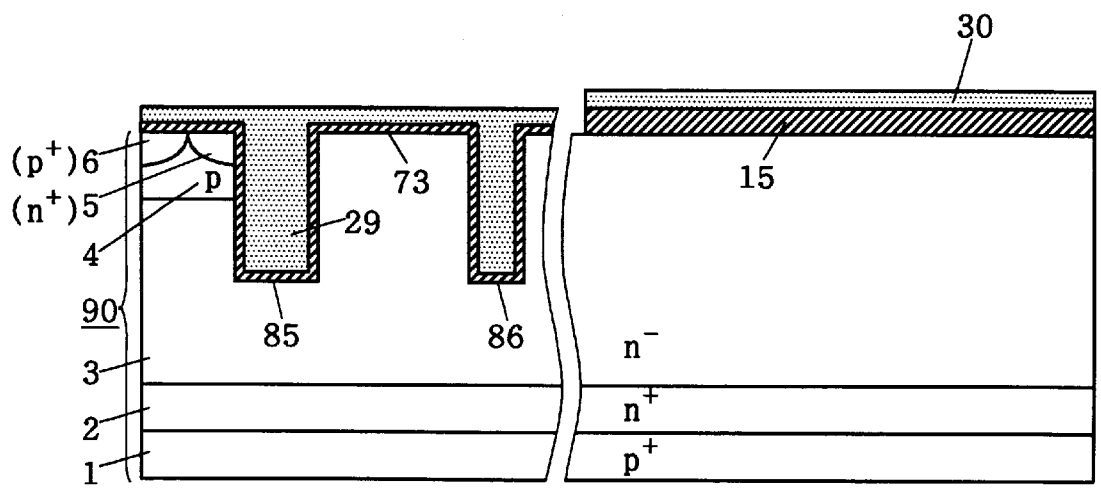
FIGS. 22 to 26 are views showing processes for manufacturing the device according to the sixth embodiment.

FIGS. 22 to 26 are views showing a preferred method for manufacturing the device 106. In order to manufacture the device 106, the steps shown in FIGS. 6 to 9 according to the first embodiment are first performed, and a step shown in FIG. 22 is then performed. First of all, a field oxide film 15 is selectively formed on a portion of an upper major surface of a semiconductor substrate 90 to which an n⁻ layer 3 is exposed at the step shown in FIG. 22. Alternatively, the field oxide film 15 may be formed at any of the steps shown in FIGS. 6 to 9, for example, before a gate trench 85 and a sense trench 86 are formed. In the same manner as in the device 105, the field oxide film 15 is formed by a LOCOS method.

Then, polysilicon layers 29 and 30 doped with an impurity having a high concentration are provided on oxide films 76 which are covering the buried gate electrode 7 and the buried sense electrode 8 as caps, an oxide film 73 and the field oxide film 15, that is, on whole exposed surfaces over the semiconductor substrate 90. The polysilicon layers 29 and 30 are provided by using a CVD method, for example.

The polysilicon layer 30 corresponds to a portion to be provided on the field oxide film 15, and the polysilicon layer 29 corresponds to the other portion, that is, a portion to be provided on the oxide film 73. In an example of FIG. 22, the two polysilicon layers 29 and 30 are formed at the same time. Consequently, the manufacturing process can be simplified and the manufacturing cost can be reduced. However, the polysilicon layers 29 and 30 can be formed individually at separate steps.

Figure 23:
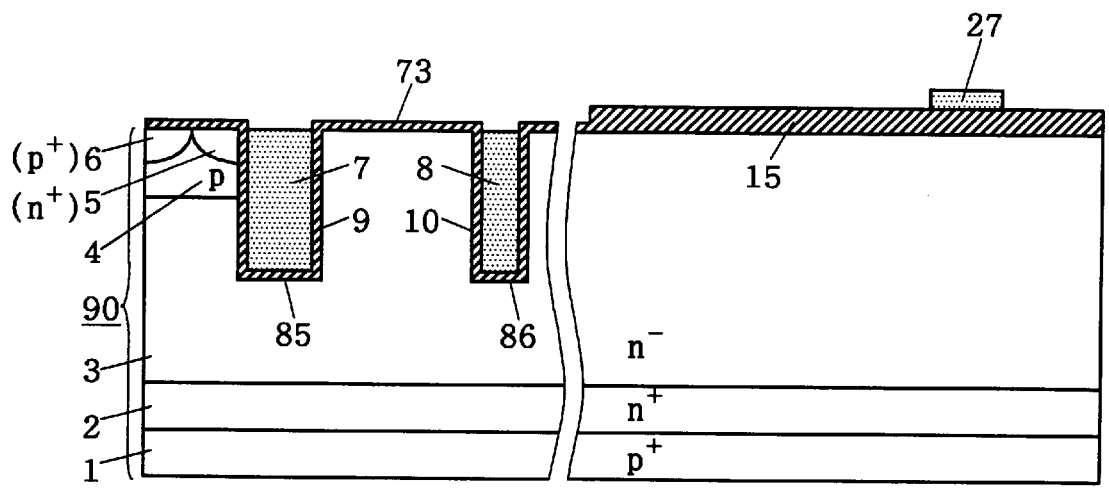

Next, a buried gate electrode 7 and a buried sense electrode 8 are formed from the polysilicon layer 29, and a gate electrode 27 is formed from the polysilicon layer 30 as shown in FIG. 23. In order to form these electrodes, the polysilicon layers 29 and 30 are subjected to selective etching by using a patterned shield.

Figure 24:
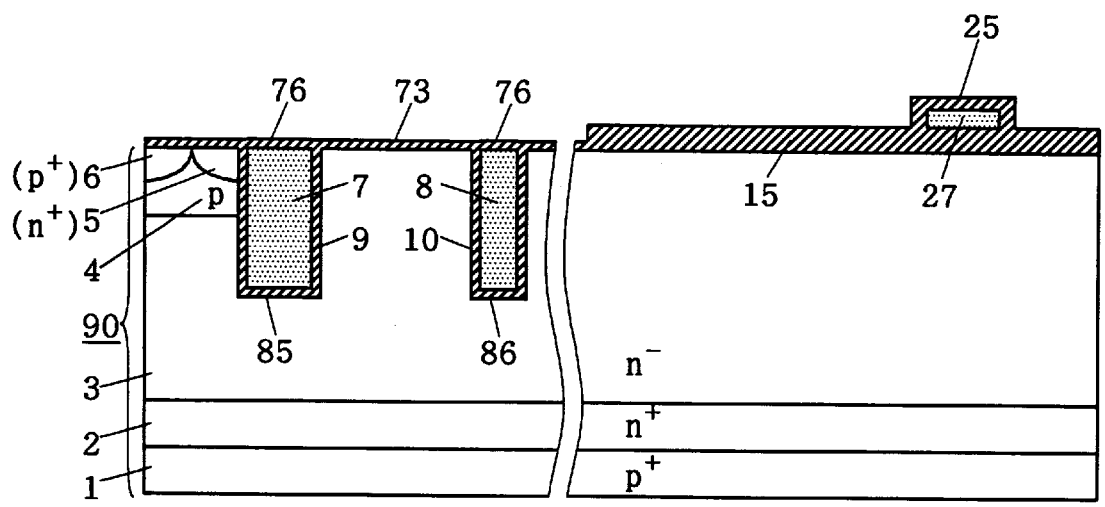

Then, a gate oxide film 25 and oxide films 76 are formed as shown in FIG. 24. An oxide film is formed, by using a CVD technique or the like, on the whole surfaces exposed over the semiconductor substrate 90 which include the gate electrode 27. Thereafter, the oxide film is subjected to selective etching by using a patterned shield. Thus, the gate oxide film 25 and the oxide films 76 are formed. As a result of the selective etching, the gate oxide film 25 and the oxide films 76 are formed to entirely cover the whole surfaces exposed over the semiconductor substrate 90 including a surface (i.e. top and side faces) of the gate electrode 27.

Figure 25:
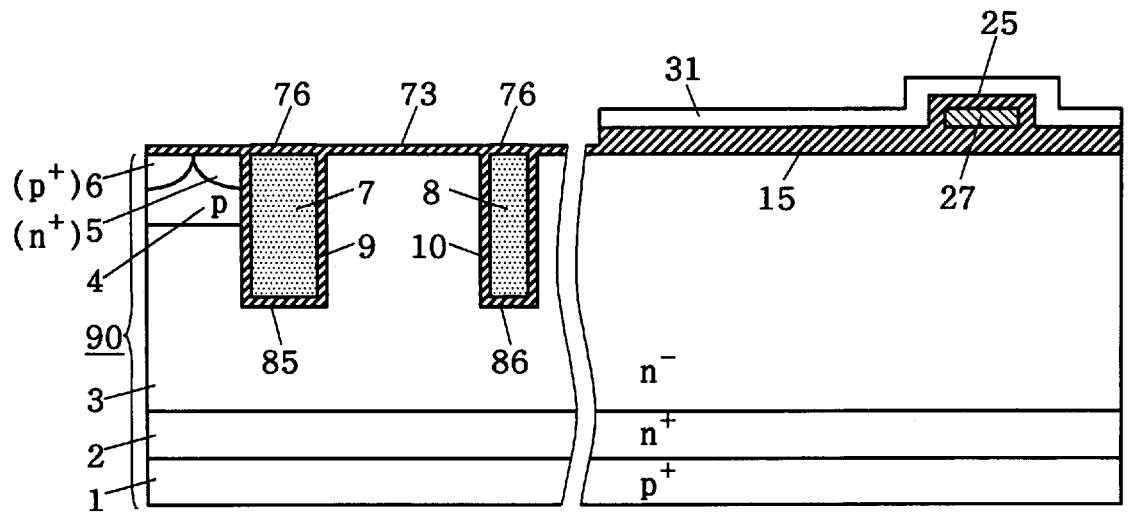

Subsequently, a thin film semiconductor 31 is formed on the gate oxide film 25 and an exposed surface of the field oxide film 15 as shown in FIG. 25. Non-doped polysilicon is provided on the whole exposed surfaces over the semiconductor substrate 90. Then, the provided polysilicon is subjected to selective etching by using the patterned shielding member. Thus, the thin film semiconductor 31 is formed.

Figure 26:
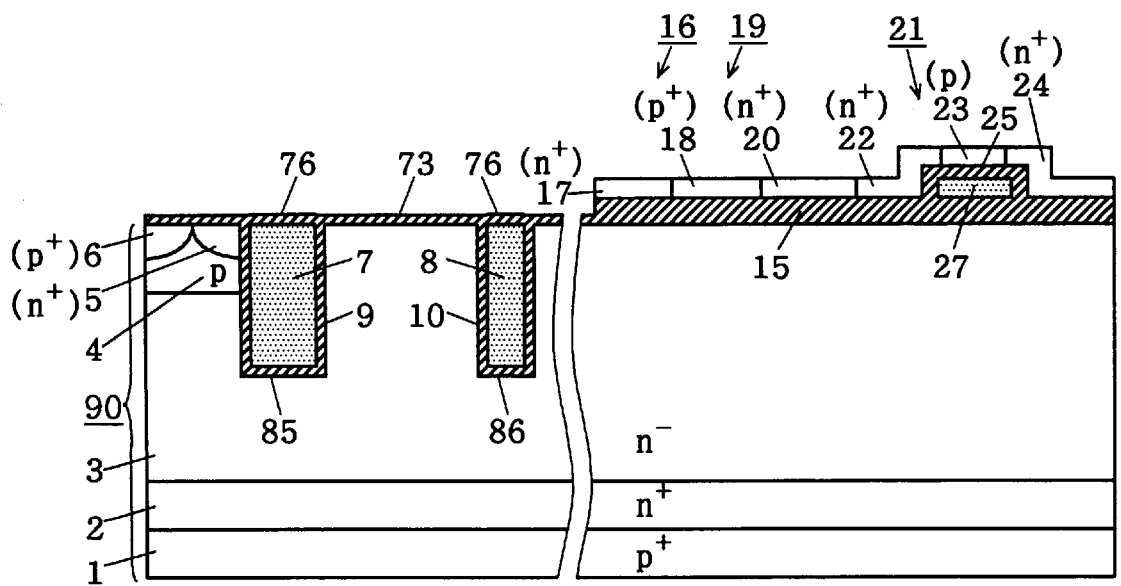

Next, a p-type impurity and an n-type impurity are selectively implanted into the thin film semiconductor 31 so that a series of semiconductor regions from an n⁺ cathode region 17 to an n⁺ source region 24 is formed as shown in FIG. 26. Each semiconductor region is formed through the same step as in FIG. 19. In this case, a p well region 23 is formed in a portion opposed to the top face of the gate electrode 27.

Subsequently, a cathode electrode CA and a source electrode S of the protecting circuit are formed simultaneously at steps of forming an emitter electrode 11, a gate electrode 13 and a sense electrode 14 of the IGBT as shown in FIG. 21. In this process, the emitter electrode 11 and the source electrode S, the gate electrode 13 and the cathode electrode CA, and the sense electrode 14 and the gate electrode G are connected with each other through patterned wirings, respectively. Then, a collector electrode 12 is formed on an exposed surface of the p⁺ collector layer 1. Thus, the device 106 is finished.

As described above, the device 106 can be manufactured without requiring especially complicated steps by a combination of a well-known conventional wafer process and a well-known conventional technique for manufacturing a thin film transistor in the same manner as the device 105. In addition, a part of the manufacturing steps can, be shared between the main element and the protecting circuit. Consequently, the manufacturing cost can also be reduced. In particular, the gate electrode 27 can be formed together with the buried gate electrode 7 and the buried sense electrode 8 at the same step. Therefore, the manufacturing process can be simplified more than in the device 105.

Figure 27:
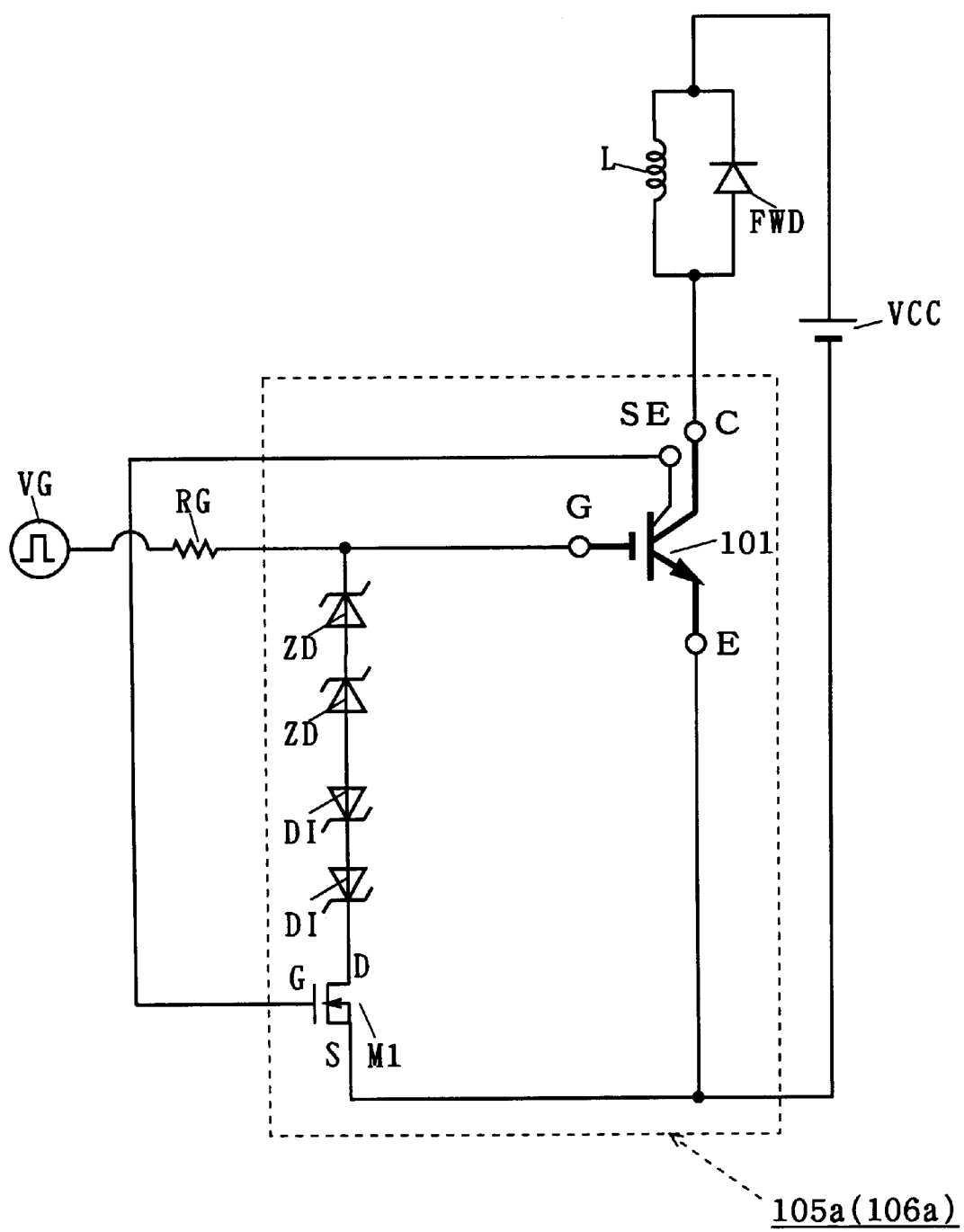
FIG. 27 is a circuit diagram showing a variant of the device according to the sixth embodiment.

FIG. 27 is a circuit diagram showing a variant of the fifth and sixth embodiments. As illustrated in a device 105a (106a) of FIG. 27, a protecting circuit may include a plurality of Zener diodes ZD connected in series or a plurality of diodes DI connected in series.

By connecting the Zener diodes ZD in series, it is possible to set a breakdown voltage of the single Zener diode ZD to the condition of the smallest temperature dependency and to set, as a whole, a gate voltage of the device 101 to a high value when abnormalities are detected. Furthermore, the diodes DI are connected in series so that a breakdown voltage against a backward voltage can be raised. Thus, the device 101 can easily be adapted to a rise in the breakdown voltage The device 105a (106a) can be constructed by additionally incorporating a semiconductor region forming another Zener diode 16 or another diode 19 in the thin film semiconductor 92 in the devices 105 and 106 shown in FIGS. 16 and 21, respectively.

Accordingly, the device 105a (106a) can easily be manufactured by merely varying a pattern of a shield without adding a new step to the methods for manufacturing the devices 105 and 106.

<7. Seventh Embodiment>

Figure 28:
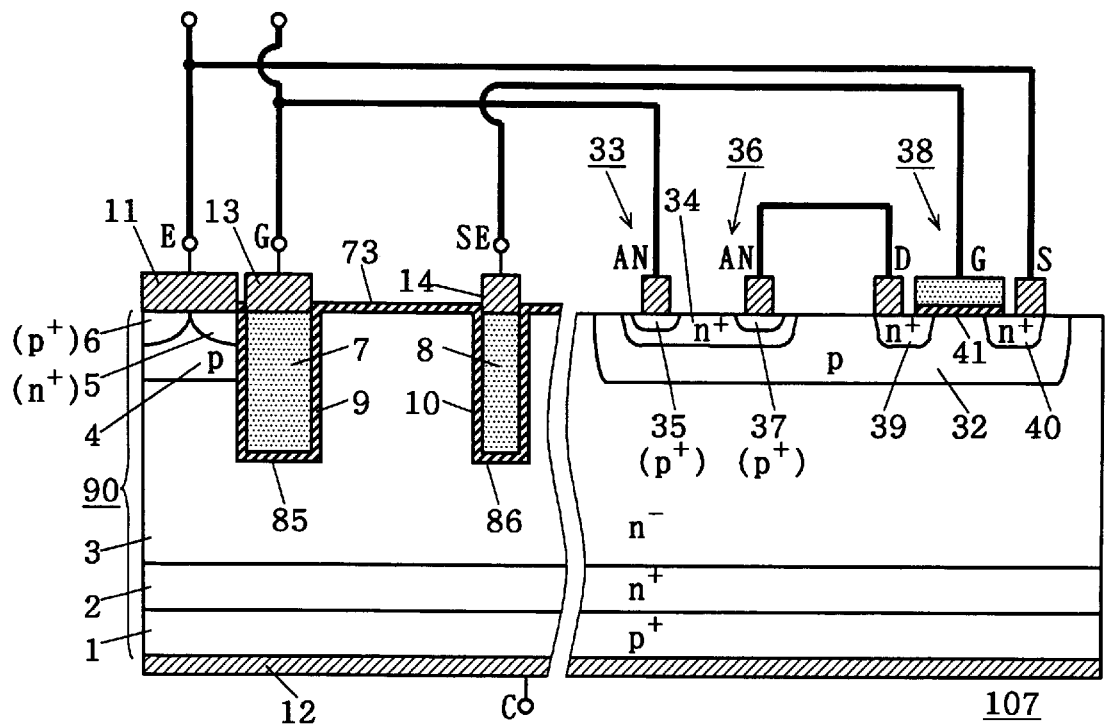
FIG. 28 is a sectional front view showing a device according to a seventh embodiment.

FIG. 28 is a sectional front view showing a semiconductor device according to a seventh embodiment. In a device 107, an IGBT acting as a main element and a protecting circuit for protecting the IGBT are incorporated in a single chip in the same manner as in the devices 105 and 106. The device 107 is characteristically different from the devices 105 and 106 in that a semiconductor region acting as a component of the protecting circuit is not formed above a semiconductor substrate 90 separately from the semiconductor substrate 90 but is formed as a part of the semiconductor substrate 90 therein. A p well region 32 is selectively formed in a portion of an upper major surface of the semiconductor substrate 90 which corresponds to an exposed surface of an $n^-$ layer 3. The p well region 32 is a semiconductor region which functions as a junction isolation region, and is formed more shallowly than the $n^-$ layer 3. An $n^+$ cathode region 34, an $n^+$ drain region 39 and an $n^+$ source region 40 are selectively formed apart from each other more shallowly than the p well region 32 within an exposed surface of the p well region 32 included in the upper major surface of the semiconductor substrate 90.

Furthermore, a $p^+$ anode region 35 and a $p^+$ anode region 37 are selectively formed apart from each other more shallowly than the $n^+$ cathode region 34 within an exposed surface of the $n^+$ cathode region 34. A gate oxide film 41 is formed on a portion interposed between the $n^+$ drain region 39 and the $n^+$ source region 40 in the exposed surface of the p well region 32.

Two anode electrodes AN are individually connected with exposed surfaces of the $p^+$ anode regions 35 and 37. A drain electrode D is connected with an exposed surface of the $n^+$ drain region 39, and a source electrode S is connected with an exposed surface of the $n^+$ source region 40. Furthermore, a gate electrode G is formed on the gate oxide film 41. The gate electrode G is opposed to a region provided thereunder, that is, a portion of the exposed surface of the p well region 32 which is provided between the $n^+$ drain region 39 and the $n^+$ source region 40 with the gate oxide film 41 interposed therebetween.

Consequently, a protecting circuit equivalent to the protecting circuit of the device 102 (FIG. 12) is formed in the p well region 32 apart from the $n^-$ layer 3. More specifically, the $p^+$ anode region 35 and the $n^+$ cathode region 34 act as components of a diode 33, and the $n^+$ cathode region 34 and the $p^+$ anode region 37 act as components of a Zener diode 36. Furthermore, the $n^+$ drain region 39, the p well region 32 and the $n^+$ source region 40 act as components of a MOSFET 38.

The diode 33, the Zener diode 36 and the MOSFET 38 are connected in this order in series. While the $n^+$ cathode region 34 is shared by the diode 33 and the Zener diode 36 in an example of FIG. 28, they can be formed separately and can be connected with each other through an aluminum wiring, for example. In the example of FIG. 28, manufacture can easily be performed and a manufacturing cost can be reduced.

The anode electrode AN of the diode 33 is connected with a gate electrode 13 of the IGBT through a wiring, and the gate electrode G of the MOSFET 38 is connected with a sense electrode 14 of the IGBT through a wiring. The source electrode S of the MOSFET 38 is connected with an emitter electrode 11 of the IGBT through a wiring.

The anode electrode AN of the Zener diode 36 and the drain electrode D of the MOSFET 38 are connected with each other through a wiring.

Accordingly, the diode 33, the Zener diode 36 and the MOSFET 38 correspond to the diode DI, the Zener diode ZD and the transistor M1 of the device 102, respectively. While the connection order of the diode DI and the Zener diode ZD has been changed between the devices 102 and 107, equivalence of an electric circuit is not lost.

As a result, the protecting circuit of the device 107 operates in the same manner as the protecting circuit of the device 102. Since the IGBT acting as the main element and the protecting circuit are provided in the same device, a high usefulness can be obtained in the same manner as in the device 102. In addition, since the IGBT acting as the main element and the protecting circuit are incorporated in a single chip, a capacitance and a resistance generated parasitically can be reduced, and a decrease in a size, a reduction in the manufacturing cost and excellent protecting performance can be obtained in the same manner as in the devices 105 and 106.

Furthermore, each semiconductor region acting as a component of the protecting circuit is formed as a part of the single crystal semiconductor substrate 90 in the p well region 32. Therefore, it is possible to keep a mobility high and to reduce an element area necessary for the protecting circuit to obtain the same characteristics. In other words, the size of the device can be reduced still more. Each semiconductor region included in the protecting circuit is formed in the p well region 32 which functions as the junction isolation region. Therefore, there is no possibility that a main current flowing in the main element might flow into the protecting circuit to influence the operation of the protecting circuit.

As will be described below, not only each electrode included in the protecting circuit but also each semiconductor region can be formed together with each component of the main element simultaneously at the same steps. Therefore, a manufacturing process can further be simplified and the manufacturing cost can be reduced more.

Figure 29:
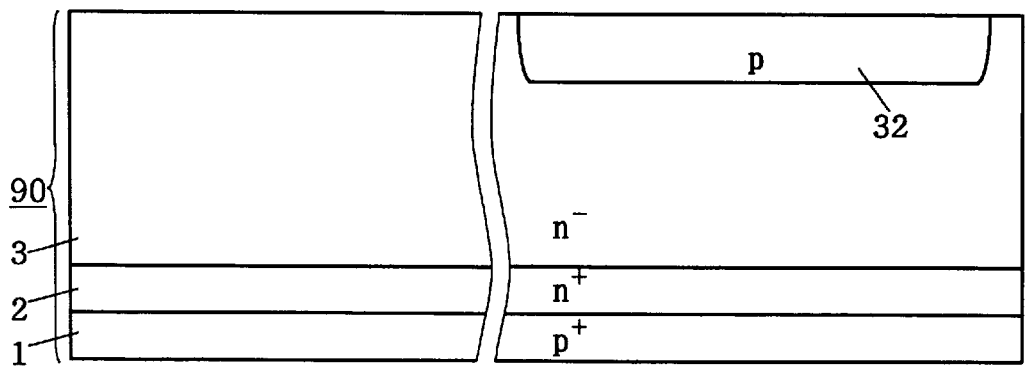
FIGS. 29 to 37 are views showing processes for manufacturing the device according to the seventh embodiment.

FIGS. 29 to 37 are views showing a preferred method for manufacturing the device 107. In order to manufacture the device 107, a step shown in FIG. 29 is first performed. At the step shown in FIG. 29, a semiconductor substrate 90 is first formed.

As described in the first embodiment, a $p^+$ collector layer 1, an $n^+$ buffer layer 2 and an $n^-$ layer 3 are provided in this order from a lower major surface toward an upper major surface in the semiconductor substrate 90.

Then, a p well region 32 is selectively formed more shallowly than the $n^-$ layer 3 in the upper major surface of the semiconductor substrate 90, that is, in an exposed surface of the $n^-$ layer 3. The p well region 32 is formed in the following manner. A p-type impurity is selectively implanted into the exposed surface of the n layer 3 through a patterned shield by well-known photolithography. Furthermore, heat treatment is performed to diffuse the impurity. Thus, the p well region 32 is formed.

Figure 30:
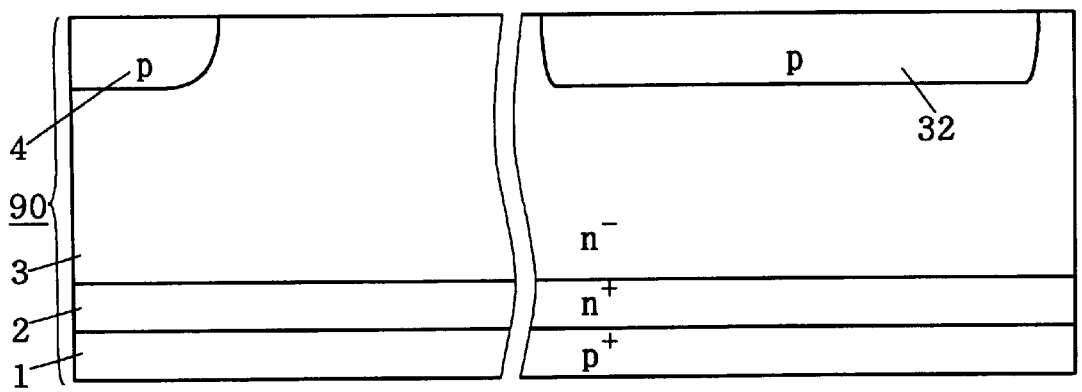

Next, a p base layer 4 is formed more shallowly than the n⁻ layer 3 in the exposed surface of the n⁻ layer 3 apart from the p well region 32 as shown in FIG. 30. The p base layer 4 is also formed through the same step as the step of forming the p well region 32. Accordingly, any of the p base layer 4 and the p well region 32 can be formed earlier, and they can be formed simultaneously at the same step. If the p base layer 4 and the p well region 32 are formed simultaneously, the number of steps and the manufacturing cost can be reduced correspondingly.

Figure 31:
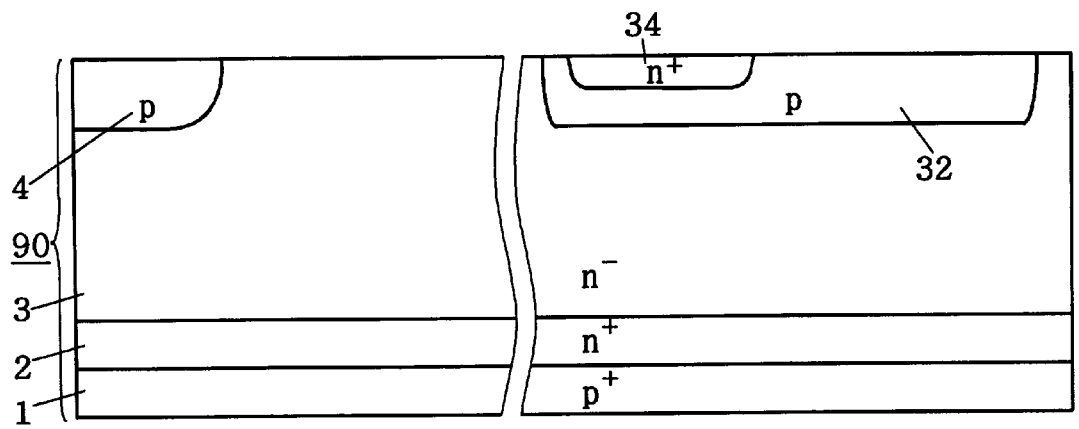

Then, an n⁺ cathode region 34 is selectively formed more shallowly than the p well region 32 within an exposed surface of the p well region 32 included in the upper major surface of the semiconductor substrate 90 as shown in FIG. 31. The n⁺ cathode region 34 is also formed through selective impurity implantation and diffusion treatment.

Figure 32:
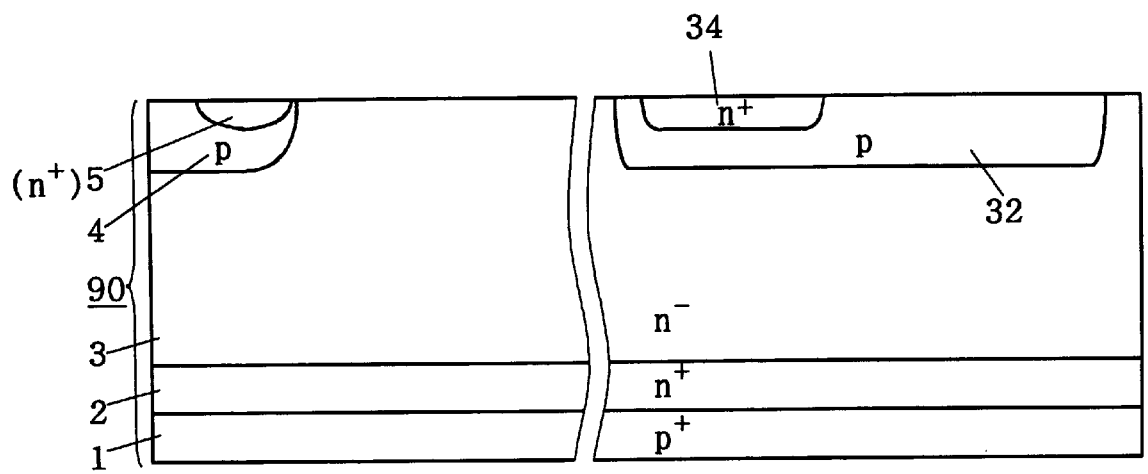
Figure 33:
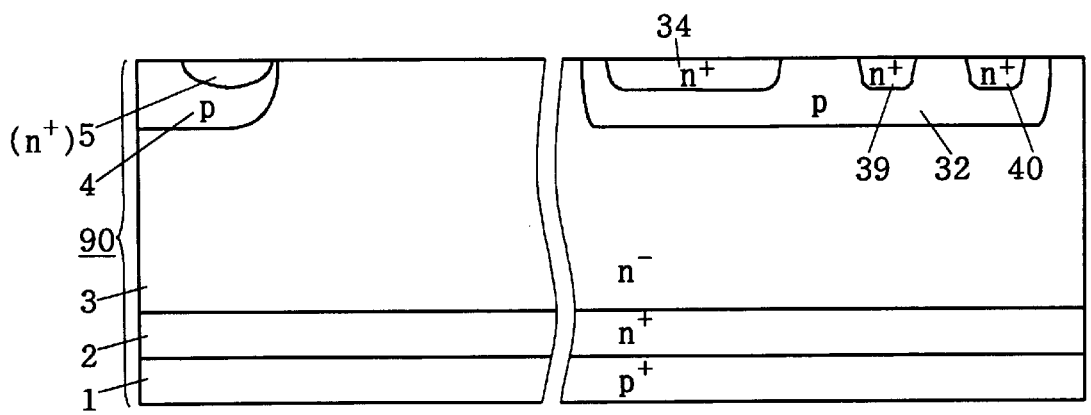

Thereafter, an n⁺ emitter layer 5 is selectively formed more shallowly than the p base layer 4 within an exposed surface of the p base layer 4 included in the upper major surface of the semiconductor substrate 90 as shown in FIG. 32. The n⁺ emitter layer 5 is also formed through the selective impurity implantation and diffusion treatment. Subsequently, an n⁺ drain region 39 and an n⁺ source region 40 are selectively formed more shallowly than the p well region 32 within the exposed surface of the p well region 32 included in the upper major surface of the semiconductor substrate 90 apart from the n⁺ cathode region 34 as shown in FIG. 33. The n⁺ drain region 39 and the n⁺ source region 40 are formed apart from each other. The n⁺ drain region 39 and the n⁺ source region 40 are also formed through the selective impurity implantation and diffusion treatment.

Times that the n⁺ emitter layer 5, the n⁺ cathode region 34, the n⁺ drain region 39 and the n⁺ source region 40 are formed can be reversed to one another. Furthermore, any or all of the n⁺ emitter layer 5, the n⁺ cathode region 34, the n⁺ drain region 39 and the n⁺ source region 40 can be formed simultaneously at the same step. It is needless to say that if a plurality of semiconductor regions are formed simultaneously at the same step, the number of steps and the manufacturing cost can be reduced.

Figure 34:
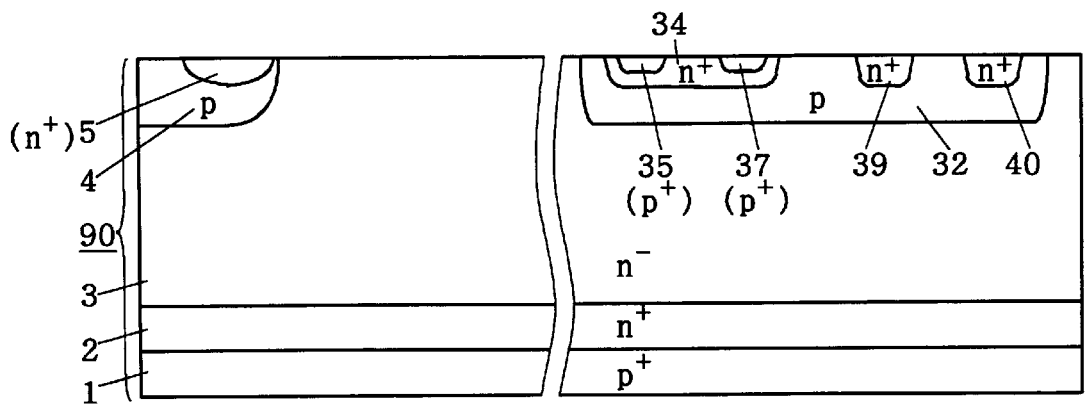

Next, a p⁺ anode region 35 and a p⁺ anode region 37 are selectively formed apart from each other more shallowly than the n⁺ cathode region 34 within an exposed surface of the n⁺ cathode region 34 included in the upper major surface of the semiconductor substrate 90 as shown in FIG. 34. The p⁺ anode region 35 and the p⁺ anode region 37 are also formed through the selective impurity implantation and diffusion treatment.

Figure 35:
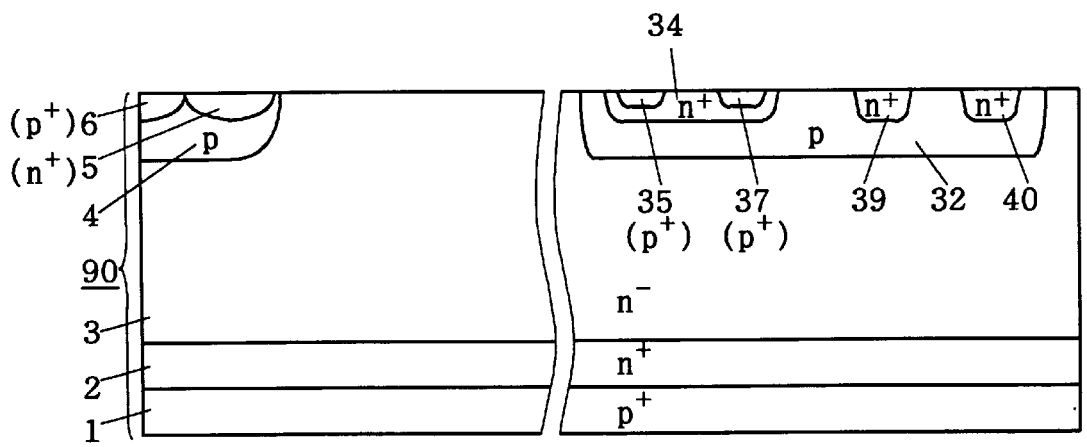

Subsequently, a p⁺ contact layer 6 is selectively formed more shallowly than the p base layer 4 within the exposed surface of the p base layer 4 included in the upper major surface of the semiconductor substrate 90 adjacently to the n⁺ emitter layer 5 as shown in FIG. 35. The p⁺ contact layer 6 is also formed through the selective impurity implantation and diffusion treatment. Times that the p⁺ contact layer 6, the p⁺ anode region 35 and the p⁺ anode region 37 are formed can be reversed to one another. Furthermore, the p⁺ contact layer 6, the p⁺ anode region 35 and the p⁺ anode region 37 can be formed simultaneously at the same step, and thereby the number of the steps and the manufacturing cost can be reduced.

Figure 36:
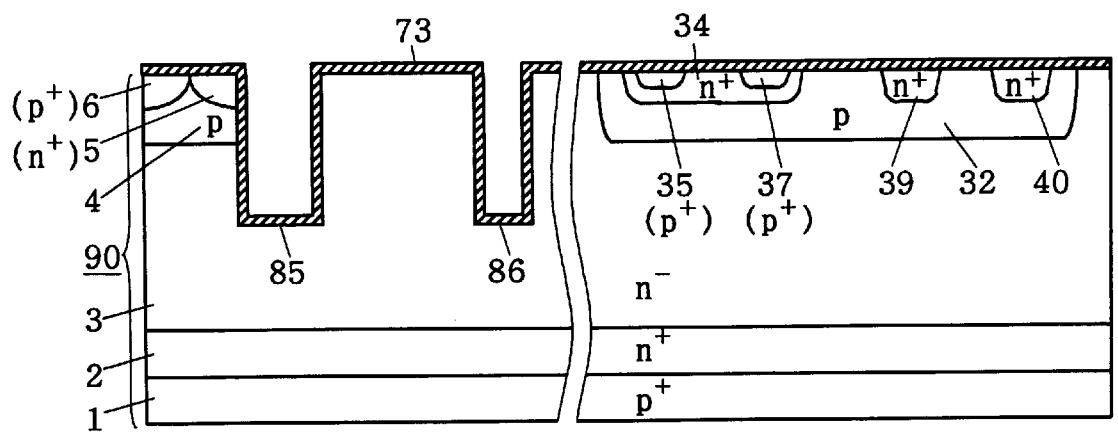

At a step shown in FIG. 36, a gate trench 85 and a sense trench 86 are first formed through the same steps as in FIGS. 6 to 8. In particular, the gate trench 85 and the sense trench 86 are formed in portions apart from the p well region 32. Then, an oxide film 73 is formed through the same step, as in FIG. 9.

Figure 37:
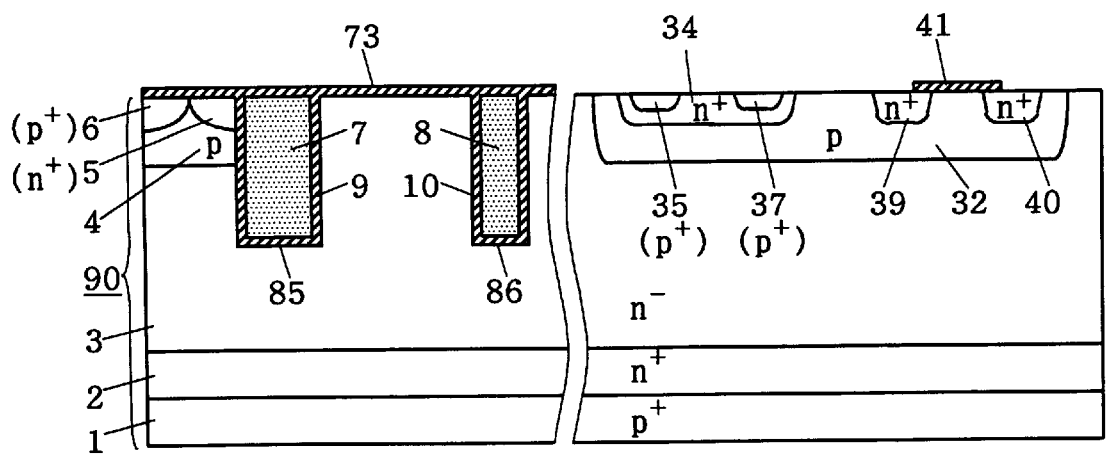

Next, a step shown in FIG. 37 is performed. At the step shown in FIG. 37, a buried gate electrode 7 and a buried sense electrode 8 are first formed through the same steps as in FIGS. 10 and 11. Subsequently, the oxide film 73 is subjected to selective etching so that a gate oxide film 41 is selectively formed on a portion interposed between the n⁺ drain region 39 and the n⁺ source region 40 in the exposed surface of the p well region 32.

Then, a gate electrode G is selectively formed on the gate oxide film 41 as shown in FIG. 28. The gate electrode G is formed in the following manner. For example, polysilicon doped with an impurity having a high concentration is provided on a whole surface over the semiconductor substrate 90. Then, the polysilicon is subjected to selective etching. Thereafter, anode electrodes AN, a drain electrode D and a source electrode S of the protecting circuit are formed simultaneously at steps of forming an emitter electrode 11, a gate electrode 13 and a sense electrode 14 of the IGBT.

In this process, the emitter electrode 11 and the source electrode S, the gate electrode 13 and the anode electrode AN of the diode 33, the sense electrode 14 and the gate electrode G, and the anode electrode AN of the Zener diode 36 and the drain electrode D are connected with each other through patterned wirings, respectively. Then, a collector electrode 12 is formed on an exposed surface of the p⁺ collector layer 1. Thus, the device 107 is finished.

As described above, the device 107 can be manufactured without requiring especially complicated steps by a well-known conventional wafer process in the same manner as the device 101. In addition, most of the manufacturing steps can be shared between the main element and the protecting circuit. Consequently, the number of the manufacturing steps and the manufacturing cost can be reduced.

<8. Eighth Embodiment>

Figure 38:
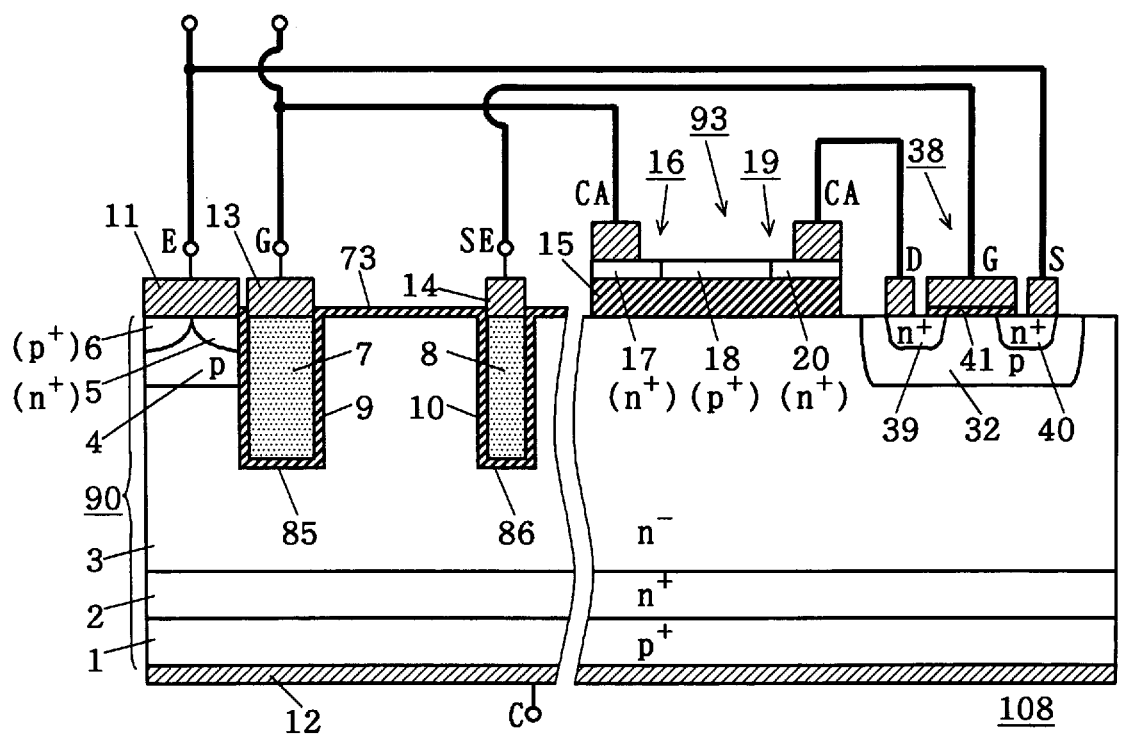
FIG. 38 is a sectional front view showing a device according to an eighth embodiment.

FIG. 38 is a sectional front view showing a semiconductor device according I:o an eighth embodiment. In a device 108, an IGBT acting as a main element and a protecting circuit for protecting the IGBT are incorporated in a single chip in the same manner as in the devices 105 to 107. The device 108 is characteristically different from the devices 105 to 107 in that a part of a semiconductor region acting as a component of the protecting circuit is formed on a semiconductor substrate 90 separately from the semiconductor substrate 90 by using a TFT technique, and the other part is formed as a part of the semiconductor substrate 90 therein. In other words, the protecting circuit of the device 108 is formed by a combination of the devices 105 and 107.

More specifically, a field oxide film 15 is selectively formed on a portion of an upper major surface of the semiconductor substrate 90 which corresponds to an exposed surface of an n⁻ layer 3. A thin film semiconductor 93 is formed on the field oxide film 15. In each portion of the thin film semiconductor 93, n-type and p-type impurities are selectively doped. As a result, an n⁺ cathode region 17, a p⁺ anode region 18 and an n⁺ cathode region 20 are sequentially formed from one end to the other end in the thin film semiconductor 93.

The n⁺ cathode region 17 and the p⁺ anode region 18 act as components of a Zener diode 16, and the p⁺ anode region 18 and the n⁺ cathode region 20 act as components of a diode 19. While the p⁺ anode region 18 is shared by the Zener diode 16 and the diode 19 in an example of FIG. 38, they can be formed separately and can be connected with each other through an aluminum wiring, for example. In the example of FIG. 38, manufacture can easily be performed and a manufacturing cost can be reduced,. A cathode electrode CA is connected onto the n⁺ cathode region 17, and another cathode electrode CA is connected onto the n⁺ cathode region 20.

Furthermore, a p well region 32 is selectively formed in a portion of the upper major surface of the semiconductor substrate 90 which corresponds to the exposed surface of the n⁻ layer 3. The p well region 32 is a semiconductor region which functions as a junction isolation region, and is formed more shallowly than the n⁻ layer 3. An n⁺ drain region 39 and an n⁺ source region 40 are selectively formed apart from each other more shallowly than the p well region 32 within an exposed surface of the p well region 32 included in the upper major surface of the semiconductor substrate 90. A gate oxide film 41 is formed on a portion interposed between the n⁺ drain region 39 and the n⁺ source region 40 in the exposed surface of the p well region 32.

A drain electrode D is connected with an exposed surface of the n⁺ drain region 39, and a source electrode S is connected with an exposed surface of the n⁺ source region 40. Furthermore, a gate electrode G is formed on the gate oxide film 41.

The gate electrode G is opposed to a region provided thereunder, that is, a portion of the exposed surface of the p well region 32 which is provided between the n⁺ drain region 39 and the n⁺ source region 40 with the gate oxide film 41 interposed therebetween.

The cathode electrode CA of the diode 19 and the drain electrode D of a MOSFET 38 are connected with each other through a wiring. Accordingly, the Zener diode 16, the diode 19 and the MOSFET 38 are connected in this order in series. The cathode electrode CA of the Zener diode 16 is connected with a gate electrode 13 of the IGBT through a wiring, and the gate electrode G of the MOSFET 38 is connected with a sense electrode 14 of the IGBT through a wiring. The source electrode S of theMOSFET 38 is connected with an emitter electrode 11 of the IGBT through a wiring.

Accordingly, the Zener diode 16, the diode 19 and the MOSFET 38 correspond to the Zener diode ZD, the diode DI and the transistor M1 of the device 102, respectively.

As a result, the protecting circuit of the device 108 operates in the same manner as the protecting circuit of the device 102 (FIG. 12). The IGBT acting as the main element and the protecting circuit are provided in the same device. Therefore, a high usefulness can be obtained as in the device 102.

In addition, since the IGBT acting as the main element and the protecting circuit are incorporated in a single chip, a capacitance and a resistance generated parasitically can be reduced, and a decrease in a size, a reduction in the manufacturing cost and excellent protecting performance can be obtained in the same manner as in the devices 105 to 107. The Zener diode 16 and the diode 19 are electrically insulated from the semiconductor substrate 90 through the field oxide film 15, and each semiconductor region included in the MOSFET 38 is formed in the p well region 32 which functions as the junction isolation region. Therefore, there is no possibility that a main current flowing in the main element might flow into the protecting circuit to influence the operation thereof.

Furthermore, each semiconductor region acting as a component of the MOSFET 38 is formed as a part of the single crystal semiconductor substrate 90 in the p well region 32. Therefore, it is possible to keep a mobility high and to reduce an element area necessary for the MOSFET 38 to obtain the same characteristics. In other words, the size of the device can be reduced more than in the devices 105 and 106. As will be described below, not only each electrode included in the protecting circuit but also each semiconductor region of the MOSFET 38 can be formed together with each, component of the main element simultaneously at the same steps. Therefore, a manufacturing process can further be simplified and the manufacturing cost can be reduced more than in the devices 105 and 106.

The device 108 can easily be manufactured by a combination of the process for manufacturing the device 105 and the process for manufacturing the device 107. More specifically, it is preferable that the steps of manufacturing the device 107 shown in FIGS. 29 to 36 should first be performed in order to manufacture the device 108. The steps shown in FIGS. 31 and 34 are not performed. As a result, an n⁺ cathode region 34, a p⁺ anode region 35 and a p⁺ anode region 37 are not formed.

Figure 39:
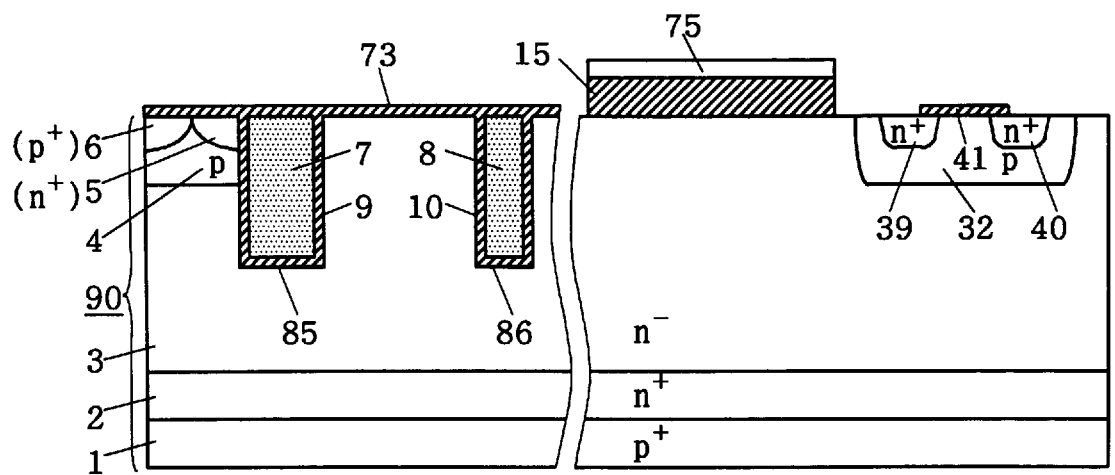
FIG. 39 is a view showing a process for manufacturing the device according to the eighth embodiment.

Then, the steps of manufacturing the device 105 shown in FIGS. 17 and 18 are erformed. Thereafter, an oxide film 73 is subjected to patterning in the same manner s the step shown in FIG. 37. Consequently, a structure shown in FIG. 39 can be obtained. More specifically, a field oxide film 15 and a thin film semiconductor 75 are selectively formed on an exposed surface of an n⁻ layer 3, and a gate oxide film 41 is formed on a portion of an exposed surface of a p well region 32 interposed between an n⁺ drain region 39 and an n⁺ source region 40.

Next, the same step as in FIG. 19 is performed so that an n⁺ cathode region 17, a p⁺ anode region 18 and an n⁺ cathode region 20 are selectively formed in the thin film semiconductor 75 respectively as shown in FIG. 38. Then, a gate electrode G is formed on the gate oxide film 41. Furthermore, a cathode electrode CA, a drain electrode D and a source electrode S of the protecting circuit are formed simultaneously at steps of forming an emitter electrode 11, a gate electrode 13 and a sense electrode 14 of the IGBT.

In this process, the emitter electrode 11 and the source electrode S, the gate electrode 13 and the cathode electrode CA of the Zener diode 16, the sense electrode 14 and the gate electrode G, and the cathode electrode CA of the diode 19 and the drain electrode D of the MOSFET 38 are connected with each other through patterned wirings, respectively. Then, a collector electrode 12 is formed on an exposed surface of the p⁺ collector layer 1. Thus, the device 108 is finished.

As described above, the device 108 can be manufactured without requiring: especially complicated steps by a well-known conventional wafer process in the same manner as the device 101. In addition, a part of the manufacturing steps can be shared between the main element and the protecting circuit. Consequently, the number of the manufacturing steps and the manufacturing cost can be reduced.

<9. Ninth Embodiment>

Figure 40:
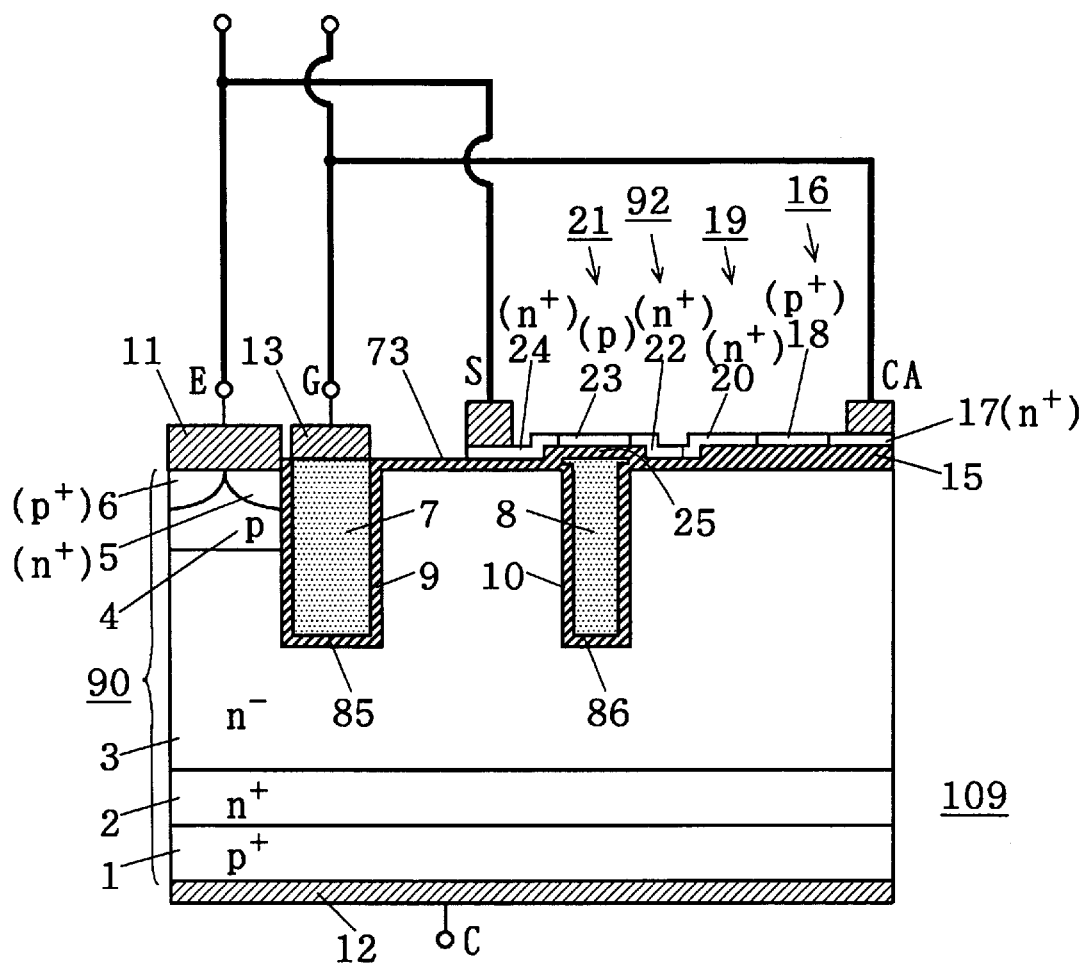
FIG. 40 is a sectional front view showing a device according to a ninth embodiment.
Figure 41:
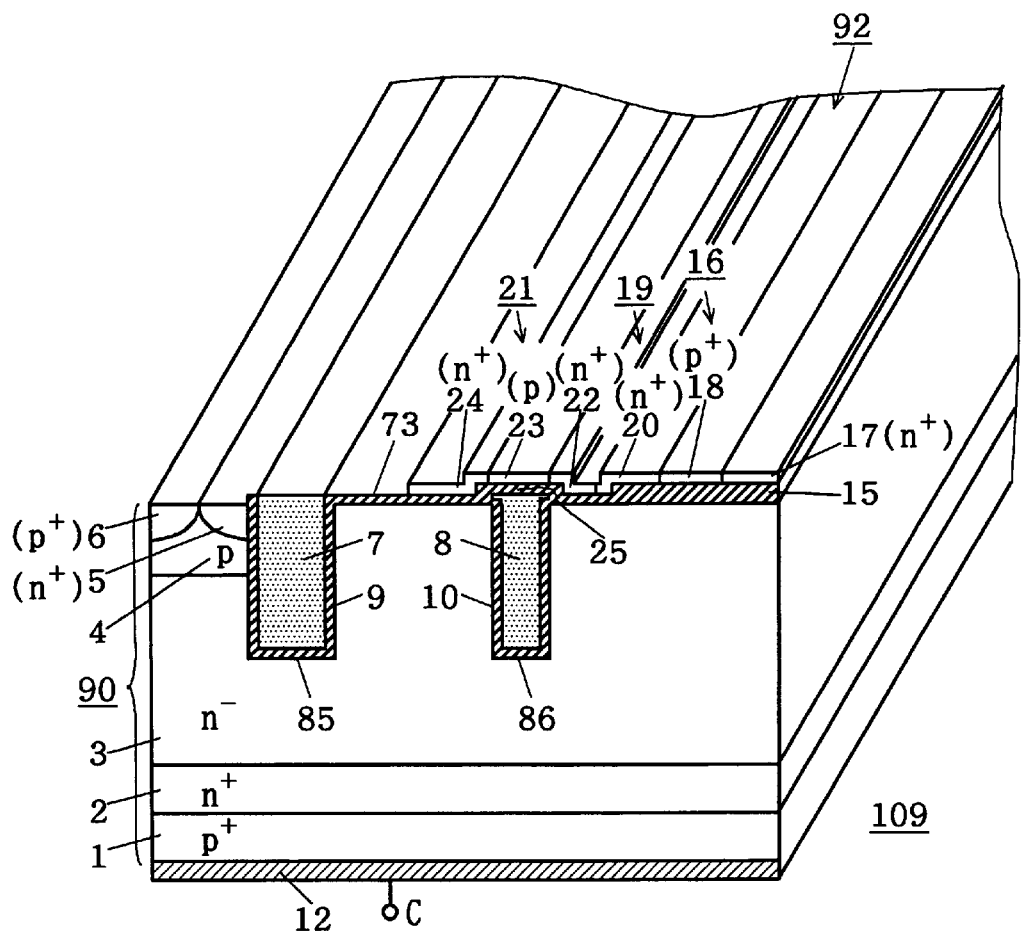
FIG. 41 is a perspective sectional view showing the device according to the ninth embodiment.

FIG. 40 is a sectional front view showing a semiconductor device according to a ninth embodiment. FIG. 41 is a perspective sectional view showing main parts of a device 109. In the device 109, each semiconductor region acting as a component of a protecting circuit for protecting an IGBT acting as a main element is formed in a thin film semiconductor 92 positioned over an upper major surface of a semiconductor substrate 90 in the same manner as in the device 105 (FIG. 16).

The device 109 is characteristically different from the device 105 in the following two respects. First of all, the device 109 is characteristically different from the device 105 in that a gate electrode G opposed to a p well region 23 and a buried sense electrode 8 of the main element are integrally formed as one common portion. In other words, both electrodes are common to each other or share each other. Secondly, the device 109 is characteristically different from the device 105 in that the buried sense electrode 8 and the protecting circuit are provided for each minimum unit cell which functions as the IGBT as shown in FIG. 41. FIGS. 40 and 41 show main parts of one cell.

One cell includes a minimum unit of each element forming the IGBT, that is, a minimum unit such as a buried gate electrode 7, an $n^+$ emitter layer 5, an emitter electrode 11 or the like. In a typical example of the cell shown in FIG. 41, a gate trench 85 is formed linearly, and one cell is formed like a band along one linear gate trench 85. The IGBT acting as the main element of the device 109 includes a large number of band-shaped cells arranged in parallel with one another in the common semiconductor substrate 90.

The thin film semiconductor 92 is formed on an oxide film 73 and a field oxide film 15 formed on an exposed surface of an $n^-$ layer 3 and a gate oxide film 25 covering a top portion of the buried sense electrode 8. In the same manner as in the device 105, an $n^+$ cathode region 17, a $p^+$ anode region 18, an $n^+$ cathode region 20, an $n^+$ drain region 22, a p well region 23 and an $n^+$ source region 24 are sequentially formed from one end to the other end in the thin film semiconductor 92. These semiconductor regions are characterized in that the p well region 23 is opposed to the top portion of the buried sense electrode 8 with the gate oxide film 25 interposed therebetween.

The $n^+$ cathode region 17 and the $p^+$ anode region 18 act as components of a Zener diode 16, and the $p^+$ anode region 18 and the $n^+$ cathode region 20 act as components of a diode 19. The $n^+$ drain region 22, the p well region 23 and the $n^+$ source region 24 act as components of a MOSFET 21. The Zener diode 16, the diode 19 and the MOSFET 21 are connected in this order in series. The device 109 is the same as the device 105 in that it can have another form in which the $p^+$ anode region 18 is not shared by the Zener diode 16 and the diode 19.

A cathode electrode CA is connected onto the $n^+$ cathode region 17, and a source electrode S is connected onto the $n^+$ source region 24. The cathode electrode CA is connected with a gate electrode 13 of the IGBT through a wiring, and the source-electrode S is connected with an emitter electrode 11 of the IGBT through a wiring.

Accordingly, the Zener diode 16, the diode 19 and the MOSFET 21 correspond to the Zener diode ZD, the diode DI and the transistor M1 of the device 102, respectively. As a result, the protecting circuit of the device 109 operates in the same manner as the protecting circuit of the device 102. The IGBT acting as the main element and the protecting circuit are provided in the same device. Therefore, a high usefulness can be obtained as in the device 102.

In addition, the IGBT acting as the main element and the protecting circuit are incorporated in a single chip. In the device 109, consequently, a capacitance and a resistance generated parasitically can be reduced, and a decrease in a size, a reduction in a manufacturing cost and excellent protecting performance can be obtained in the same manner as in the devices 105 to 108. In particular, the buried sense electrode 8 and the protecting circuit are provided in each IGBT cell. In addition, the buried sense electrode 8 and the protecting circuit are formed most closely. Therefore, the capacitance and resistance generated parasitically can especially be reduced effectively.

Furthermore, the gate electrode G of the MOSFET 21 is formed integrally with the buried sense electrode 8 of the main element. Therefore, it is not necessary to form the gate electrode G separately. Consequently, a manufacturing process can be simplified and the manufacturing cost can be reduced. In addition, the protecting circuit is formed over the buried sense electrode 8, and the main element partially overlaps with the protecting circuit on the upper major surface of the semiconductor substrate 90.

Therefore, the size of the device can be reduced correspondingly to the overlap.

Figure 42:
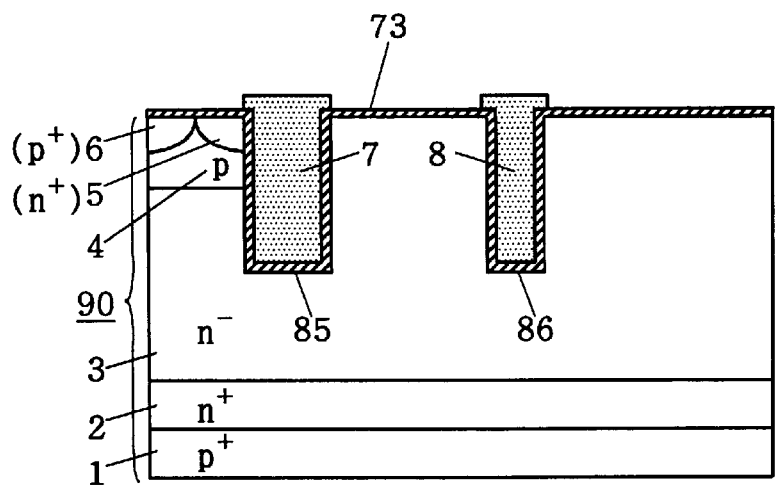
FIGS. 42 to 44 are views showing processes for manufacturing the device according to the ninth embodiment.
Figure 43:
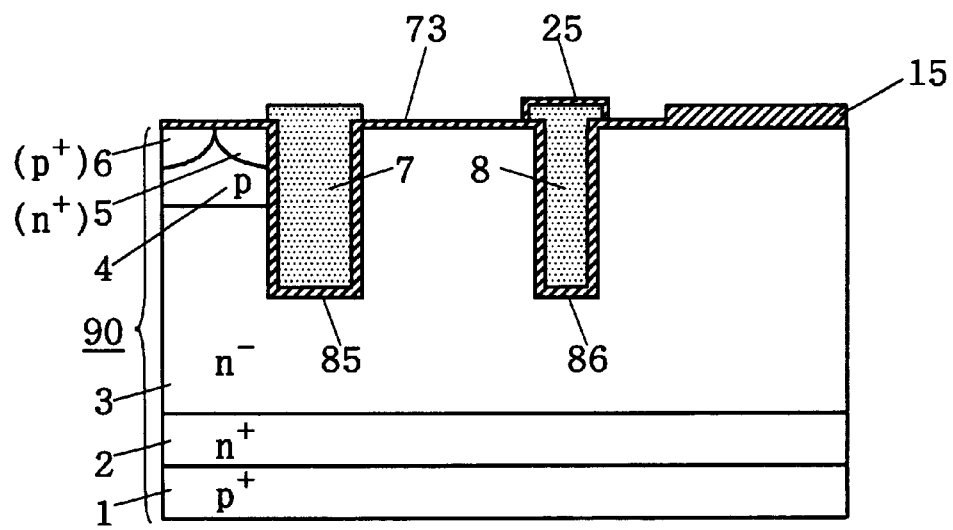
Figure 44:
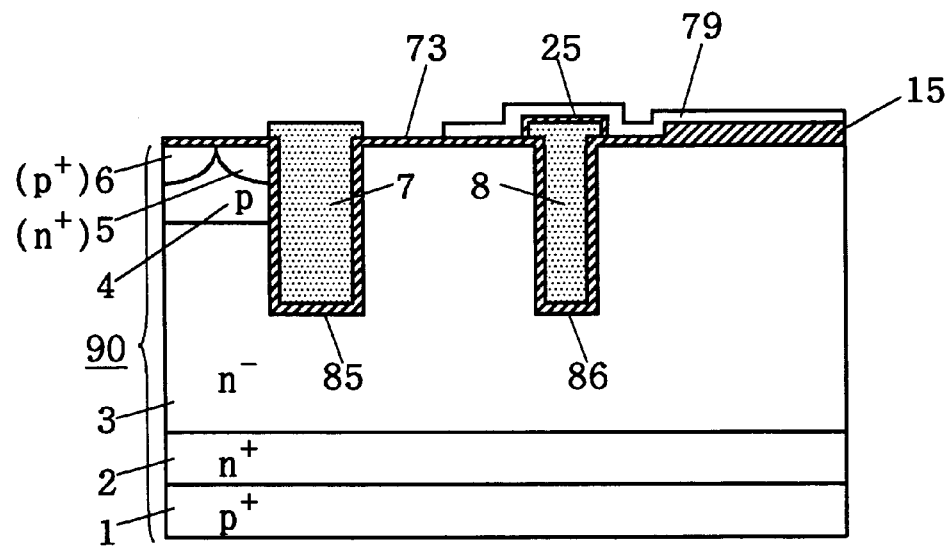

FIGS. 42 to 44 are views showing a preferred method for manufacturing the device 109. In order to manufacture the device 109, the steps shown in FIGS. 6 to 10 are first performed. Then, a polysilicon layer 74 is subjected to etching in the same manner as the step shown in FIG. 11. Consequently, a structure shown in FIG. 42 is obtained.

In this case, the polysilicon layer 74 may be subjected to selective etching in such a manner that a top portion of a buried sense electrode 8 protrudes somewhat upward from an upper major surface of a semiconductor substrate 90 as shown in FIG. 42. In the same manner as the buried sense electrode 8, a top portion of a buried gate electrode 7 may also protrude upward.

Then, a step shown in FIG. 43 is performed. More specifically, a gate oxide film 25 covering the top portion of the buried sense electrode 8 is formed, and a field oxide film 15 is selectively formed on an exposed surface of an $n^-$ layer 3. The field oxide film 15 can be formed by performing the same step as in FIG. 17.

Subsequently, a thin film semiconductor 79 is formed on an oxide film 73, a gate oxide film 25 and the field oxide film 15 as shown in FIG. 44. The thin film semiconductor 79 is formed as non-doped thin film polysilicon by performing the same step as in FIG. 18. Then, the same step as in FIG. 19 is performed. Consequently, semiconductor regions from an $n^+$ cathode region 17 to an $n^+$ source region 24 are formed in the thin film semiconductor 79 as shown in FIG. 40. At this time, a p well region 23 is formed in an opposite position to the top portion of the buried sense electrode 8 with the gate oxide film 25 interposed therebetween.

Next, a cathode electrode CA and a source electrode S of the protecting circuit are formed simultaneously at steps of forming an emitter electrode 11 and a gate electrode 13 of the IGBT. In this process, the emitter electrode 11 of the IGBT and the source electrode S of the MOSFET 21, and the gate electrode 13 of the IGBT and the cathode electrode CA of the Zener diode 16 are connected with each other through patterned wirings, respectively. Then, a collector electrode 12 is formed on an exposed surface of the $p^+$ collector layer 1. Thus, the device 109 is finished.

As described above, the device 109 can be manufactured without requiring especially complicated steps by a well-known conventional wafer process in the same manner as the device 101. In addition, a part of the manufacturing steps can be shared between the main element and the protecting circuit. Consequently, the number of the manufacturing steps and the manufacturing cost can be reduced. In particular, it is not necessary to form the buried sense electrode 8 of the IGBT and the gate electrode G of the MOSFET 21 separately. Therefore, the number of the manufacturing steps and the manufacturing cost can especially be reduced effectively.

<10. Tenth Embodiment>

Figure 45:
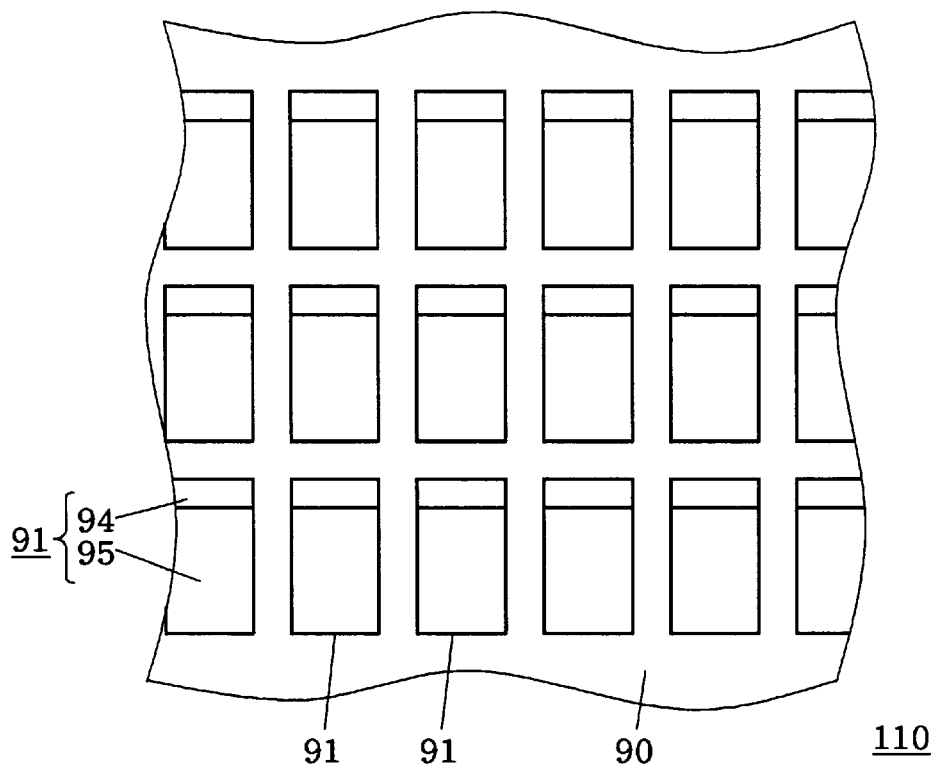
FIG. 45 is a sectional plan view showing a device according to a tenth embodiment.

FIG. 45 is a sectional plan view showing a semiconductor device according to a tenth embodiment. A device 110 is characterized in that a buried sense electrode 8 and a protecting circuit are provided for each block having a plurality of cells connected in parallel. In an example shown in FIG. 45, a plurality of blocks 91 are arranged in a matrix in a semiconductor substrate 90. Each block 91 includes a main element 95 formed as an IGBT, and a protecting circuit 94 for protecting the main element 95.

Figure 46:
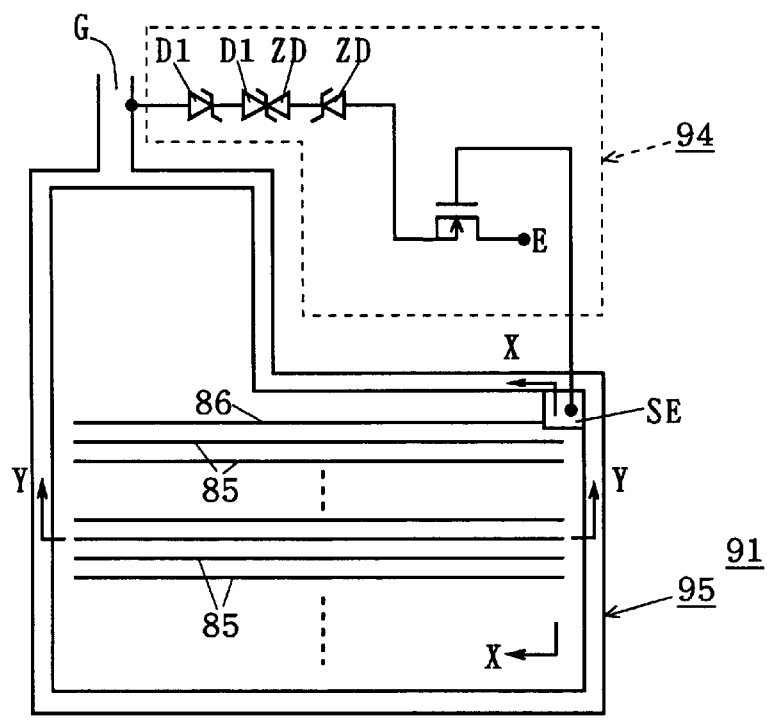
FIG. 46 is a partial plan view showing the device according to the tenth embodiment.
Figure 47:
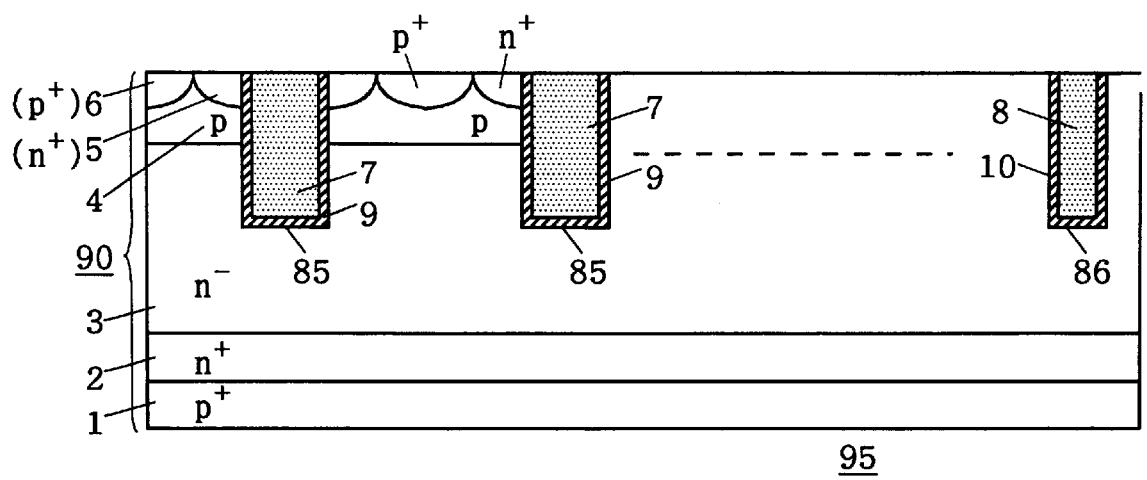
FIG. 47 is a sectional view taken along the line X—X in FIG. 46.
Figure 48:
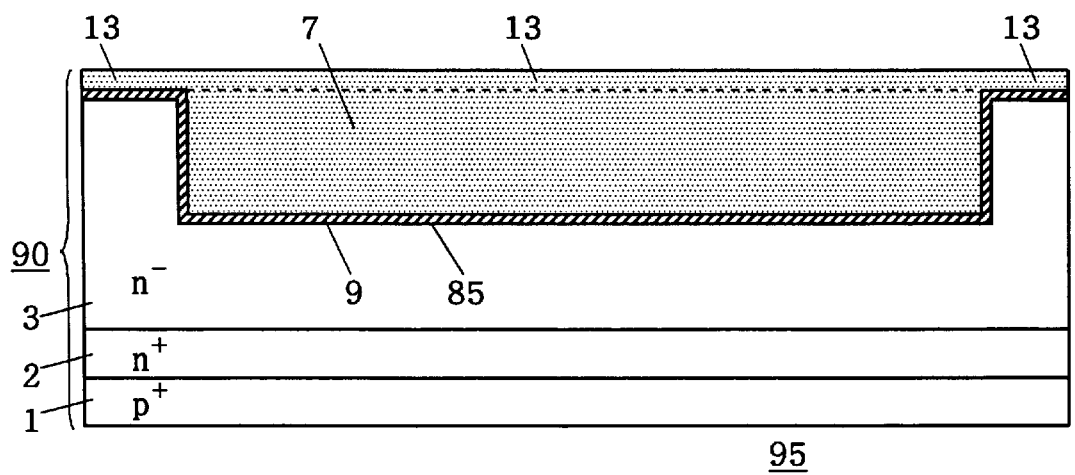
FIG. 48 is a sectional view taken along the line Y—Y in FIG. 46.

FIG. 46 is a sectional plan view showing one block 91. FIGS. 47 and 48 are sectional views taken along the lines X—X and Y—Y in FIG. 46, respectively. In examples shown in FIGS. 46 to 48, a large number of linear gate trenches 85 are arranged in parallel in the main element 95. One band-shaped cell corresponds to one gate trench 85. In other words, one block 91 includes a large number of band-shaped IGBT cells arranged in parallel with one another.

One sense trench 86 is formed in one main element 95 in parallel with the gate trenches 85. The protecting circuit 94 is formed in a semiconductor substrate 90 adjacently to the main element 95 or over the semiconductor substrate 90. The protecting circuit 94 may be any of the protecting circuits provided in the devices 105 to 109. In a case where the protecting circuit 94 is formed in the same manner as the protecting circuit provided in the device 109, a region formed along a major surface of the semiconductor substrate 90 which is occupied by the protecting circuit 94 partially overlaps with a region occupied by the main element 95.

In general, there is a physical limit to make the device finer. In the device in which the protecting circuit is provided for each cell, for example, the device 109, an area occupied by the protecting circuit along the major surface of the semiconductor substrate 90 should sometimes be set unnecessarily large due to the limit to make the device finer. On the other hand, the device 110 has the protecting circuit provided for each of the blocks 91 including a plurality of cells. Therefore, an area (or a current capacity) occupied by a transistor M1 and the like included in the protecting circuit is set according to an area occupied by the single block 91 along the major surface of the semiconductor substrate 90, that is, a magnitude of a main current flowing in the single block 91. More specifically, the area (or the current capacity) of the protecting circuit including the transistor M1 and the like is set proportional to the area (or a main current capacity) of the block 91. In this case, if the area occupied by the transistor M1 and the like is much larger than the limit to make the device finer, an unnecessary area is prevented from being generated due to the limit to make the device finer. An area necessary for isolation is not always proportional to the area of the block 91. For this reason, the area (or the main current capacity) of the block 91 is properly set so that a whole area of the device 110, that is, a size of the device 110 can be reduced more than in the device 109 in which the protecting circuit is provided for each cell, and can optimally be reduced to a minimum.

<11. Eleventh Embodiment>

Figure 49:
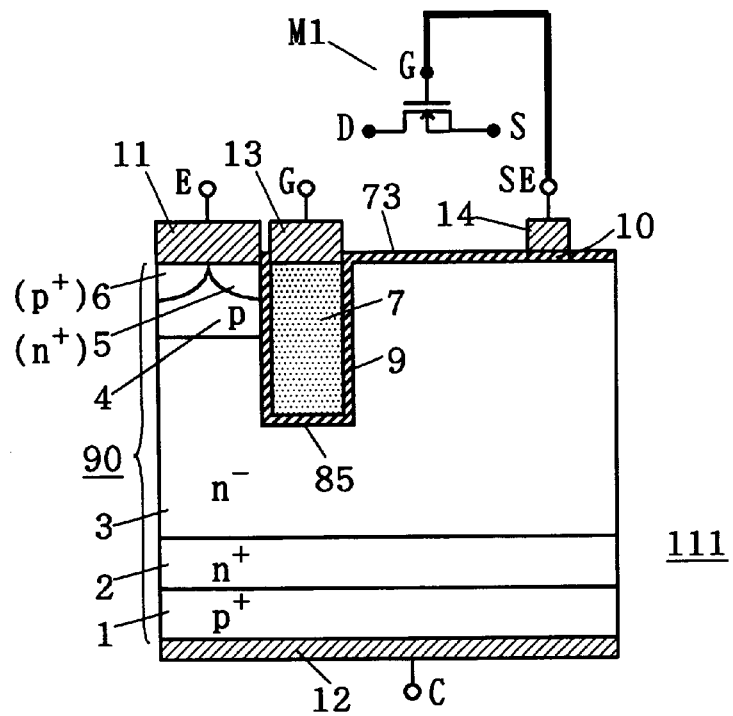
FIG. 49 is a sectional front view showing a device according to an eleventh embodiment.

FIG. 49 is a sectional front view showing a semiconductor device according to an eleventh embodiment. A device 111 is characteristically different from the device 101 (FIG. 1) in that a plane gate is provided in place of the buried sense electrode 8. More specifically, a sense oxide film 10 is selectively formed on an exposed surface of En n⁻ layer 3, and a sense electrode (a voltage sensing section) 14 is formed on the sense oxide film 10. In other words, the sense electrode 14 is opposed to the exposed surface of the n⁻ layer 3 included in an upper major surface of a semiconductor substrate 90 with the sense oxide film 10 interposed therebetween instead of the buried sense electrode 8.

Also in the device 111, the sense electrode 14 forms a capacitor together with the n⁻ layer 3 with the sense oxide film 10 interposed therebetween. For this reason, a fluctuation of an electric potential of the n⁻ layer 3 can be detected through the sense electrode 14 in the same manner as in the device 101. As shown in FIG. 49, when the sense electrode 14 is connected with a gate electrode G of a transistor M1, a gate voltage V (MOSFET·gate) of the transistor M1 is expressed by the Equation 1 in the same manner as in the first embodiment. In other words, the device 111 operates in the same manner as the device 101, and can produce the same effects.

If a comparison is made with the areas of the sense electrodes 14 and 8 occupying an upper major surface of a semiconductor substrate 90 identical with each other, a capacitance C (sense) between the sense electrode 14 and the no layer 3 is lower in the device 111 than in the device 101 comprising the buried sense electrode 8.

According to the Equation 1, consequently, the gate voltage V (MOSFET·gate) of the transistor M1 is lower in the device 111 than in the device 101. Accordingly, in a case where a gate threshold voltage of the transistor M1 cannot be increased because of a manufacturing process, the device 111 is more useful.

By including both the devices 101 and 111 in the choices of a design, the capacitance C (sense) of the sense electrode 8 or 14 can be set over a wide range without changing a design parameter (for example, a width of a cell of a main element) which affects operating performance of the main element. In other words, flexibility of the design can be increased.

In order to manufacture the device 111, for example, it is sufficient that the same steps as in FIGS. 6 to 11 are performed without an opening 72 provided on the oxide film mask 70 shown in FIG. 6, for example. Consequently, a sense trench 86, a sense oxide film 10 and a buried sense electrode 8 are not formed so that a structure shown in FIG. 50 can be obtained. Then, an oxide film 73 is subjected to selective etching in the same manner as the step shown in FIG. 37. Thus, a sense oxide film 10 is formed as shown in FIG. 49.

Next, a sense electrode 14 is formed on the sense oxide film 10, an emitter electrode 11 is connected with exposed surfaces of an n⁺ emitter layer and a p⁺ contact layer 6, and a gate electrode 13 is connected with a buried gate electrode 7 as shown in FIG. 49. Then, a collector electrode 12 is connected with an exposed surface of a p⁺ collector layer 1. Thus, the device 111 is finished. In other words, the device 111 can also be manufactured easily by using a well-known conventional wafer process in the same manner as the device 101.

<12. Twelfth Embodiment>

Figure 51:
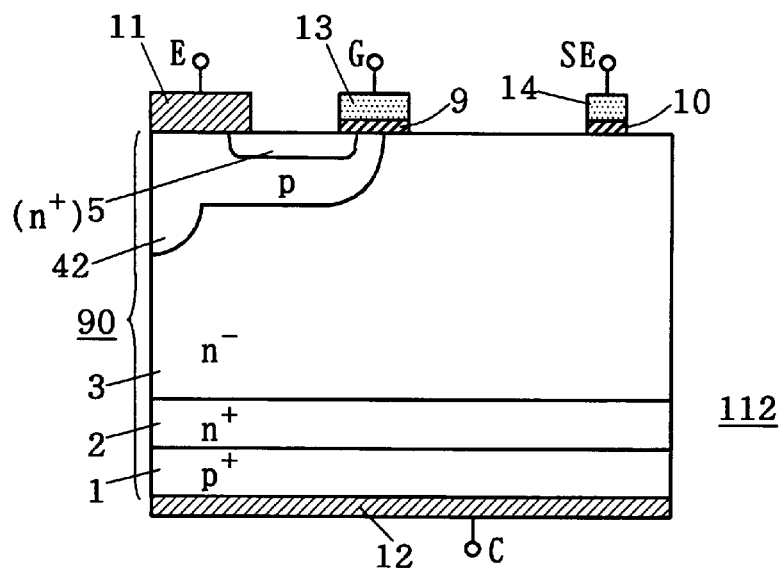
FIG. 51 is a sectional front view showing a device according to a twelfth embodiment.

FIG. 51 is a sectional front view showing a semiconductor device according to a twelfth embodiment. A device 112 is characteristically different from the device 111 in that a plane gate structure is also employed for a gate electrode 13 as well as a sense electrode 14. More specifically, an IGBT acting as a main element does not have a trench type but the same planar type as that of the device 152 according to the prior art. Accordingly, the device 112 operates as the main element in the same manner as the device 152 according to the prior art. Detection characteristics of a change in an electric potential of an n⁻ layer 3 through the sense electrode 14 are the same as in the device 111.

A structure of the device 112 is characteristically different from that of the device 152 according to the prior art in that a sense oxide film 10 and a sense electrode 14 are provided. In addition, the sense oxide film 10 and the sense electrode 14 have the same structures as those of a gate oxide film 9 and a gate electrode 13. In a preferred method for manufacturing the device 112, accordingly, the sense oxide film 10 is formed simultaneously at the step of forming the gate oxide film 9, and the sense electrode 14 is formed simultaneously at the step of forming the gate electrode 13 in the method for manufacturing the device 152, which is not shown.

The device 112 can easily be manufactured without adding a new step only by changing a pattern of a shield to be used in the process for manufacturing the device 152. Furthermore, it is not necessary to form a gate trench 85 and a sense trench 86. Also in this respect, therefore, a manufacturing process can be performed easily and the device can be manufactured inexpensively. In the same manner as various devices 102 to 110 using the device 101, the devices 111 and 112 can have the form in which a main element and a protecting circuit are incorporated in the same device or further in a single chip. In addition, the same effects can be obtained.

<13. Thirteenth Embodiment>

Figure 52:
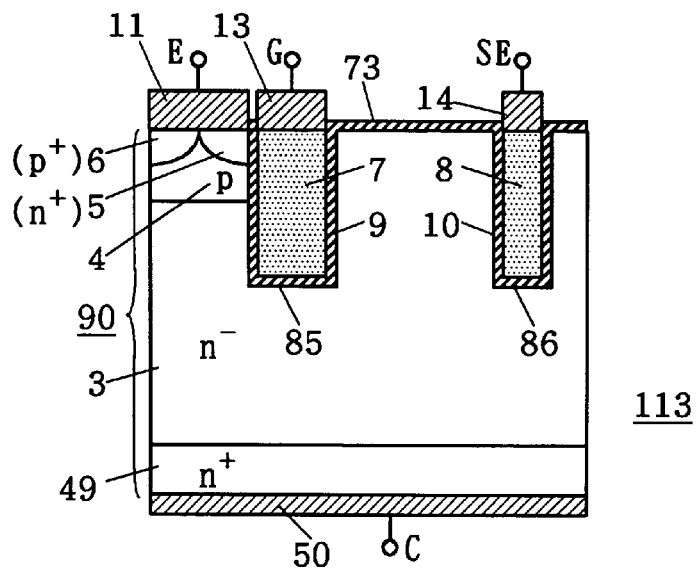
FIG. 52 is a& sectional front view showing a device according to a thirteenth embodiment.

While the main element has been formed as the IGBT in the first to twelfth embodiments, the present invention can be executed for various main elements as well as the IGBT. These examples will be described in thirteenth and fourteenth embodiments. A sectional front view of FIG. 52 shows a device having a main element formed as a MOSFET. A device 113 has a structure in which the $p^+$ collector layer 1 and the $n^+$ buffer layer 2 included in the semiconductor substrate 90 in the device 101 (FIG. 1) are replaced with an $n^+$ drain layer 49. Although the emitter electrode 11 and the collector electrode 12 in the device 101 will be hereinafter referred to as a source electrode 11 aid a drain electrode 50 respectively, structures of these electrodes are not changed.

Also in the device 113, abnormalities of the MOSFET acting as the main element can be detected through an electric potential of an n layer 3 by a sense electrode 14 in the same manner as in the device 101. The device 113 is the same as the device 101 in that detection characteristics of the sense electrode 14 can be expressed by the Equation 1. Also in the MOSFET acting as the main element as well as the IGBT, thus, a tolerance to abnormalities can be increased by using the sense electrode 14.

As a preferred method for manufacturing the device 113, it is preferable that the $n^+$ drain layer 49 and the $n^-$ layer 3 should be provided in this order from a lower major surface toward an upper major surface as a semiconductor substrate 90 at the beginning of the step in FIG. 6 related to the method for manufacturing the device 101. Since a method for forming the semiconductor substrate 90 is well known as a process to be executed for manufacturing a MOSFET according to the prior art, its detailed description will be omitted. Steps to be performed after the semiconductor substrate 90 is formed are the same as the steps of manufacturing the device 101 which have been described in the first embodiment. More specifically, the device 113 can easily be manufactured by using a well-known conventional wafer process in the same manner as the device 101.

In the same manner as various devices 102 to 110 using the device 101, the device 113 can have the form in which a main element and a protecting circuit are incorporated in the same device or further in a single chip. In addition, the same effects can be obtained.

<14. Fourteenth Embodiment>

Figure 53:
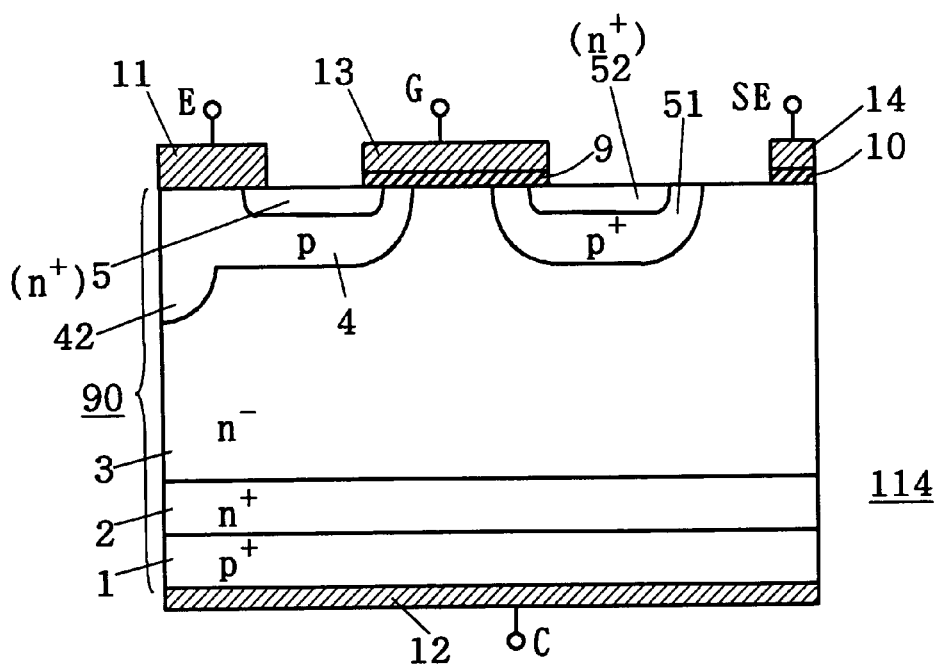
FIG. 53 is a sectional front view showing a device according to a fourteenth embodiment.

FIG. 53 is a sectional front view showing a device having a main element formed as an EST (Emitter Switched Thyristor). In a device 114, a $p^+$ floating region 51 is selectively formed more shallowly than an $n^-$ layer 3 in an exposed surface of the $n^-$ layer 3 apart from a p base layer 4, and an $n^+$ floating region 52 is selectively formed more shallowly than the $p^+$ floating region 51 within an exposed surface of the $p^+$ floating region 51.

A gate electrode 13 is opposed to both a portion of an exposed surface of the $p^+$ floating region 51 provided between the $n^+$ floating region 52 and the $n^-$ layer 3 and a portion of an exposed surface of the p base layer 4 provided between an $n^+$ emitter layer and the $n^-$ layer 3 with a gate oxide film 9 interposed therebetween. In other words, a structure of the main element acting as the EST is the same as that of a well-known EST according to the prior art.

A sense electrode 14 is opposed to the exposed surface of the $n^-$ layer 3 apart from the $p^+$ floating region 51 with a sense oxide film 10 interposed therebetween.

Accordingly, abnormalities of the EST acting as the main element can be detected through an electric potential of the $n^-$ layer 3 by the sense electrode 14 in the same manner as in the device 101. The device 114 is the same as the device 101 in that detection characteristics of the sense electrode 14 can be expressed by the Equation 1.

Also in the EST acting as the main element as well as an IGBT, thus, a tolerance to abnormalities can be increased by using the sense electrode 14.

A structure of the device 114 is characteristically different from that of the well-known EST according to a prior art in that the sense oxide film 10 and the sense electrode 14 are provided. In addition, the sense oxide film 10 and the sense electrode 14 have the same structures as those of the gate oxide film 9 and the gate electrode 13, respectively. In a preferred method for manufacturing the device 114, accordingly, the sense oxide film 10 is formed simultaneously at the step of forming the gate oxide film 9, and the sense electrode 14 is formed simultaneously at the step of forming the gate electrode 13 in a method for manufacturing the EST according to the prior art, which is not shown.

The device 114 can easily be manufactured without adding a new step only by changing a pattern of a shield to be used in the process for manufacturing the EST according to the prior art. In the same manner as various devices 102 to 110 using, the device 101, the device 114 can have the form in which a main element and a protecting circuit can be incorporated in the same device or further in a single chip. In addition, the same effects can be obtained.

<15. Fifteenth Embodiment>

Figure 54:
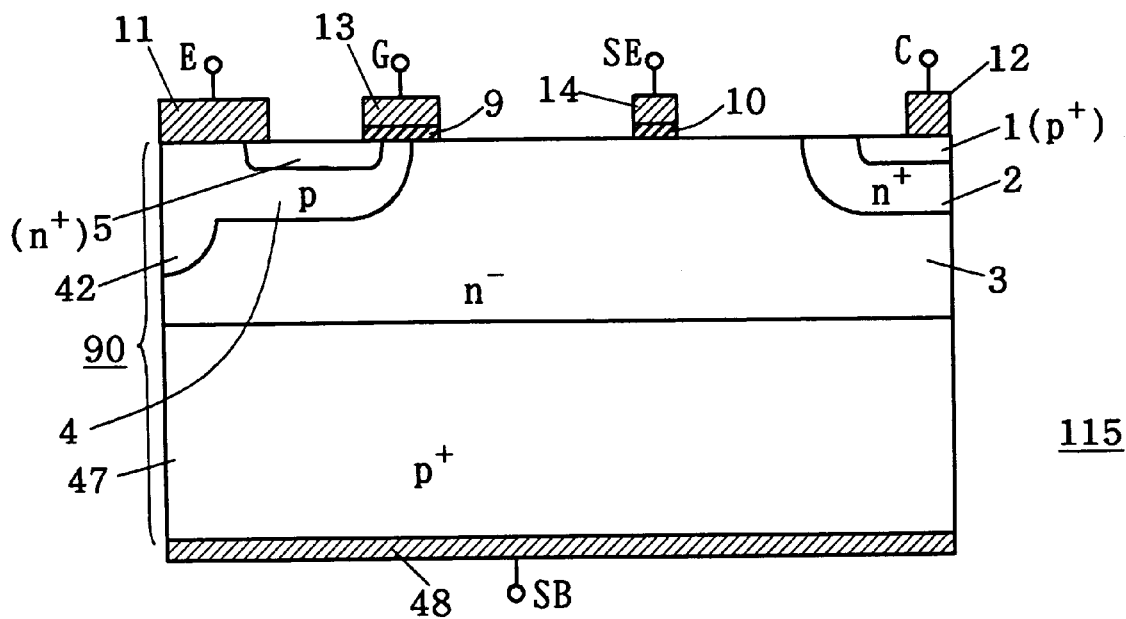
FIG. 54 is a sectional front view showing a device according to a fifteenth embodiment.

FIG. 54 is a sectional front view showing a semiconductor device according to a fifteenth embodiment. While the main element has a so-called vertical type in the devices 101 to 114, it has a so-called lateral type in a device 115. FIG. 54 shows an example in which the main element is formed as an IGBT of the lateral type. A structure of a semiconductor substrate 90 is the same as that of a semiconductor substrate of the well-known IGBT of the lateral type according to a prior art.

More specifically, a semiconductor substrate 90 provided in the device 115 comprises a $p^+$ substrate 47 which is exposed to a lower major surface and an $n^-$ layer 3 which is formed on the $p^+$ substrate 47 and is exposed to an upper major surface. In the same manner as in the device 112, a p base layer 4, a p layer 42 and an $n^+$ emitter layer 5 are selectively formed on an exposed surface of the $n^-$ layer 3. An $n^+$ buffer layer 2 is selectively formed more shallowly than the $n^-$ layer 3 on the exposed surface of the $n^-$ layer 3 apart from the p base layer 4. A $p^+$ collector layer 1 is selectively formed more shallowly than the $n^+$ buffer layer 2 within an exposed surface of the $n^+$ buffer layer 2.

While an emitter electrode 11 and a gate electrode 13 are formed in the same manner as in the device 112, a collector electrode 12 is connected with an exposed surface of a p+ collector layer 1. More specifically, both the emitter electrode 11 and the collector electrode 12 are connected with the upper major surface of the semiconductor substrate 90 in the device 115. For example, a substrate electrode 4B is connected with the lower major surface of the semiconductor substrate 90.

In the device 115, furthermore, a sense oxide film 10 is selectively formed on the exposed surface of the no layer 3 apart from the p base layer 4 and the n+ buffer layer 2. A sense electrode 14 is formed on the sense oxide film 10. In other words, the sense electrode 14 is opposed to the exposed surface of the n− layer 3 with the sense oxide film 10 interposed therebetween. Preferably, a position where the sense electrode 14 is to be provided is set to a portion of the n− layer 3 interposed between the p base layer 4 and the n+ buffer layer 2, that is, a position interposed between the emitter electrode 11 and the collector electrode 12 as shown in FIG. 54. Also in the device 115, abnormalities of the IGBT acting as the main element can be detected through an electric potential of the n layer 3 by the sense electrode 14 in the same manner as in the device 101. The device 115 is the same as the device 101 in that detection characteristics of the sense electrode 14 can be expressed by the Equation 1. Also in the IGBT of the lateral type which acts as the main element as well as the IG13T of the vertical type, a tolerance to abnormalities can be increased by using the sense electrode 14.

A structure of the device 115 is characteristically different from that of the well-known IGBT of the lateral type according to the prior art in that the sense oxide film 10 and the sense electrode 14 are provided. In addition, the sense oxide film 10 and the sense electrode 14 have the same structures as those of a gate oxide film 9 and a gate electrode 13, respectively. In a preferred method for manufacturing the device 115, accordingly, the sense oxide film 10 is formed simultaneously at the step of forming the gate oxide film 9, and the sense electrode 14 is formed simultaneously at the step of forming the gate electrode 13 in a method for manufacturing the IGBT of the lateral type according to the prior art, which is not shown.

The device 115 can easily be manufactured without adding a new step only by changing a pattern of a shield to be used in the process for manufacturing the IGBT of the lateral type according to the prior art. In the same manner as various devices 102 to 110 using the device 101, the device 115 can have the form in which a main element and a protecting circuit can be incorporated in the same device or further in a single chip. In addition, the same effects can be obtained.

<16. Sixteenth Embodiment>

Figure 55:
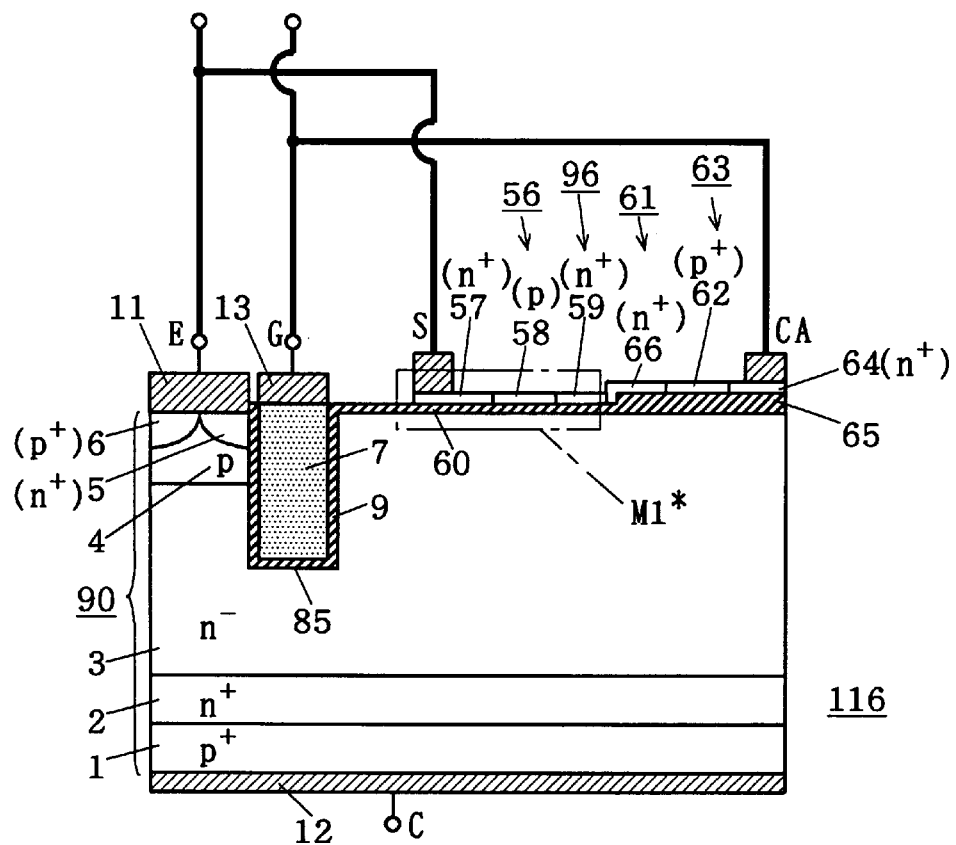
FIG. 55 is a sectional front view showing a device according to a sixteenth embodiment.

FIG. 55 is a sectional front view showing a semiconductor device according to a sixteenth embodiment. A device 116 is characterized in that the p well region 23 of the, MOSFET 21 is opposed to the exposed surface of the n− layer 3 in the device 109 (FIG. 40). More specifically, a thin film semiconductor 96 is formed on an oxide film 60 and a field oxide film 65 provided on an exposed surface of an n− layer 3.

In the same manner as in the device 109, an n+ source region 57, a p well region (a voltage sensing section) 58, an n+ drain region 59, an n+ cathode region 66, a p+ anode region 62 and an n+ cathode region 64 are sequentially formed from one end to the other end in the thin film semiconductor 96. In these semiconductor regions, the p well region 58 is opposed to the exposed surface of the n− layer 3 with the oxide film 60 acting as a gate oxide film interposed therebetween.

The n+ source region 57, the p well region 58 and the n+ drain region 59 act as components of a MOSFET 56. The n+ cathode region 66 and the p+ anode region 62 act as components of a diode 61. The p+ anode region 62 and the n+ cathode region 64 act as components of a Zener diode 63. The MOSFET 56, the diode 61 and the Zener diode 63 are connected in this order in series. In the same manner as the device 109, the device 116 can have another form in which the p+ anode region 62 is not shared by the Zener diode 63 and the diode 61.

A cathode electrode CA is connected onto the n+ cathode region 64, and a source electrode S is connected onto the n+ source region 57. The cathode electrode CA is connected with a gate electrode 13 of an IGBT through a wiring, and the source electrode S is connected with an emitter electrode 11 of the IGBT through a wiring. Accordingly, the MOSFET 56, the diode 61 and the Zener diode 63 correspond to the transistor M1, the diode DI and the Zener diode ZD of the device 102, respectively.

In the device 116, particularly, the p well region 58 of the MOSFET 56 is directly. opposed to the exposed surface of the n layer 3 with the gate oxide film 60 interposed therebetween. More specifically, neither a gate electrode of the MOSFET 56 nor the buried sense electrode 8 of the device 109 is provided in the device 116. An electric potential of the n− layer 3 is directly reflected in that of the p well region 58.

If an electric potential of a portion of the n− layer 3 which is opposed to the p well region 58 exceeds a certain limit inherent in the MOSFET 56 due to generation of abnormalities such as short-circuit abnormalities, a portion of the p well region 58 which is in contact with the oxide film 60 is inverted from an original p type to an n type. In other words, an inversion layer is formed in the p well region 58. As a result, the n+ source region 57 and the n+ drain region 59 are conducted. More specifically, the MOSFET 56 is changed from an OFF state to an ON state.

In other words, a portion itself of the exposed surface of the n− layer 3 to which the p well region 58 is opposed functions as the gate electrode of the MOSFET 56.

Accordingly, a device portion M1* obtained by adding a part of the n− layer 3 to the MOSFET 56 can be caused to correspond to the transistor M1 of the device 102 as shown in FIG. 55. A sensitivity to detect abnormalities is determined by a gate threshold voltage of the transistor M1*.

The gate threshold voltage of the transistor M1* is a gate voltage of the transistor M1* rendering the inversion layer being formed in the p well region 58. Accordingly, the sensitivity to detect abnormalities is defined depending on whether or not the inversion layer is easily formed in the p well region 58. In other words, the sensitivity to detect abnormalities is determined by an impurity concentration of the p well region 58.

Consequently, it is preferable that the concentration of the p well region 58 should be set in such a manner that the inversion layer is formed in the p well region 58 when the device 116 is on the rated condition that normalities and abnormalities are distinguished from each other. A gate voltage V (IGBT·gate) of a main element is determined by the Equation 2 in the same manner as in the device 102 and the like. As a result, a protecting circuit of the device 116 operates in the same manner as the protecting circuit of the device 102.

Furthermore, the IGBT acting as the main element and the protecting circuit are provided in the same device. Therefore, a high usefulness can be obtained in the same manner as in the device 102. In addition, the IGBT acting as the main element and the protecting circuit are incorporated in a single chip. Therefore, the device 116 is the same as the devices 105 to 110 in that a capacitance and a resistance generated parasitically can be reduced and that a decrease in a size, a reduction in a manufacturing cost and excellent protecting performance can be obtained. In particular, the portion itself of the exposed surface of the n⁻ layer 3 to which the p well region 58 is opposed functions as the gate electrode of the MOSFET 56. Therefore, a simple structure can be obtained, a manufacturing method can be simplified and the manufacturing cost can be reduced.

Figure 50:
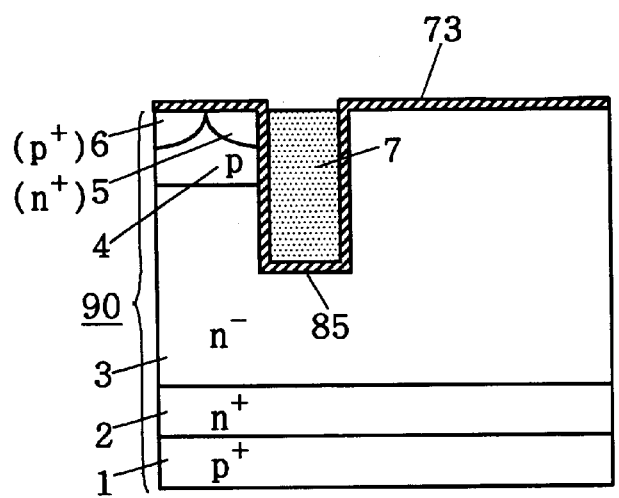
FIG. 50 is a view showing a process for manufacturing the device according to the eleventh embodiment.
Figure 56:
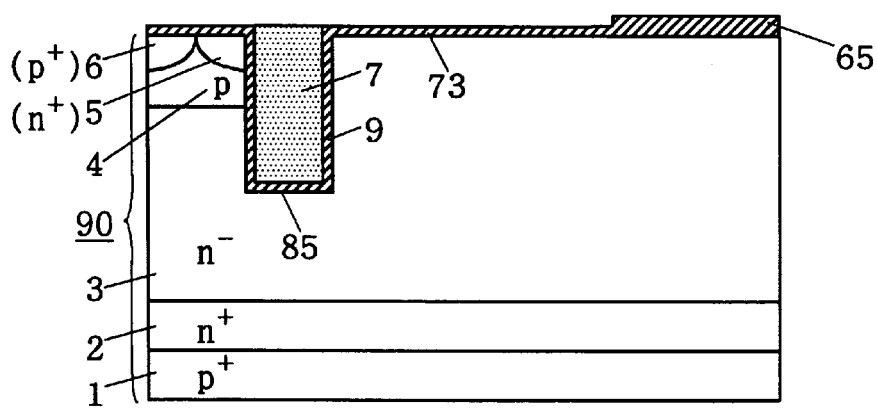
FIGS. 56 and 57 are views showing processes for manufacturing the device according to the sixteenth embodiment.
Figure 57:
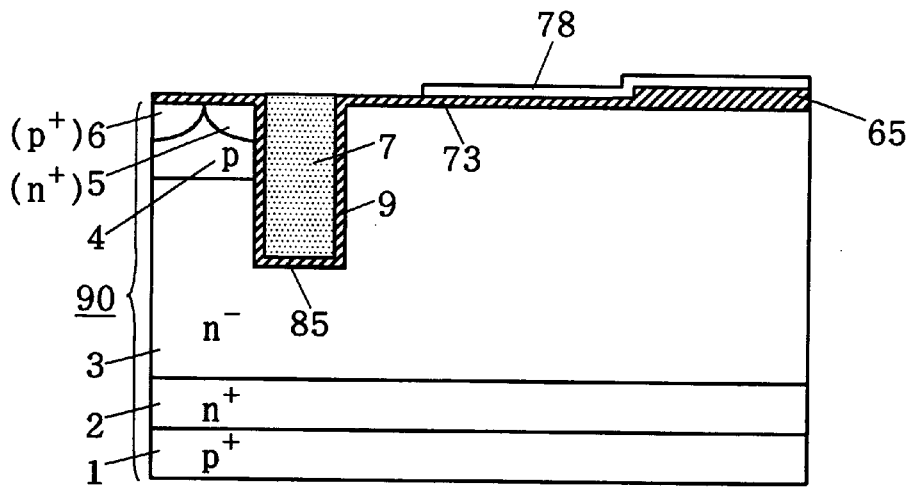

In a preferred method for manufacturing the device 116, the steps in the preferred method for manufacturing the device 111 which are to be performed till the step shown in FIG. 50 are first executed. Then, a field oxide film 65 is selectively formed on the exposed surface of the n⁻ layer 3 as shown in FIG. 56. The field oxide film 65 is formed by executing the same step as in FIG. 17. Subsequently, a non-doped thin film semiconductor 78 is formed on an oxide film 73 and the field oxide film 65 which corresponds to portions provided on the exposed surface of the n⁻ layer 3 as shown in FIG. 57. The thin film semiconductor 78 is formed through the same step as in FIG. 18.

Next, p-type and n-type impurities are selectively implanted into the thin film semiconductor 78 through the same step as in FIG. 19. Then, each electrode and a wiring for connecting the electrodes are formed as shown in FIG. 55. Consequently, the device 116 is finished. Thus, the device 116 can be manufactured by a well-known conventional wafer process without requiring especially complicated steps in the same manner as the device 101. In addition, it is not necessary to form the buried sense electrode 8 of the IGBT and the gate electrode G of the MOSFET 56. Consequently, the number of manufacturing steps and the manufacturing cost can especially be reduced effectively.

<17. Seventeenth Embodiment>

Figure 58:
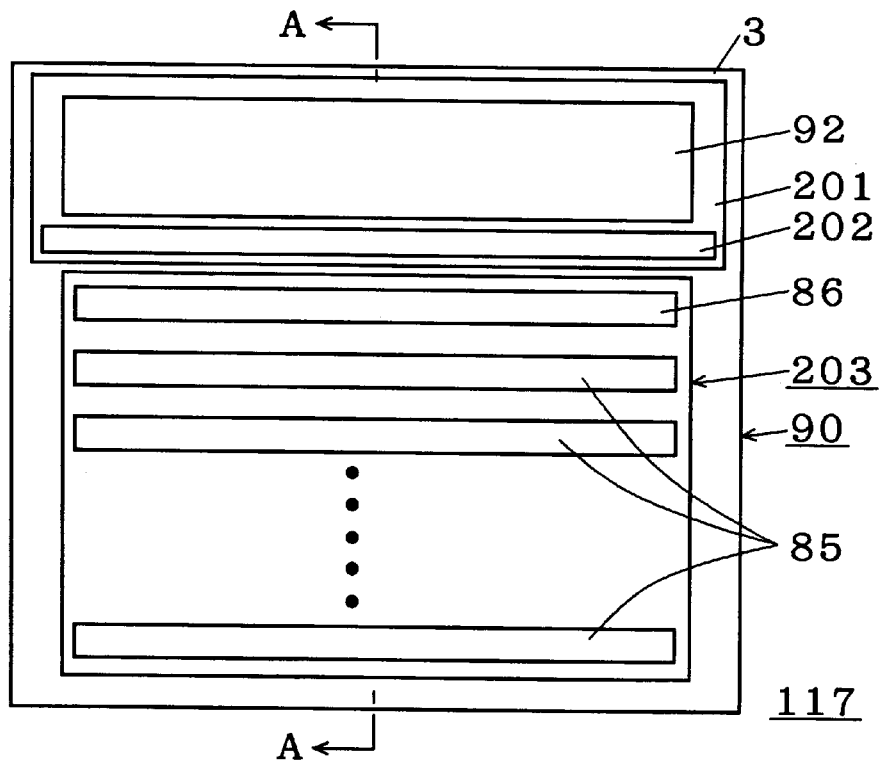
FIG. 58 is a plan view showing a device according to a seventeenth embodiment.
Figure 59:
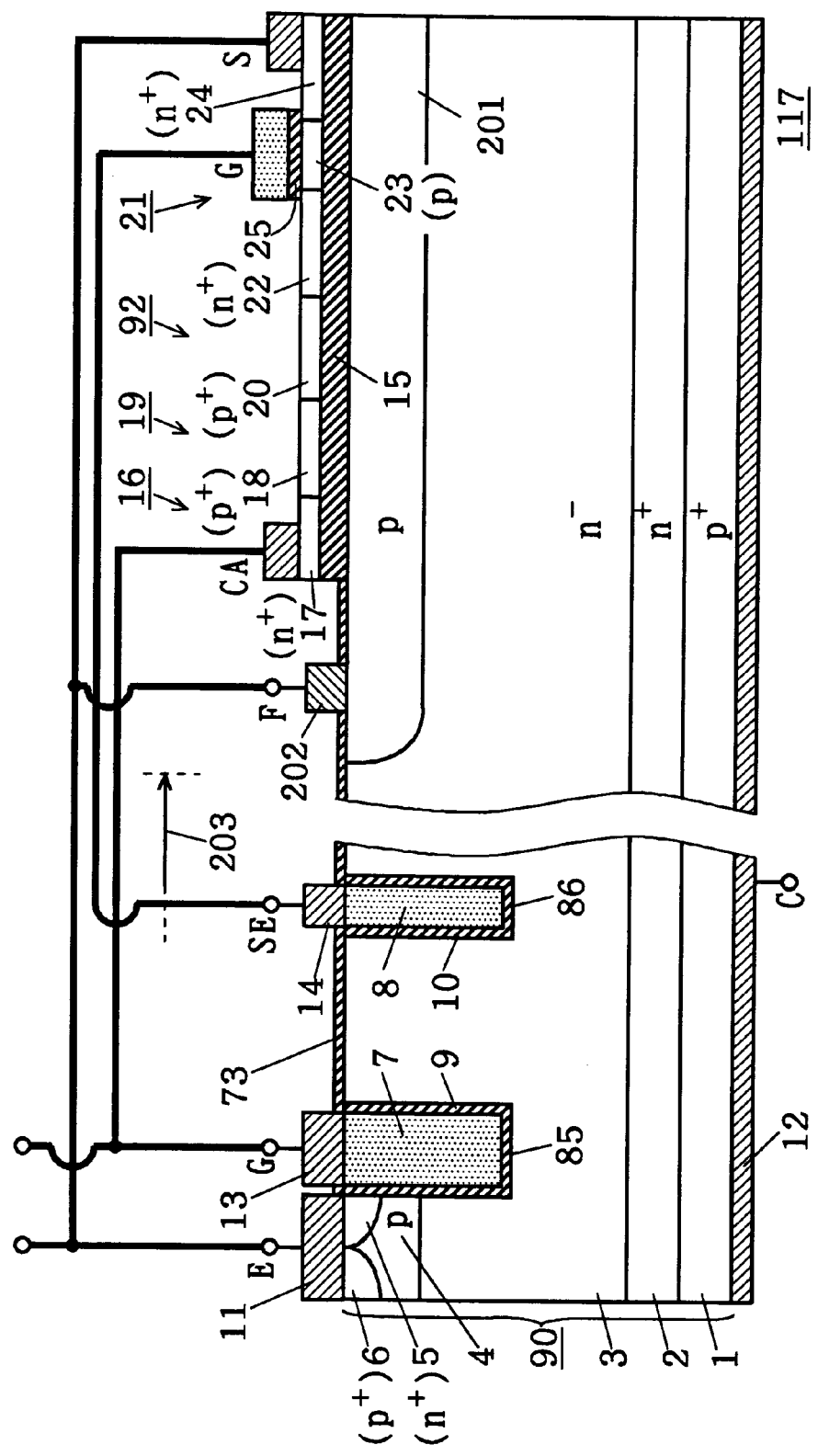
FIG. 59 is a sectional view taken along the line A—A in FIG. 58.

FIG. 58 is a plan view showing a semiconductor device according to a seventeenth embodiment, and FIG. 59 is a sectional view taken along the line A—A in FIG. 58. A device 117 is characteristically different from the device 105 according to the fifth embodiment in that a potential fixing layer 201 which is a p-type semiconductor layer is selectively formed to cover a region including a portion directly under a field oxide film 15 in an upper major surface of a semiconductor substrate 90 and a potential fixing electrode (F) 202 is in contact with an exposed surface of the potential fixing layer 201. The potential fixing electrode 202 is connected with an emitter electrode 11. Consequently, an electric potential of the potential fixing layer 201 is fixed to an electric potential of the emitter electrode 11, that is, an emitter potential.

A main element 203 formed as an IGBT repeatedly changes its state between an N state and an OFF state during operation. Consequently, an electric potential of an n⁻ layer 3 fluctuates. In the device 117, however, a thin film semiconductor 92 which is component of a protecting circuit is not directly opposed to the n layer 3 through the field oxide film 15 but the potential fixing layer 201 which is fixed to the emitter potential is provided between the thin film semiconductor 92 and the n⁻ layer 3. In other words, an effective substrate potential of the protecting circuit is kept at the emitter potential. For this reason, it is possible to suppress the influence of the fluctuation in the electric potential of the n⁻ layer 3 on the protecting circuit. More specifically, it is possible to obtain an advantage that operation of the protecting circuit is stabilized.

Furthermore, a wiring is usually provided on the field oxide film 15. The wiring is not directly opposed to the n⁻ layer 3 with the field oxide film 15 provided therebetween but the potential fixing layer 201 is provided between the wiring and the n layer 3. For this reason, there is no possibility that a fluctuation in an electric potential of the wiring might affect operation of the main element 203.

In the device 117, a large number of linear gate trenches 85 are arranged on the main element 203 in parallel with each other in the same manner as in the device 110 according to the tenth embodiment. One band-shaped cell corresponds to one of the gate trenches 85. In other words, the main element 203 includes a large number of band-shaped IGBT cells which are arranged in parallel with each other.

A buried sense electrode 8 is an element for sensing a change in an electric potential of the main element 203 to detect abnormalities of the main element 203. For this reason, it is desirable that a sense trench 86 should be formed in the main element 203. In the device 117, the sense trench 86 is formed by especially selecting a portion in the main element 203 which is adjacent to the potential fixing layer 201, that is, a vicinity of an edge of the main element 203. In other words, the sense trench 86 is formed in a portion interposed between all the gate trenches 85 in the main element 203 and the potential fixing layer 201.

In this portion, moreover, the n⁻ layer 3 is exposed on the upper major surface of the semiconductor substrate 90. More specifically, the sense trench 86 is provided to be opened on the exposed surface of the n⁻ layer 3 in the same manner as the sense trench 86 according to other embodiments. Consequently, the buried sense electrode 8 which is buried in the sense trench 86 senses the change in the electric potential of the n layer 3.

The buried sense electrode 8 is provided on an end of the main element 203 which is close to the protecting circuit. Therefore, a wiring connecting a sense electrode 14 and a gate electrode G of a MOSFET 21 with each other can be made the shortest. As a result, it is possible to reduce an induction, a capacitance, a resistance and the like which are parasitically generated on the wiring. Thus, the influence of a parasitic capacitance or the like on the operation of the protecting circuit can be suppressed more effectively.

In order to reduce a fluctuation in the electric potential of the potential fixing, layer 201, it is desirable that an impurity concentration of the potential fixing layer 201 should be set much higher than that of the n layer 3. One reason is that in order to reduce the fluctuation in the electric potential of the potential fixing layer 201, it is required that a voltage between the emitter electrode 11 and a collector electrode 12 in the OFF state of the main element 203 should substantially be imposed on the n⁻ layer 3 and the burden on the potential fixing layer 201 should be so small as to be ignored. Another reason is that a part of a main current (a collector current) is split to flow into the potential fixing layer 201, and it is necessary to reduce a drop in a voltage generated on the potential fixing layer 201 by a split current component.

For example, the impurity concentration of the potential fixing layer 201 is set equal to or higher than impurity concentrations of a p base layer 4 and a guard ring (an annular p-type semiconductor layer provided along the periphery of the semiconductor substrate 90 to increase a breakdown voltage, which is not shown) if any. When the impurity concentrations of these semiconductor layers are set equal to each other, the semiconductor layers can be formed simultaneously at the same step. In other words, it is possible to obtain an advantage that a method for manufacturing the device can be simplified.

In the device 117, furthermore, the potential fixing electrode 202 is formed on an end close to the main element 203 in the exposed surface of the potential fixing layer 201. More specifically, the potential fixing electrode 202 is provided in a portion interposed between the main element 203 and the protecting circuit in the exposed surface of the potential fixing layer 201. Thus, the potential fixing electrode 202 is connected with a portion of the potential fixing layer 201 which is the closest to the main element 203 where a fluctuation in an electric potential is caused. Therefore, the electric potential of the potential fixing layer 201 is fixed to the emitter potential more effectively.

Figure 60:
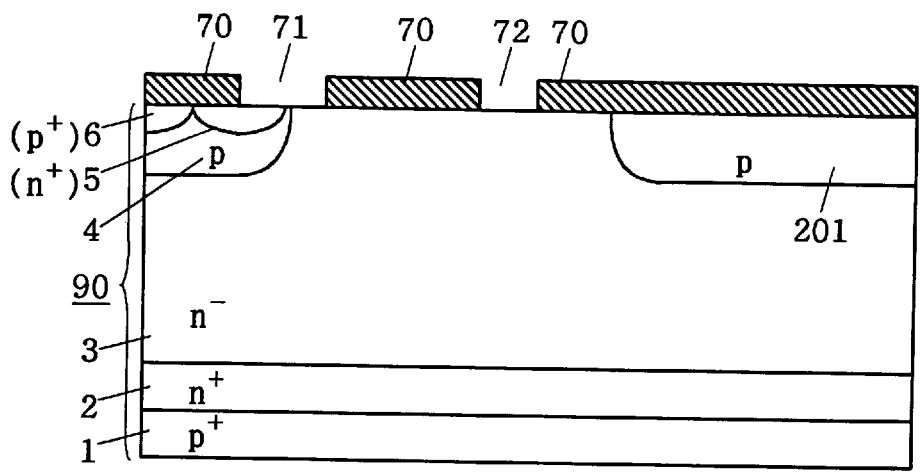
FIG. 60 is a view showing a process for manufacturing the device according to the seventeenth embodiment.
Figure 61:
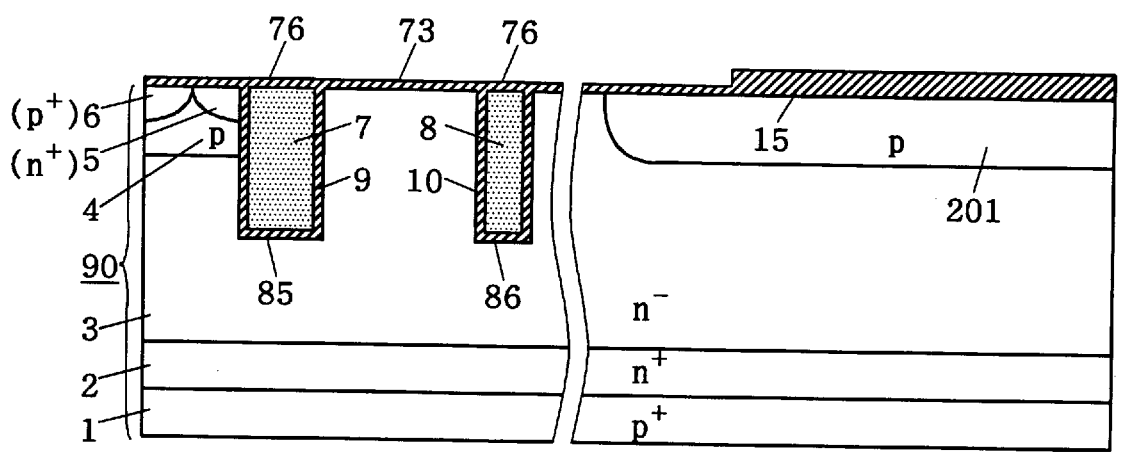
FIG. 61 is a view showing the process for manufacturing the device according to the seventeenth embodiment.

FIGS. 60 and 61 are views showing a preferred method for manufacturing the device 117. In order to manufacture the device 117, a step shown in FIG. 60 is first executed. At the step shown in FIG. 60, a semiconductor substrate 90 is first formed. A $p^+$ collector layer 1, an $n^+$ buffer layer 2 and an $n^-$ layer 3 are provided in this order from a lower major surface to an upper major surface in the semiconductor substrate 90.

Then, a p base layer 4 and a potential fixing layer 201 are selectively formed in an exposed surface of the $n^-$ layer 3 at the same time. The p base layer 4 and the potential fixing layer 201 are formed apart from each other. Next, an $n^+$ emitter layer 5 and a $p^+$ contact layer 6 are selectively formed within an exposed surface of the p base layer 4 more shallowly than the p base layer 4.

The p base layer 4, the potential fixing layer 201, the $n^+$ emitter layer 5 and the $p^+$ contact layer 6 are selectively formed by selectively implanting a p- or n-type impurity using a shield patterned by a well-known patterning technique and by then diffusing the implanted impurity.

In particular, the p base layer 4 and the potential fixing layer 201 are formed by simultaneously implanting the p-type impurity using a single shield and by then diffusing the implanted impurity. Consequently, the potential fixing layer 201 having the same impurity concentration as in the p base layer 4 is simultaneously formed through common steps. The $p^+$ contact layer 6 may be formed at subsequent steps of the manufacturing process instead of this step. When the p base layer 4 and the potential fixing layer 201 are to have different impurity concentrations, they are formed separately through different steps using different shields.

Thereafter, an oxide film mask 70 for trench etching is formed on the upper major surface of the semiconductor substrate 90. Openings 71 and 72 are selectively formed on the oxide film mask 70. Positions of the openings 71 and 72 are set corresponding to a gate trench 85 and a sense trench 86, respectively. A plurality of openings 71 are formed corresponding to a plurality of gate trenches 85. In FIG. 60, only one opening 71 which is the closest to the opening 72 is shown as a representative of the openings 71.

Subsequently, a step shown in FIG. 61 is executed after the steps shown in FIGS. 7 to 11 according to the first embodiment are performed. At the step shown in FIG. 61, a field oxide film 15 is selectively formed on a region in the upper major surface of the semiconductor substrate 90 where the potential fixing layer 201 is exposed. Alternatively, the field oxide film 15 may be formed at any of the steps shown in FIG. 60 and FIGS. 7 to 11, for example, before the gate trench 85 and the sense trench 86 are formed. In any method, the exposed surface of the potential fixing layer 201 is covered with the field oxide film 15 leaving a region necessary for connecting a potential fixing electrode 202.

After the steps shown in FIGS. 18 to 20 according to the fifth embodiment are executed, a gate electrode G is formed on a gate oxide film 25 as shown in FIG. 59. Then, the potential fixing electrode 202 is simultaneously formed on the potential fixing layer 201 in addition to a cathode electrode CA and a source electrode S of a protecting circuit at steps of forming an emitter electrode 11, a gate electrode 13 and a sense electrode 14 of an IGBT. In this process, the emitter electrode 11, the potential fixing electrode 202 and the source electrode S, the gate electrode 13 and the cathode electrode CA, and the sense electrode 14 and the gate electrode G are connected with each other by patterned wirings, respectively. Thereafter, a collector electrode 12 is formed on an exposed surface of the $p^+$ collector layer 1. Thus, the device 117 is finished.

As described above, the device 117 can be manufactured without requiring especially complicated steps by a combination of the same wafer process as in a technique for manufacturing the conventional device 151 and a well-known technique for. manufacturing a thin film transistor. A part of the manufacturing process such as the step of forming the potential fixing layer 201, the steps of forming the electrodes and the like can be shared. Consequently, a manufacturing cost can also be reduced.

In the device 117, a thin film semiconductor 92 is formed in a plane on the field oxide film 15. Therefore, the thin film semiconductor 92 has excellent crystalline properties even though it is made of polysilicon. For this reason, it is possible to obtain an advantage that characteristics of the MOSFET 21 such as a mobility of carriers and the like are excellent in the same manner as in the device 105 according to the fifth embodiment.

<18. Eighteenth Embodiment>

Figure 62:
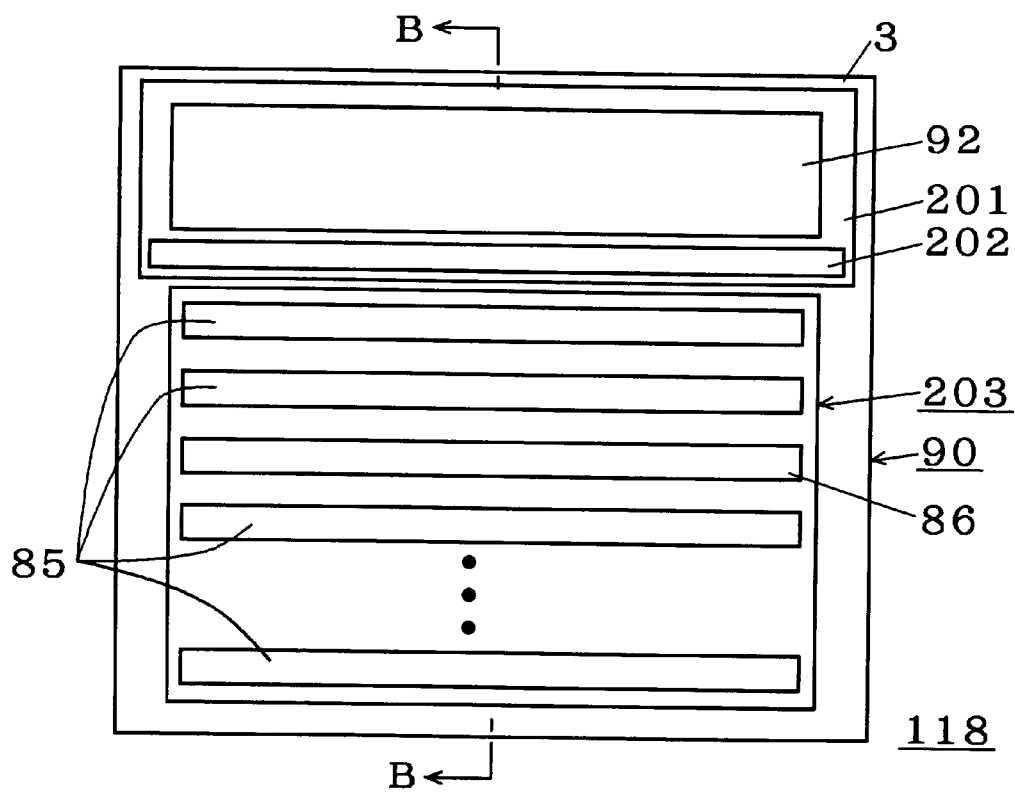
FIG. 62 is a plan view showing a device according to an eighteenth embodiment.
Figure 63:
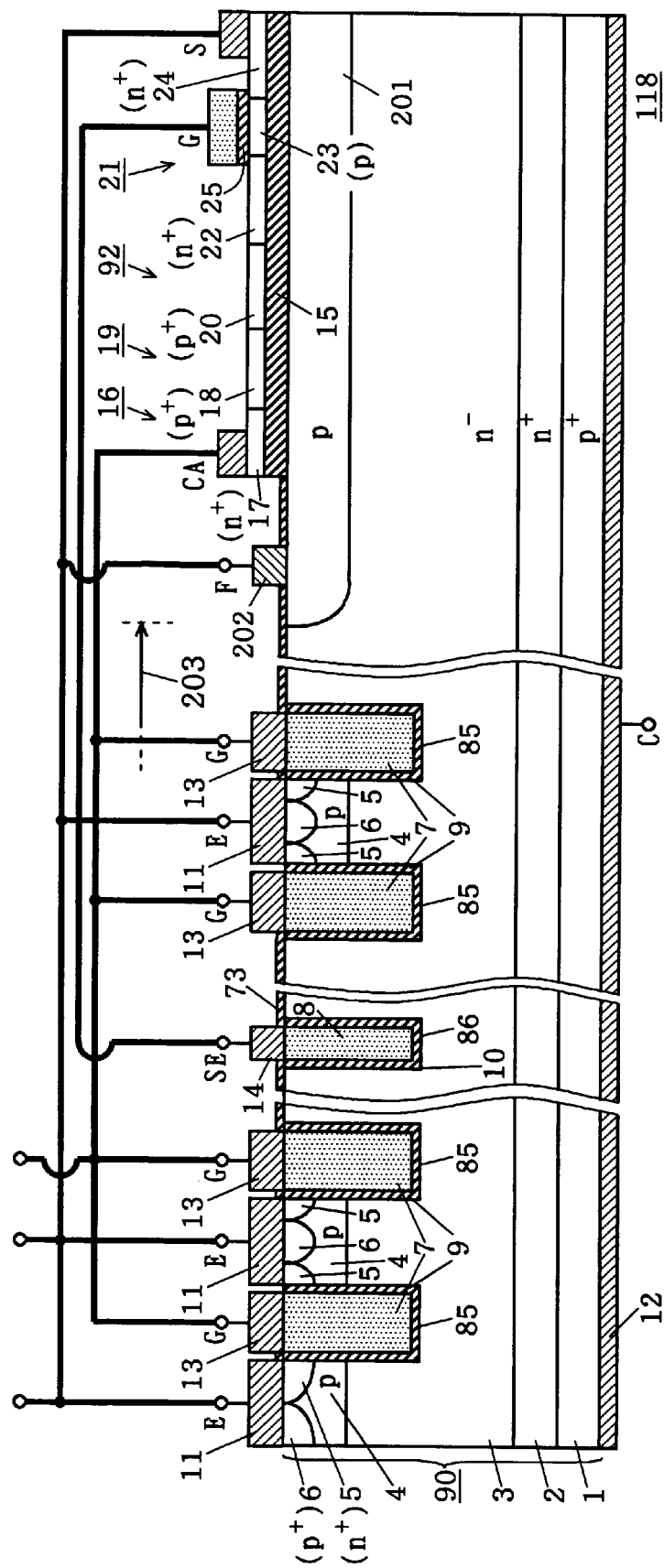
FIG. 63 is a sectional view taken along the line B—B in FIG. 62.

FIG. 62 is a plan view showing a semiconductor device according to an eighteenth embodiment, and FIG. 63 is a sectional view taken along the line B—B in FIG. 62. A device 118 is characteristically different from the device 117 according to the seventeenth embodiment in that a buried sense electrode 8 is not provided on an end of a main element 203 but on a portion between a plurality of buried gate electrodes 7.

In the device 118, a sense trench 86 is formed in a portion interposed between a plurality of gate trenches 85, that is, in a portion interposed between any two adjacent gate trenches 85. A p base layer 4 is not formed in a portion where the sense trench 86 is formed. That is, in the device 118, the sense trench 86 is provided on an exposed surface of an $n^-$ layer 3 in an upper major surface of a semiconductor substrate 90 so as not to be adjacent to a channel region CH in the same manner as in the device 117. Consequently, the buried sense electrode 8 which is buried in the sense trench 86 is, opposed to the $n^-$ layer 3 with a sense oxide film 10 interposed therebetween.

In the device 118, accordingly, the buried sense electrode 8 does not sense an electric potential of the $n^-$ layer 3 on the end of the main element 203 but on a portion interposed between the buried gate electrodes 7, that is, the inside of the main element 203. For this reason, abnormalities of the main element 203 can be detected more accurately. In other words, it is possible to obtain an advantage that precision in abnormality detection is high.

Figure 64:
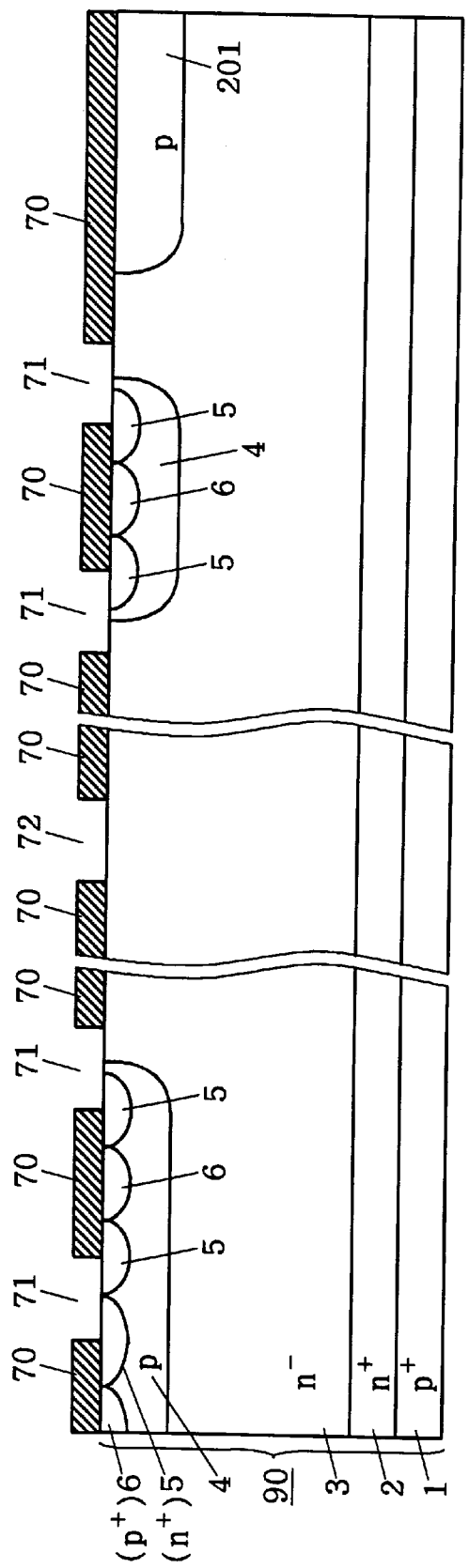
FIG. 64 is a view showing a process for manufacturing the device according to the eighteenth embodiment.
Figure 65:
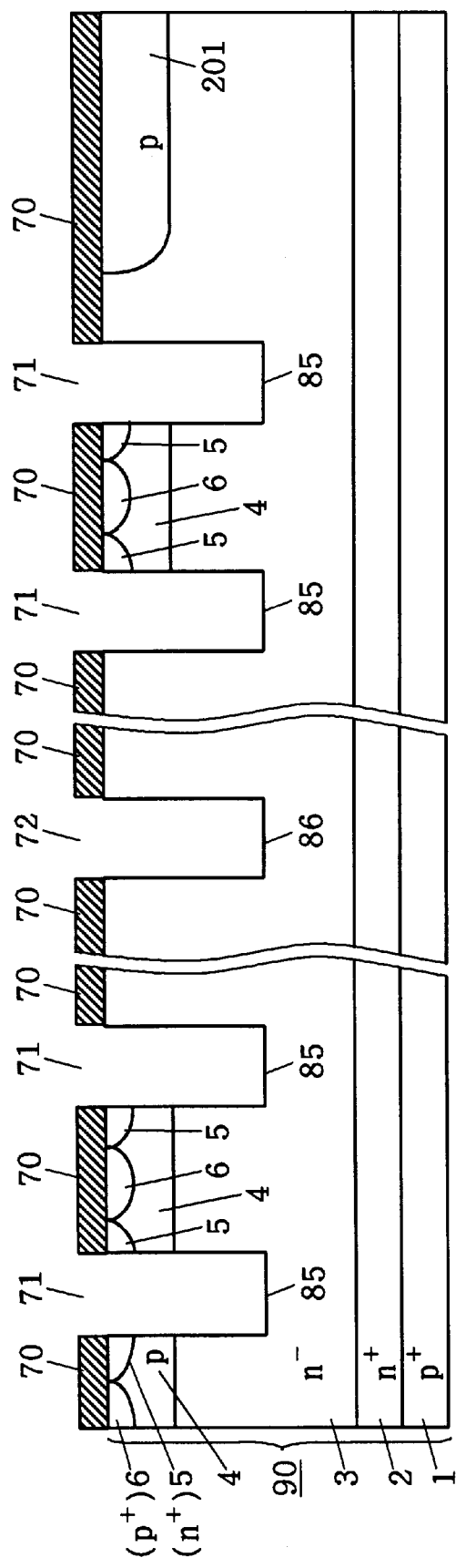
FIG. 65 is a view showing the process for manufacturing the device according to the eighteenth embodiment.

FIGS. 64 and 65 are views showing a preferred method for manufacturing the device 118. In order to manufacture the device 118, a step shown in FIG. 64 is first executed. At the step shown in FIG. 64, a semiconductor substrate 90 including a $p^+$ collector layer 1, an $n^+$ buffer layer 2 and an $n^-$ layer 3 is first formed. Then, a p base layer 4 and a potential fixing layer 201 are selectively formed in an exposed surface of the $n^-$ layer 3 at the same time.

The p base layer 4 and the potential fixing layer 201 are formed apart from each other. In addition, the p base layer 4 is formed except a portion where a sense trench 86 is to be formed. In the same manner as the step shown in FIG. 60 according to the seventeenth embodiment, the p base layer 4 and the potential fixing layer 201 are formed by simultaneously implanting a p-type impurity using a single shield and by then diffusing the implanted impurity.

Next, an $n^+$ emitter layer 5 and a $p^+$ contact layer 6 are selectively formed within an exposed surface of the p base layer 4 more shallowly than the p base layer 4. The $p^+$ contact layer 6 may be formed at subsequent steps of the manufacturing process instead of this step. When the p base layer 4 and the potential fixing layer 201 are to have different impurity concentrations, they are formed separately through different steps using different shields.

Thereafter, an oxide film mask 70 for trench etching is formed on an upper major surface of the semiconductor substrate 90. Openings 71 and 72 are selectively formed on the oxide film mask 70. Positions of the openings 71 and 72 are set corresponding to a gate trench 85 and the sense trench 86, respectively. A plurality of openings 71 are formed corresponding to a plurality of gate trenches 85. The opening 72 is interposed between two adjacent openings 71, and is formed in a portion on the upper major surface of the semiconductor substrate 90 where the $n^-$ layer 3 is exposed.

Next, anisotropic etching is executed by using the oxide film mask 70 as a shield so that the gate trench 85 and the sense trench 86 are formed as shown in FIG. 65. In this case, the gate trench 85 and the sense trench 86 are formed to have the same depth.

After the steps shown in FIGS. 8 to 11 according to the first embodiment, the step shown in FIG. 61 according to the seventeenth embodiment and the steps shown in FIGS. 18 to 20 according to the fifth embodiment are executed, various electrodes are formed as shown in FIG. 63. Since a procedure for forming each electrode and wirings connecting them is the same as the step shown in FIG. 59 according to the seventeenth embodiment, its detailed description will be omitted. The device 118 is finished through the above-mentioned steps.

As described above, the device 118 can be manufactured without requiring especially complicated steps by a combination of the same wafer process as in a technique for manufacturing the conventional device 151 and a well-known technique for manufacturing a thin film transistor. A part of the manufacturing process such as the step of forming the potential fixing layer 201, the steps of forming the electrodes and the like can be shared. Consequently, a manufacturing cost can also be reduced. Furthermore, a thin film semiconductor 92 is formed in a plane on a field oxide film 15. Therefore, it is possible to obtain an advantage that characteristics of a MOSFET 21 such as a mobility of carriers and the like are excellent in the same manner as in the device 105 according to the fifth embodiment.

<19. Nineteenth Embodiment>

Figure 66:
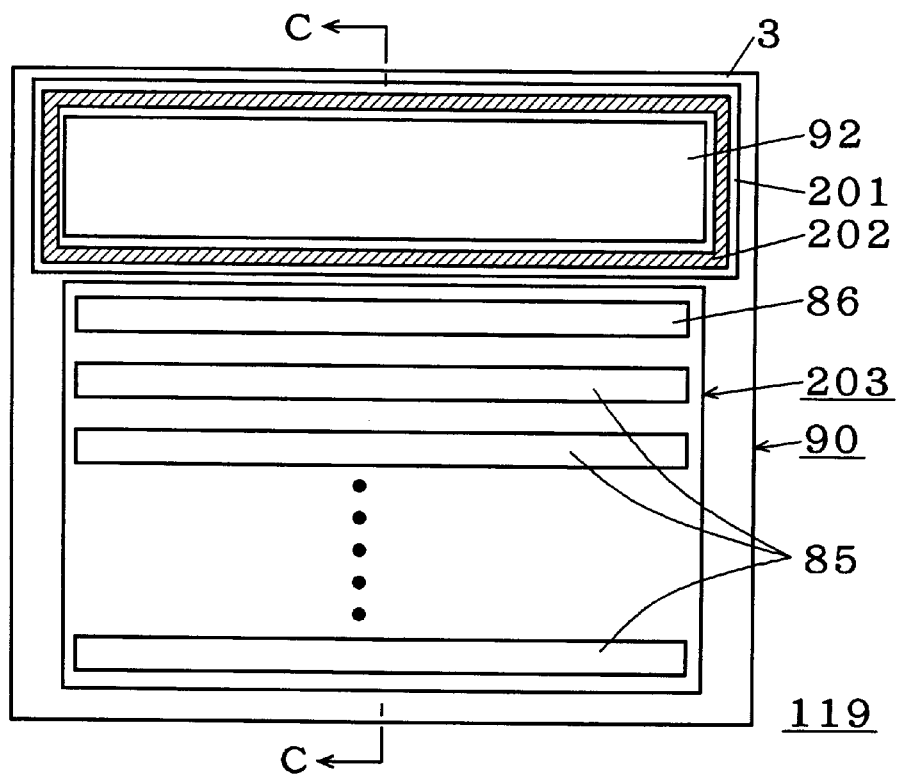
FIG. 66 is a plan view showing a device according to a nineteenth embodiment.
Figure 67:
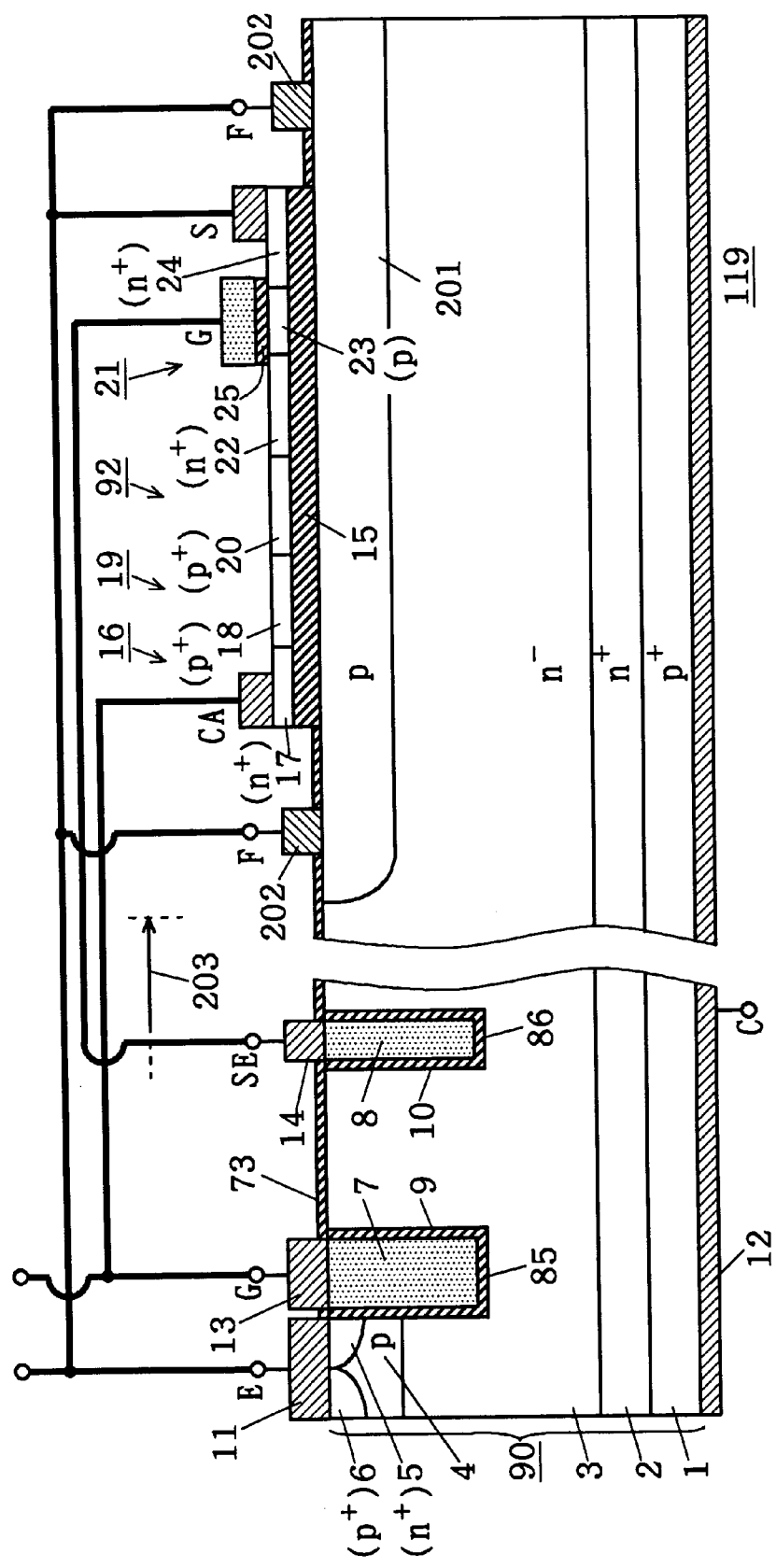
FIG. 67 is a sectional view taken along the line C—C in FIG. 66.

FIG. 66 is a plan view showing a semiconductor device according to a nineteenth embodiment, and FIG. 67 is a sectional view taken along the line C—C in FIG. 66. A device 119 is characteristically different from the device 117 according to the seventeenth embodiment in that a potential fixing electrode 202 is annularly formed on an exposed surface of a potential fixing layer 201 so as to surround a thin film semiconductor 92 which is a component of a protecting circuit. For this reason, a fluctuation in an electric potential of the potential fixing layer 201 is suppressed more effectively. As a result, it is possible to obtain an advantage that operation of the protecting circuit is further stabilized.

The device 119 can be manufactured by executing the same process as the process for manufacturing the device 117 according to the seventeenth embodiment. At a step of forming the potential fixing electrode 202 on the exposed surface of the potential fixing layer 201, the potential fixing electrode 202 is annularly formed to surround a field oxide film 15 positioned under the thin film semiconductor 92. Other manufacturing steps are the same as in the process for manufacturing, the device 117. Therefore, the same advantage as in the manufacturing method according to the seventeenth embodiment can be obtained.

<20. Twentieth Embodiment>

Figure 68:
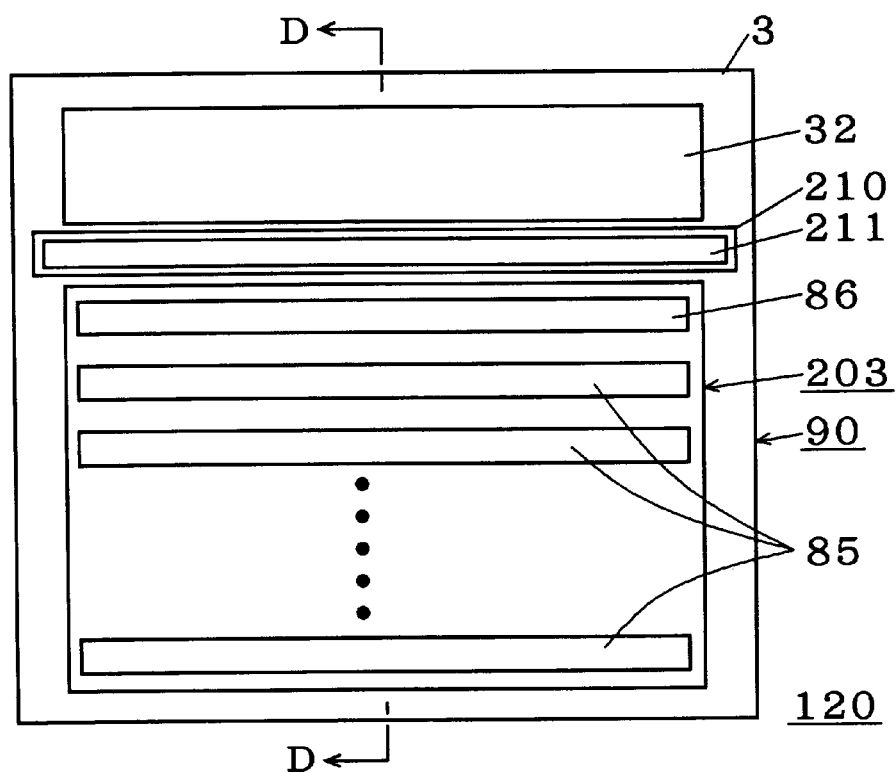
FIG. 68 is a plan view showing a device according to a twentieth embodiment.
Figure 69:
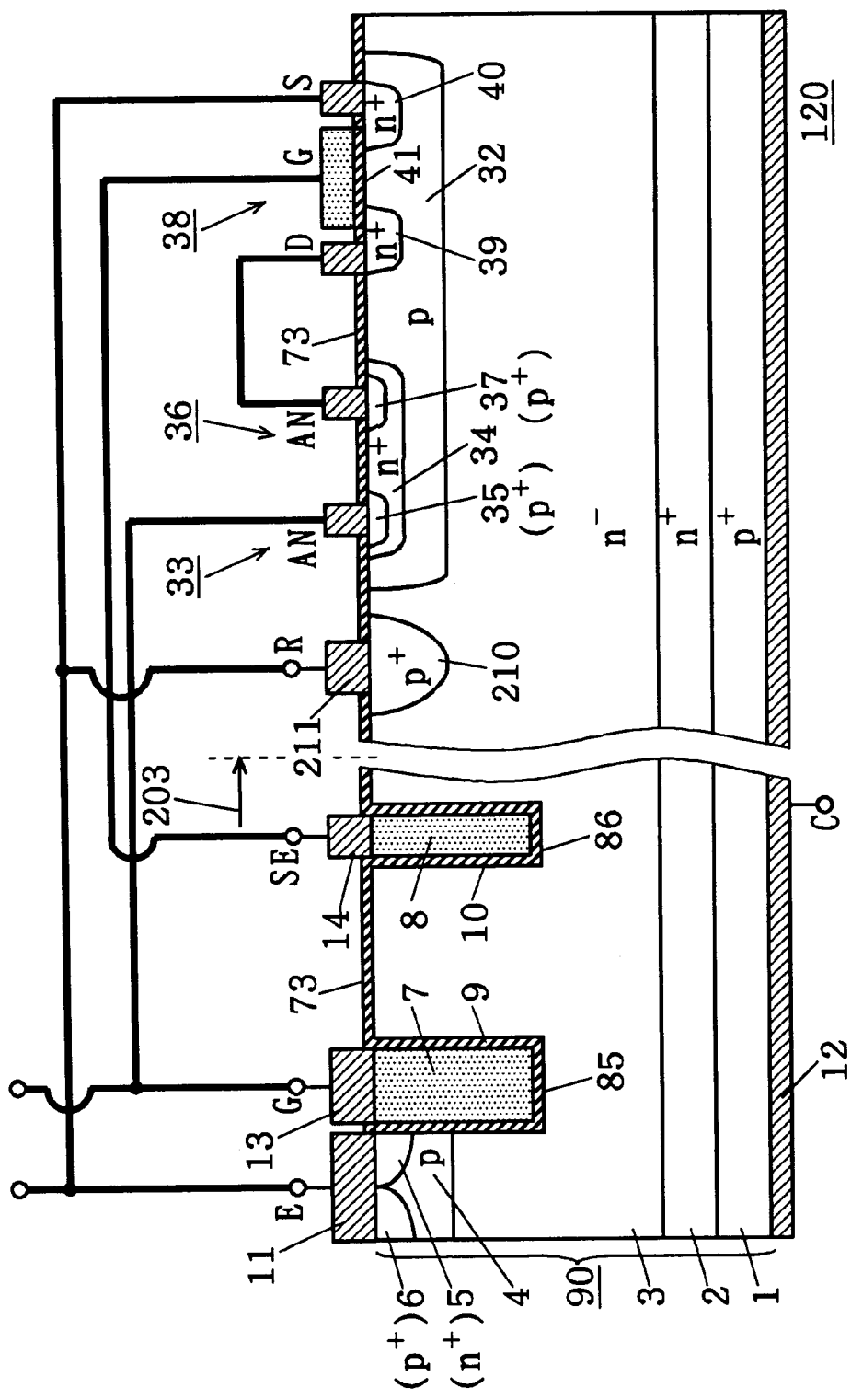
FIG. 69 is a sectional view taken along the line D—D in FIG. 68.

FIG. 68 is a plan view showing a semiconductor device according to a twentieth embodiment, and FIG. 69 is a sectional view taken along the line D—D in FIG. 68. A device 120 is characteristically different from the device 107 according to the seventh embodiment in that a carrier removing layer 210 which is a $p^+$-type semiconductor layer is selectively formed in an exposed surface of an $n^-$ layer 3 interposed between a main element 203 and a p well region 32 in an upper major surface of a semiconductor substrate 90 and a carrier removing electrode (R) 211 is in contact with an exposed surface of the carrier removing layer 210. The carrier removing electrode 211 is connected with an emitter electrode 11. The carrier removing layer 210 is formed separately from both the p well region 32 and a p base layer 4.

When the main element 203 formed as an IGBT operates, a main current (a collector current) flows from a collector electrode 12 to the emitter electrode 11. There is a possibility that operation of a protecting circuit might be affected if a part of the main current flows into the p well region 32. In the device 120, however, the carrier removing layer 210 connected with the emitter electrode 11 through the carrier removing electrode 211 and a wiring is provided between the main element 203 and the p well region 32. Therefore, a part of the main current flows into the carrier removing layer 210 more preferentially than the p well region 32 which is a component of the protecting circuit.

More specifically, a hole acting as a major part of a carrier carrying the main current is preferentially removed (extracted) into the carrier removing layer 210. Therefore, a component of the main current to essentially flow into the p well region 32 is preferentially absorbed into the carrier removing layer 210. The component of the main current flowing into the carrier removing layer 210 is retrieved into the outside through the carrier removing electrode 211 and the emitter electrode 11.

In the device 120, thus, the carrier removing layer 210 connected with the emitter electrode 11 is provided. Therefore, it is possible to suppress a phenomenon in which a part of the main current flows into the protecting circuit. Consequently, the influence of the main current on the protecting circuit is suppressed so that the operation of the protecting circuit can be stabilized.

Another carrier removing electrode 211 may come in contact with an exposed surface of the p well region 32 (in particular, a portion of the exposed surface which is the closest to the carrier removing layer 210) in the same manner as the potential fixing electrode 202 provided on the potential fixing layer 201 (FIG. 59). The carrier removing electrode 211 is also connected with the emitter electrode 11. Consequently, the component of the main current flowing into the p well region 32 can effectively be removed into the emitter electrode 11. As a result, the stability of the operation of the protecting circuit can be enhanced still more.

Figure 70:
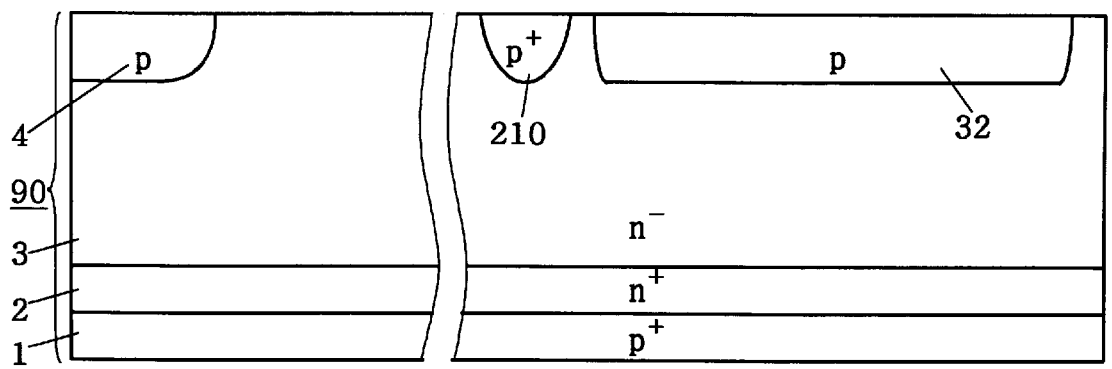
FIG. 70 is a view showing a process for manufacturing the device according to the twentieth embodiment.

FIG. 70 is a view showing a preferred method for manufacturing the device 120. In order to manufacture the device 120, the step shown in FIG. 70 may be executed after the steps shown in FIGS. 29 and 30 are executed in the manufacturing method according to the seventh embodiment, for example. At the step shown in FIG. 70, a carrier removing layer 210 is selectively formed in an exposed surface of an n layer 3 interposed between a p base layer 4 and a p well region 32.

The carrier removing layer 210 is formed to be isolated from both the p base layer 4 and the p well region 32. The carrier removing layer 210 is formed by selectively implanting a p-type impurity into the exposed surface of the n⁻ layer 3 through a patterned shield and by then performing heat treatment to diffuse the implanted impurity in the same manner as the p well region 32 and the p base layer 4.

The p base layer 4, the p well region 32 and the carrier removing layer 210 may be formed in any order. If an impurity concentration of the carrier removing layer 210 is set in common with the p well region 32 and the p base layer 4, the p base layer 4, the p well region 32 and the carrier removing layer 210 may be formed simultaneously at the same step. When they are formed at the same time, the number of steps and a manufacturing cost can be reduced.

Next, the steps shown in FIGS. 31 to 37 are executed in the same manner as in the manufacturing method according to the seventh embodiment. Then, a gate electrode G is selectively formed on a gate oxide film 41 as shown in FIG. 69. Subsequently, a carrier removing electrode 211 is simultaneously formed in addition to an anode electrode AN, a drain electrode D and a source electrode S of a protecting circuit at steps of forming an emitter electrode 11, a gate electrode 13 and a sense electrode 14 of an IGBT.

In this process, the emitter electrode 11, the carrier removing electrode 211 and the source electrode S, the gate electrode 13 and the anode electrode AN of a diode 33, the sense electrode 14 and the gate electrode G, and the anode electrode AN of a Zener diode 36 and the drain electrode D are connected with each other by patterned wirings, respectively. Thereafter, a collector electrode 12 is formed on an exposed surface of a p⁺ collector layer 1. Thus, the device 120 is finished.

As described above, the device 120 can be manufactured without requiring especially complicated steps in a well-known wafer process in the same manner as the device 101. In addition, most of the manufacturing steps can be shared between the main element and the protecting circuit. Consequently, the number of manufacturing steps and the manufacturing cost can be reduced.

<21. Twenty-first Embodiment>

Figure 71:
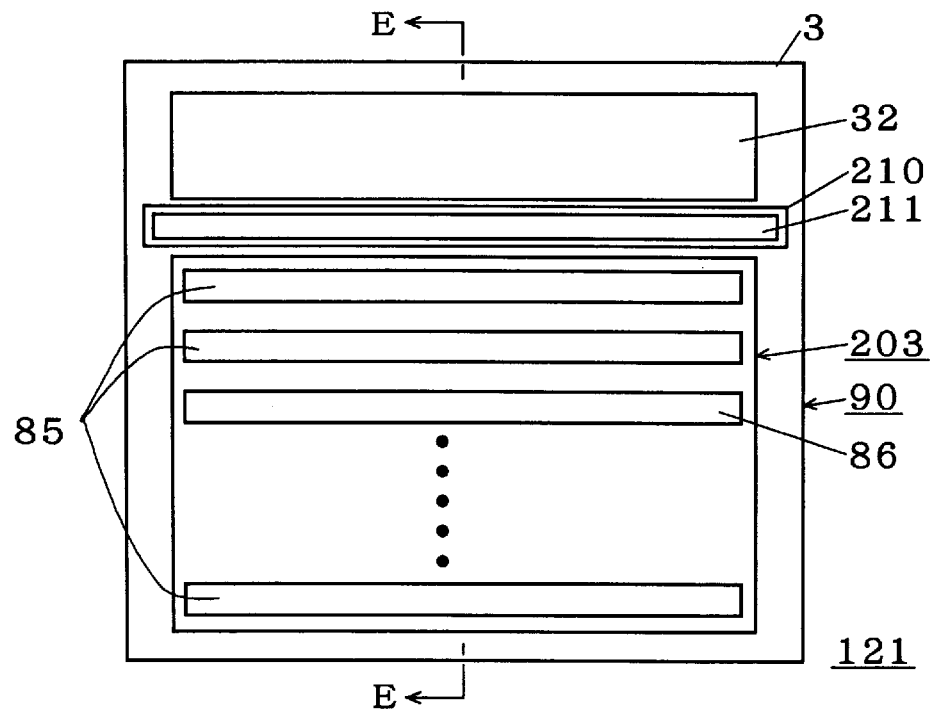
FIG. 71 is a plan view showing a device according to a twenty-first embodiment.
Figure 72:
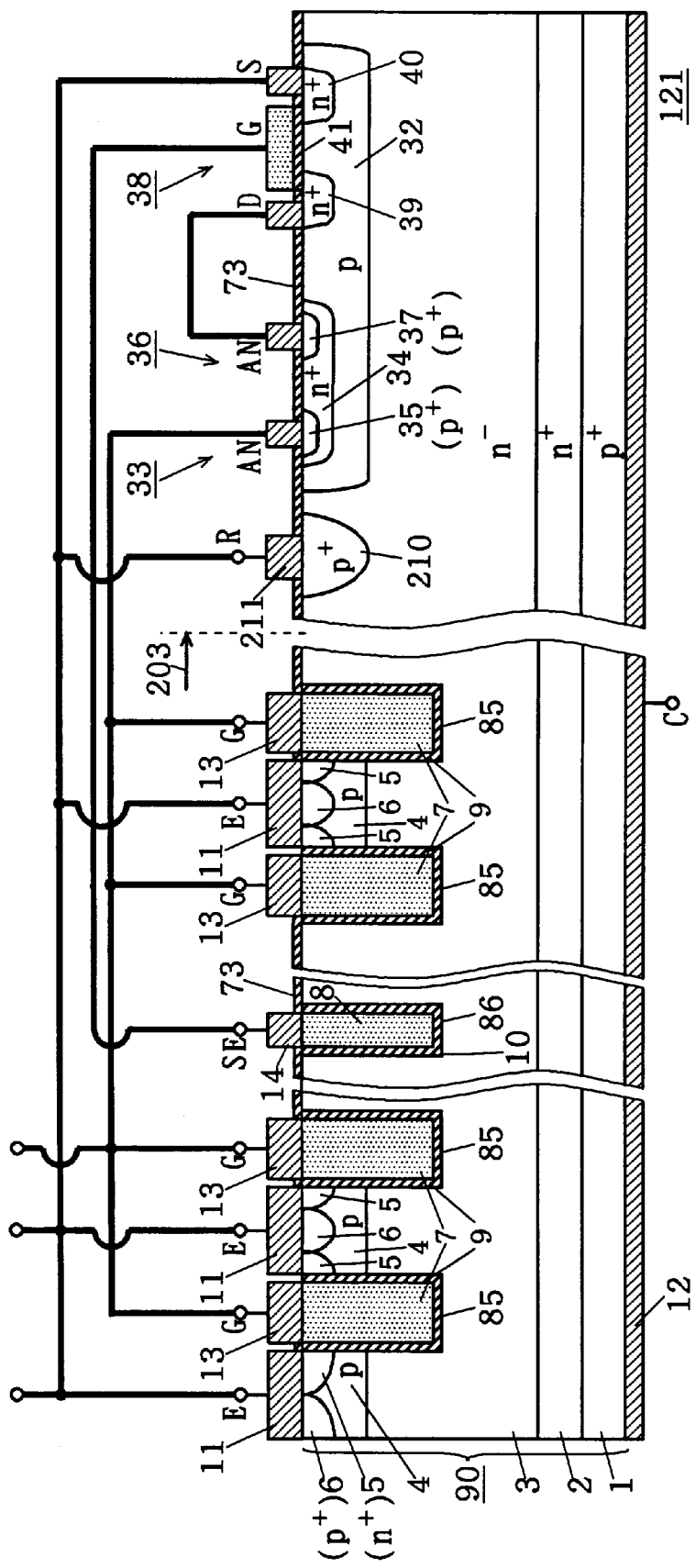
FIG. 72 is a sectional view taken along the line E—E in FIG. 71.

FIG. 71 is a plan view showing a semiconductor device according to a twenty-first embodiment, and FIG. 72 is a sectional view taken along the line E—E in FIG. 71. A device 121 is characteristically different from the device 120 according to the twentieth embodiment in that a buried sense electrode 8 is not provided on an end of a main element 203 but on a portion between a plurality of buried gate electrodes 7. Accordingly, abnormalities of the main element 203 can be detected more accurately in the same manner as in the device 118 according to the eighteenth embodiment. In other words, it is possible to obtain an advantage that precision in abnormality detection is high.

The device 121 can easily be manufactured by executing the method for manufacturing the device 118 and the method for manufacturing the device 120 in combination. Accordingly, since the method for manufacturing the device 121 is obvious from the methods for manufacturing the devices 118 and 120 which have been described above, its detailed description will be omitted.

<22. Twenty-second Embodiment>

Figure 73:
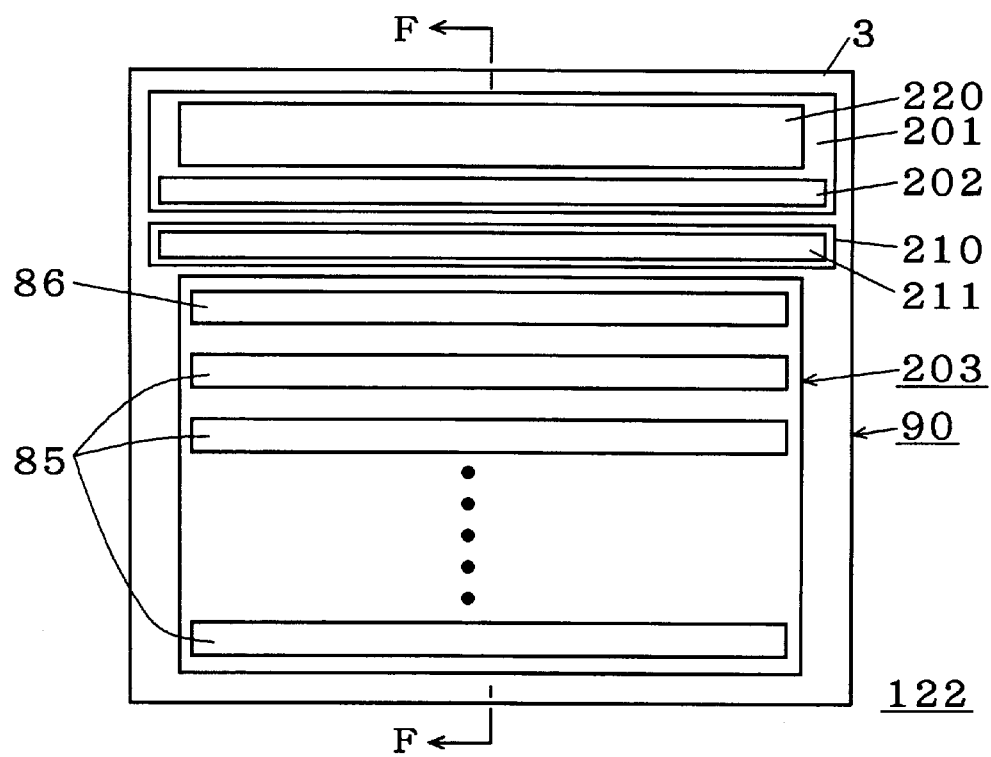
FIG. 73 is a plan view showing a device according to a twenty-second embodiment.
Figure 74:
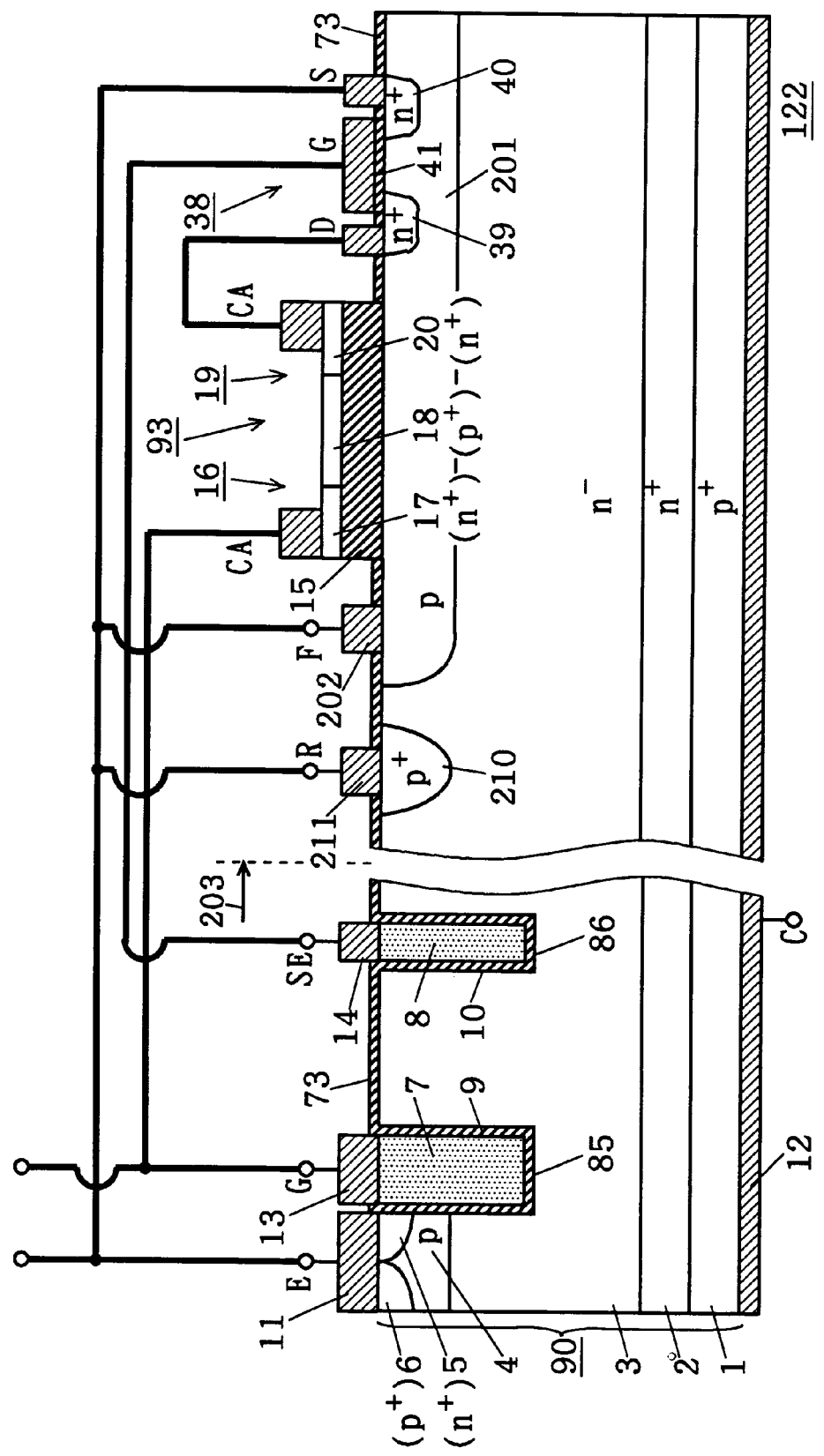
FIG. 74 is a sectional view taken along the line F—F in FIG. 73.

FIG. 73 is a plan view showing a semiconductor device according to a twenty-second embodiment, and FIG. 74 is a sectional view taken along the line F—F in FIG. 73. A device 122 is characteristically different from the device 108 according to the eighth embodiment in that a potential fixing layer 201 which is a p-type semiconductor layer is selectively formed to cover a region including a portion directly under a field oxide film 15 in an upper major surface of a semiconductor substrate 90 and a potential fixing electrode (F) 202 is connected with an exposed surface of the potential fixing layer 201 and that a carrier removing layer 210 which is a p⁺-type semiconductor layer is selectively formed on an exposed surface of an n⁻ layer 3 interposed between a main element 203 and the potential fixing layer 201 in the upper major surface of the semiconductor substrate 90 and a carrier removing electrode (R) 211 is connected with an exposed surface of the carrier removing layer 210. The p well region 32 (FIG. 38) in the device 108 according to the eighth embodiment is integrated with the potential fixing layer 201 to be a part thereof in the device 122.

In the device 122, the potential fixing layer 201 fixed to an emitter potential is provided between a thin film semiconductor 93 and the n⁻ layer 3 in the same manner as in the device 117 according to the seventeenth embodiment. Consequently, it is possible to suppress the influence of a fluctuation in an electric potential of the n⁻ layer 3 on a portion having the thin film semiconductor 93 as a component, that is, a portion formed on the field oxide film 15 in a protecting circuit. In other words, it is possible to obtain an advantage that operation of the portion formed on the field oxide film 15 in the protecting circuit is stabilized.

The carrier removing layer 210 connected with an emitter electrode 11 is provided in the same manner as in the device 120 according to the twentieth embodiment. Therefore, it is possible to suppress a phenomenon in which a part of a main current flows into a MOSFET 38 acting as another portion of the protecting circuit. For this reason, the influence of the main current on the same portion is suppressed so that the operation can be stabilized. Accordingly, operation of both the portion formed on the field oxide film 15 and the portion formed in the semiconductor substrate 90, that is, the whole protecting circuit can be stabilized.

In the same manner as in the device 117, the potential fixing. electrode 202 is provided on a portion in the exposed surface of the potential fixing layer 201 which is interposed between the main element 203 and the protecting circuit. Therefore, stability of a circuit portion formed on the field oxide film 15 can be enhanced more effectively.

In the device 122, furthermore, the portion (hereinafter referred to as a "first section") which is formed on the field oxide film 15 in the protecting circuit occupies a position closer to the main element 203 than the portion (hereinafter referred to as a "second section") which is formed in the semiconductor substrate 90. The main current mainly flows in the main element 203, and a density thereof is reduced if a position is more distant from the main element 203. The second section which is more affected when the main current enters the potential fixing layer 201 is provided in a portion which is more distant from the main element 203 than the first section. Therefore, the stability of the whole protecting circuit can be enhanced more effectively without increasing an area of the semiconductor substrate 90.

In the device 122, a buried sense electrode 8 is provided on an end of the main element 203, i.e. in the vicinity of the protecting circuit in the same manner as in the device 117 according to the seventeenth embodiment. Therefore, a wiring connecting a sense electrode 14 and a gate electrode G of the MOSFET 38 with each other can be made the shortest. As a result, an induction, a capacitance, a resistance and the like which are parasitically generated on the wiring can be reduced. Consequently, the influence of a parasitic capacitance and the like on operation of the second section of the protecting circuit can be suppressed more effectively.

In order to manufacture the device 122, first of all, it is preferable that the p well region 32 should be replaced by the potential fixing layer 201 at the step shown in FIG. 70. More specifically, a p base layer 4, a carrier removing layer 210 and a potential fixing layer 201 are selectively formed apart from each other in an upper major surface of a semiconductor substrate 90 having a $p^+$ collector layer 1, an $n^+$ buffer layer 2 and an $n^-$ layer 3. These layers may be formed simultaneously at the same step, and may be formed individually through separate steps.

Then, the same steps as in FIGS. 31 to 36 according to the seventh embodiment are executed. The p well region 32 is replaced by the potential fixing layer 201, and the $p^+$ anode region 35, the $n^+$ cathode region 34 and the $p^+$ anode region 37 are not formed. Subsequently, the same steps as in FIGS. 17 and 18 according to the fifth embodiment are executed. Thereafter, an oxide film 73 is subjected to patterning in the same manner as in FIG. 37 so that the same structure as in FIG. 39 can be obtained. The field oxide film 15 is formed on the potential fixing layer 201.

Next, the same step as in FIG. 19 is executed. As shown in FIG. 74, consequently, an $n^+$ cathode region 17, a $p^+$ anode region 18 and an $n^+$ cathode region 20 are selectively formed in a thin film semiconductor provided on the field oxide film 15. Then, a gate electrode G is formed on a gate oxide film 41. Subsequently, a potential fixing electrode 202 and a carrier removing electrode 211 are simultaneously formed in addition to a cathode electrode CA, a drain electrode D and a source electrode S of the protecting circuit at steps of forming an emitter electrode 11, a gate electrode 13 and a sense electrode 14 of an IGBT.

In this process, the emitter electrode 11, the carrier removing electrode 211, the potential fixing electrode 202 and the source electrode S, the gate electrode 13 and the cathode electrode CA of a Zener diode 16, the sense electrode 14 and the gate electrode G, and the cathode electrode CA of a diode 19 and the drain electrode D of the MOSFET 38 are connected with each other by patterned wirings, respectively. Thereafter, a collector electrode 12 is formed on an exposed surface of the $p^+$ collector layer 1. Thus, the device 122 is finished.

As described above, the device 122 can be manufactured without requiring especially complicated steps in a well-known wafer process in the same manner as the device 101. In addition, most of the manufacturing steps can be shared between the main element and the protecting circuit. Consequently, the number of manufacturing steps and a manufacturing cost can be reduced.

<23. Twenty-third Embodiment>

Figure 75:
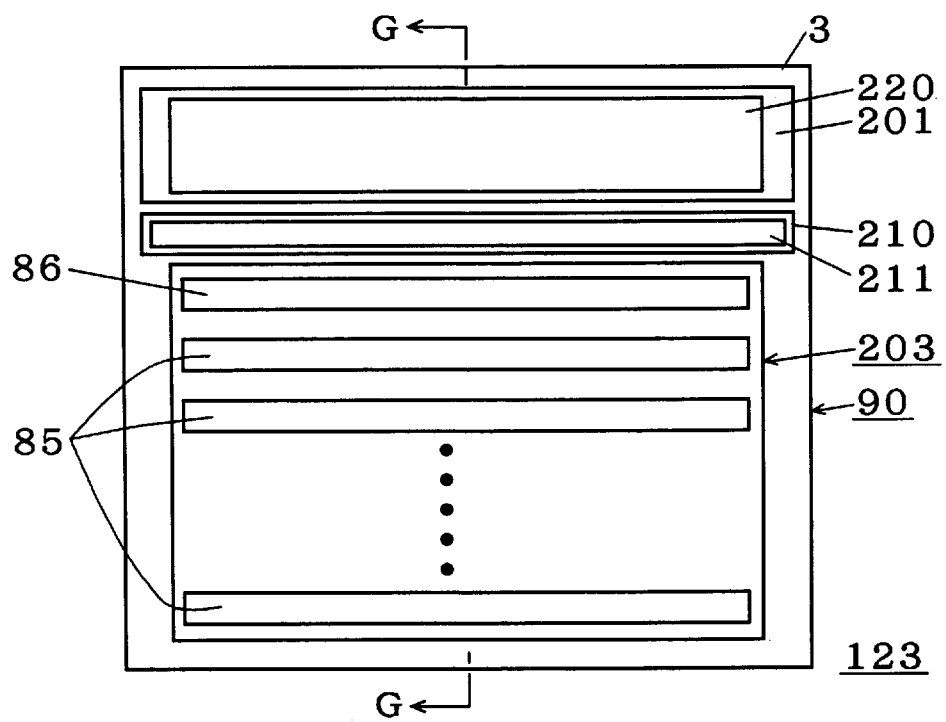
FIG. 75 is a plan view showing a device according to a twenty-third embodiment.
Figure 76:
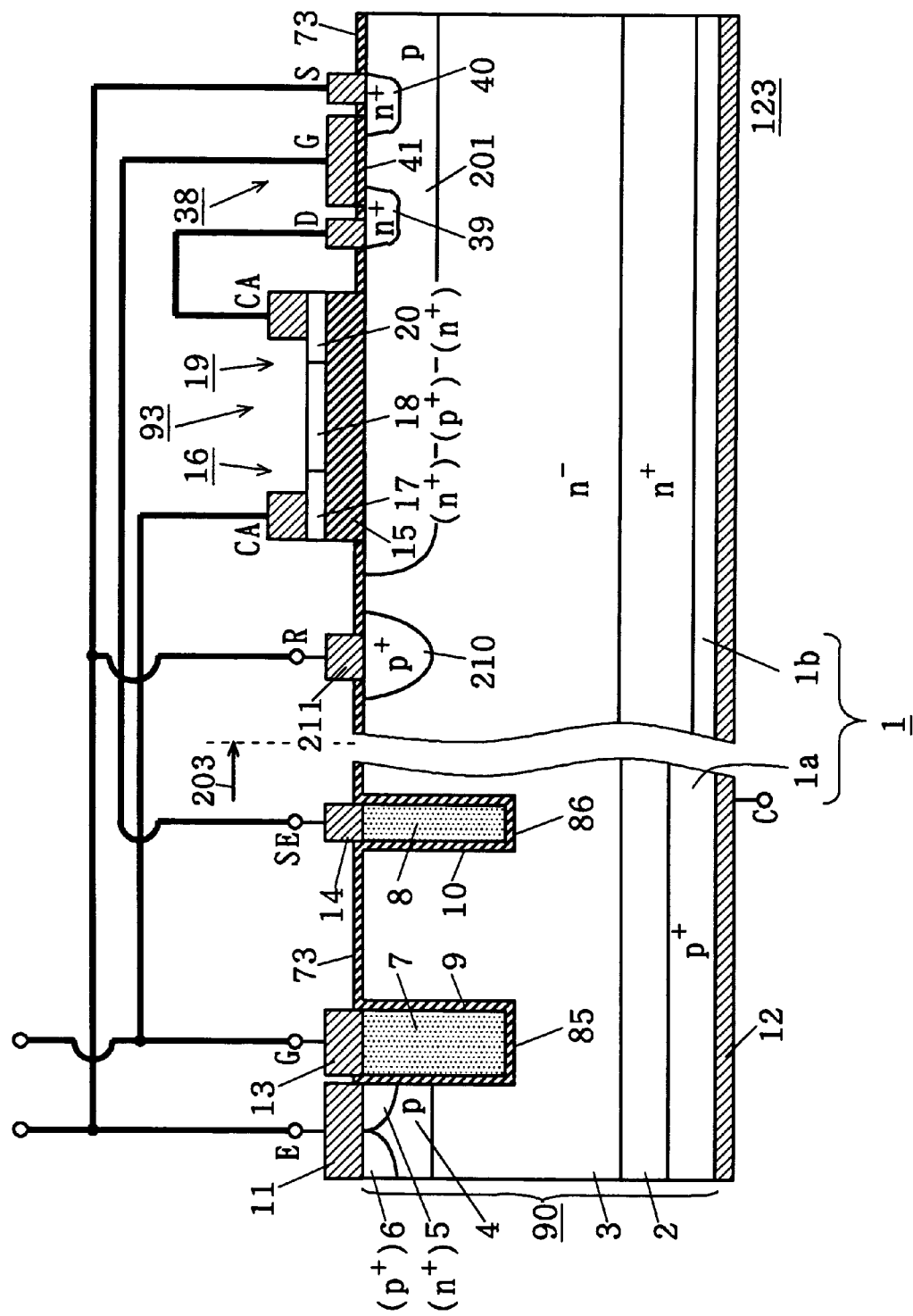
FIG. 76 is a sectional view taken along the line G—G in FIG. 75.

FIG. 75 is a plan view showing a semiconductor device according to a twentythird embodiment, and FIG. 76 is a sectional view taken along the line G—G in FIG. 75. A device 123 is characteristically different from the device 122 according to the twenty-second embodiment in that a thickness of a $p^+$ collector layer 1 is varied between a $p^+$ collector layer 1a which belongs to a main element 203 and is a portion (a first section) including regions directly under an emitter electrode 11 and a gate electrode 13 and a $p^+$ collector layer 1b which is a portion (a second section) including a region directly under a protecting circuit.

The $p^+$ collector layer 1b is formed more thinly than the $p^+$ collector layer 1a. For this reason, a quantity of holes supplied from the $p^+$ collector layer 1b becomes smaller than that of holes supplied from the $p^+$ collector layer 1a. Accordingly, a component of a main current flowing toward the protecting circuit is reduced still more so that the influence of the main current on the protecting circuit can be suppressed more effectively. Consequently, the potential fixing electrode 202 (FIG. 74) is not connected with an exposed surface of a potential fixing layer 201 in the device 123. The potential fixing electrode 202, however, may be provided in the same manner as in the device 122 such that stability of the protecting circuit is enhanced still more.

Between the two $p^+$ collector layers 1a and 1b, an impurity concentration may be varied instead of the thickness or both the thickness and the impurity concentration may be varied. It is preferable that the impurity concentration should be set high in the $p^+$ collector layer 1a and low in the $p^+$ collector layer 1b. If the impurity concentration is thus varied, the component of the main current flowing toward the protecting circuit is reduced in the same manner as in a case where the thickness is varied.

It is desirable that the $p^+$ collector layer 1a of the main element 203 should be provided under a buried sense electrode 8 as shown in FIG. 76. In this case, action of an $n^-$ layer 3 in the vicinity of the buried sense electrode 8 can be set equivalent to that of the main element 203. More specifically, the action of the main element 203 can be sensed with higher precision by the buried sense electrode 8.

Figure 77:
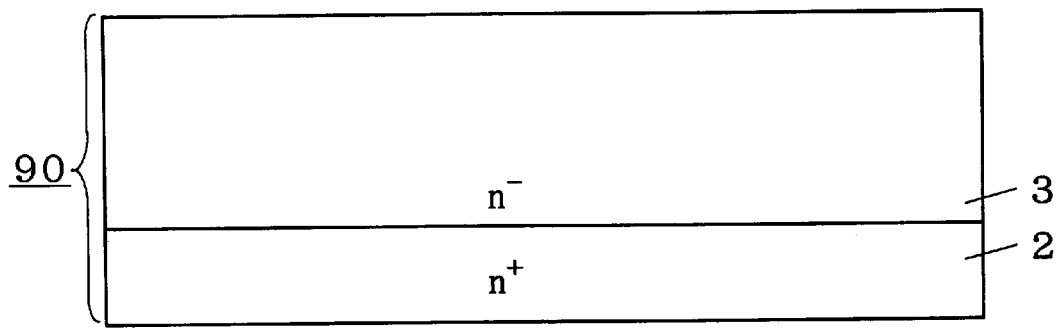
FIG. 77 is a view showing a process for manufacturing the device according to the twenty-third embodiment.
Figure 78:
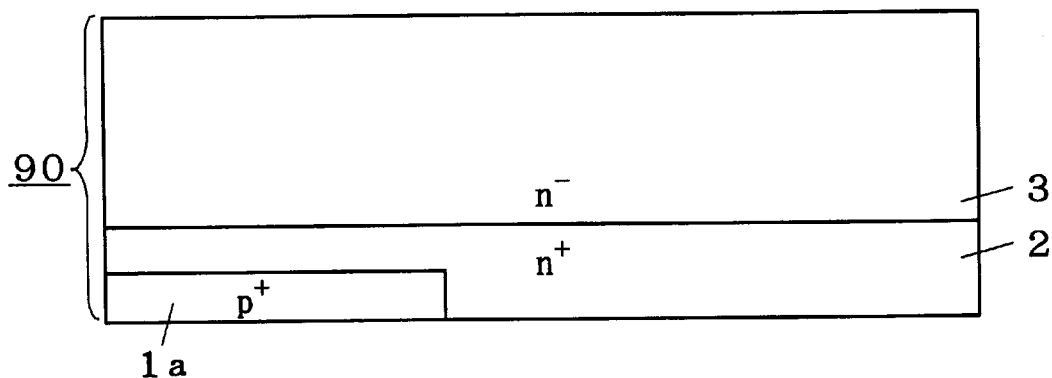
FIG. 78 is a view showing the process for manufacturing the device according to the twenty-third embodiment.
Figure 79:
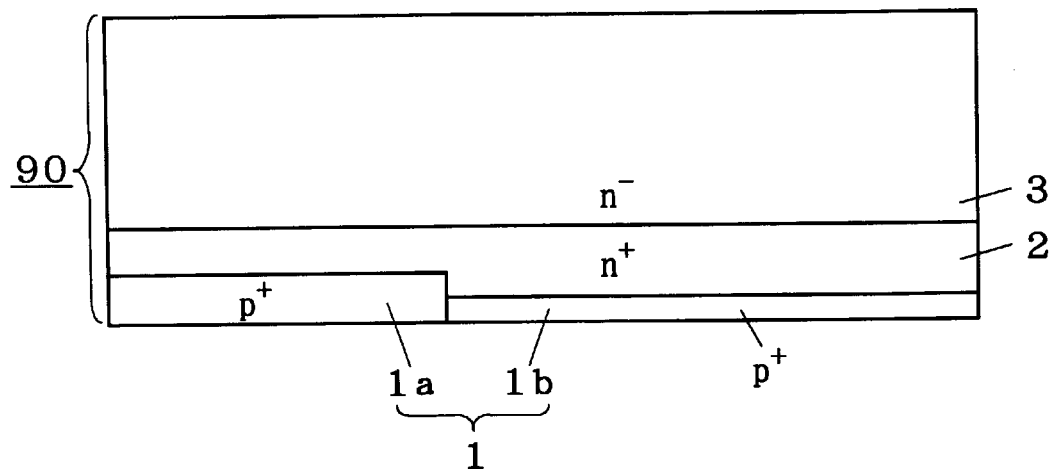
FIG. 79 is a view showing the process for manufacturing the device according to the twenty-third embodiment.

FIGS. 77 to 80 are views showing a preferred method for manufacturing the device 123. In order to manufacture the device 123, first of all, a semiconductor substrate 90 in which an $n^+$ buffer layer 2 and an $n^-$ layer 3 are provided is formed as shown in FIG. 77. Next, a $p^+$ collector layer 1a and a $p^+$ collector layer 1b are selectively formed on a lower major surface of the semiconductor substrate 90, that is, on an exposed surface of the $n^+$ buffer layer 2 as shown in FIGS. 78 and 79. Any of the $p^+$ collector layers 1a and 1b may be formed earlier.

Positions of the $p^+$ collector layers 1a and 1b are set to occupy a region to act as the main element 203 and a region where the protecting circuit is to be formed, respectively. Both of the $p^+$ collector layers 1a and 1b are selectively formed by selectively implanting a p-type impurity using a shield patterned by a well-known patterning technique and by then diffusing the implanted impurity.

A quantity of the impurity implanted to form the $p^+$ collector layer 1a is set higher than that of the impurity implanted to form the $p^+$ collector layer 1b. In order to diffuse the implanted impurities, for example, it is preferable that both of the impurities should be subjected to heat treatment at the same time. Consequently, the $p^+$ collector layers 1a and 1b having different thicknesses and impurity concentrations are obtained. Alternatively, it is also possible to vary the thicknesses by forming the $p^+$ collector layer 1b after the $p^+$ collector layer 1a is formed.

Figure 80:
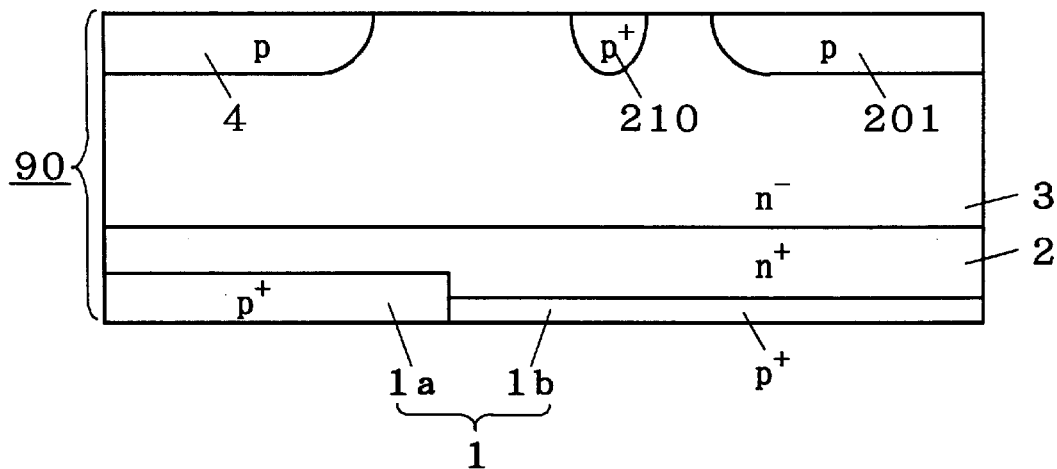
FIG. 80 is a view showing the process for manufacturing the device according to the twenty-third embodiment.

Then, a p base layer 4, a carrier removing layer 210 and a potential fixing layer 201 are selectively formed in an upper major surface of the semiconductor substrate 90, that is, in an exposed surface of the $n^-$ layer 3 as shown in FIG. 80. These layers are formed apart from each other. The p base layer 4 is formed above the $p^+$ collector layer 1a, and the carrier removing layer 210 and the potential fixing layer 201 are formed above, the $p^+$ collector layer 1b. Thereafter, the steps on and after FIG. 31 in the manufacturing method according to the seventeenth embodiment are executed. Thus, the device 123 is finished. It is not always required that the potential fixing electrode 202 is provided.

In the above-mentioned example, the $p^+$ collector layers $1a$ and $1b$ have been formed before the p base layer 4, the carrier removing layer 210 and the potential fixing layer 201 are formed. However, in a case where the $p^+$ collector layer $1a$ should be provided shallowly in respect of characteristics of the main element 203, the $p^+$ collector layers $1a$ an $1b$ may be formed after the p base layer 4, the carrier removing layer 210 and the potential fixing layer 201 are formed.

Thus, the device 123 can also be manufactured without requiring especially complicated steps in a well-known wafer process. In addition, most of the manufacturing steps can be shared between the main element and the protecting circuit. Consequently, the number of manufacturing steps and a manufacturing cost can be reduced.

<24. Twenty-fourth Embodiment>

Figure 81:
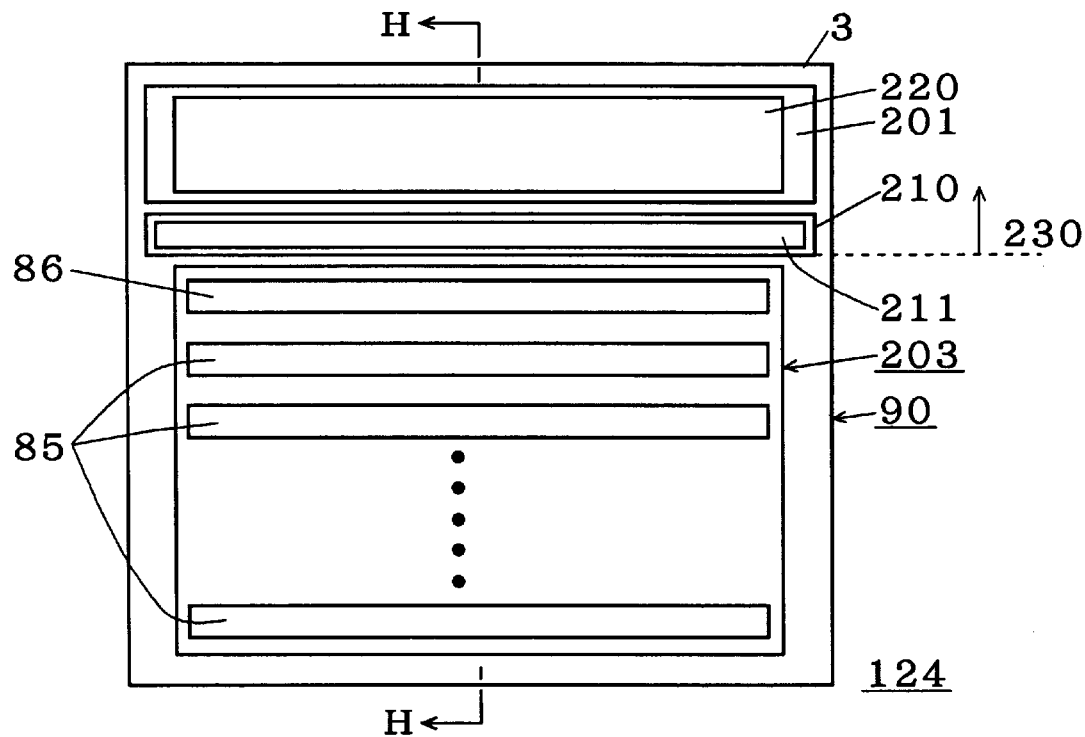
FIG. 81 is a plan view showing a device according to a twenty-fourth embodiment.
Figure 82:
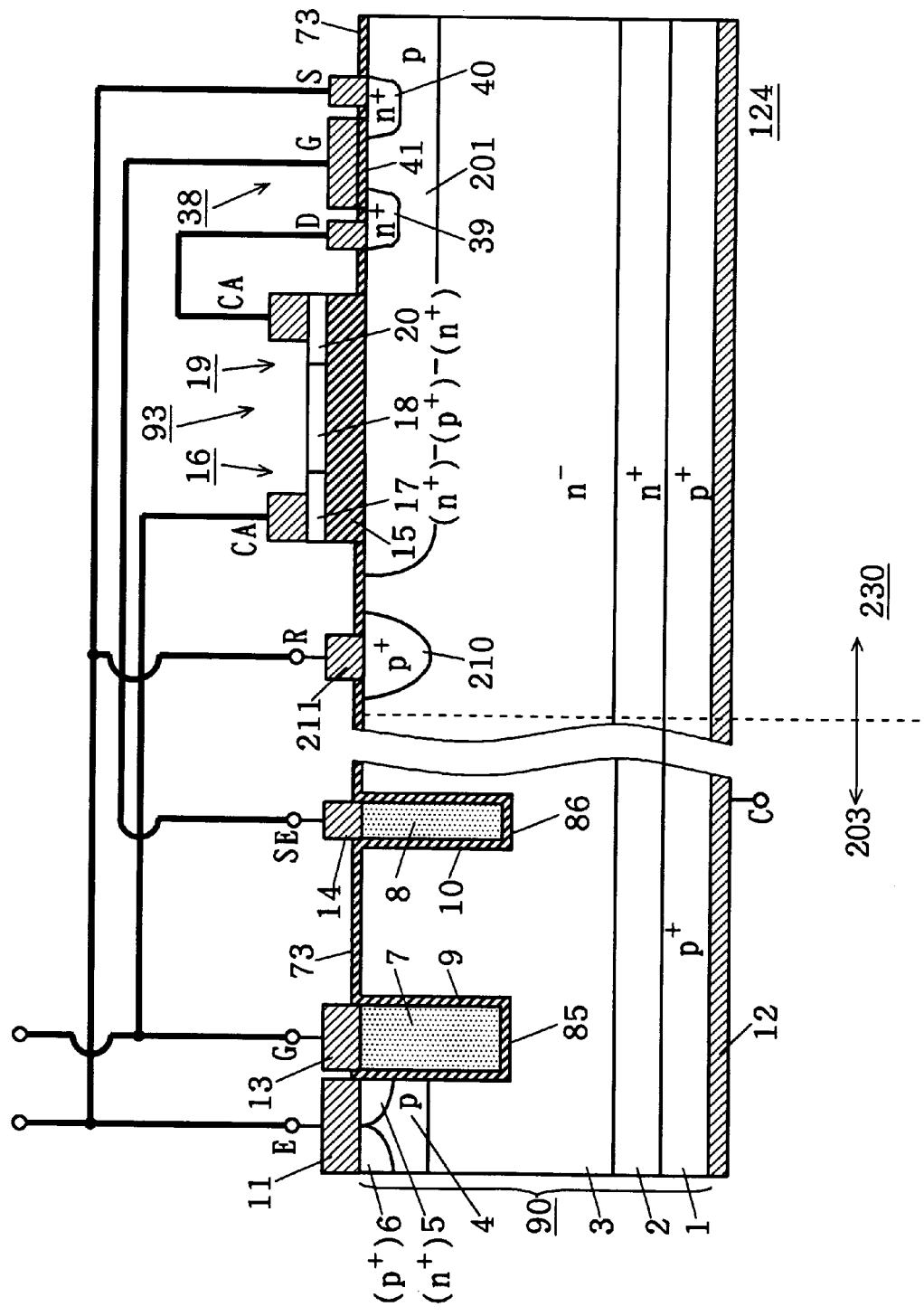
FIG. 82 is a sectional view taken along the line H—H in FIG. 81.

FIG. 81 is a plan view showing a semiconductor device according to a twenty-fourth embodiment, and FIG. 82 is a sectional view taken along the line H—H in FIG. 81. A device 124 is characteristically different from the device 122 according to the twenty-second embodiment in that a lifetime killer is selectively introduced by irradiation of electron beams or the like into a region in a semiconductor substrate 90 directly under a protecting circuit.

As shown in FIG. 82, the lifetime killer is selectively introduced into a region 230 of the semiconductor substrate 90 which includes the region directly under the protecting circuit and does not include a main element 203. The lifetime killer is a crystal defect which acts as a recombination center of carriers to promote annihilation of the carriers. In the region where the lifetime killer is introduced, a lifetime of minority carriers is shortened.

For this reason, excess carriers are decreased in the region 230. Therefore, a hole current flowing in an $n^-$ layer 3 is reduced in the region 230. As a result, a component of a main current flowing in the region directly under the protecting circuit is reduced more effectively. In other words, stability of the protecting circuit is enhanced more effectively. In particular, the lifetime killer is not introduced into a region directly under a buried sense electrode 8. Therefore, action of the $n^-$ layer 3 in the vicinity of the buried sense electrode 8 can be made equivalent to that of the main element 203. More specifically, the action of the main element 203 can be sensed with higher precision by the buried sense electrode 8.

Since the lifetime killer is introduced, the potential fixing electrode 202 (FIG. 74) is not connected with an exposed surface of a potential fixing layer 201 in the device 124. In the same manner as in the device 122, however, the potential fixing electrode 202 may be provided such that stability of the protecting circuit is enhanced still more.

Figure 83:
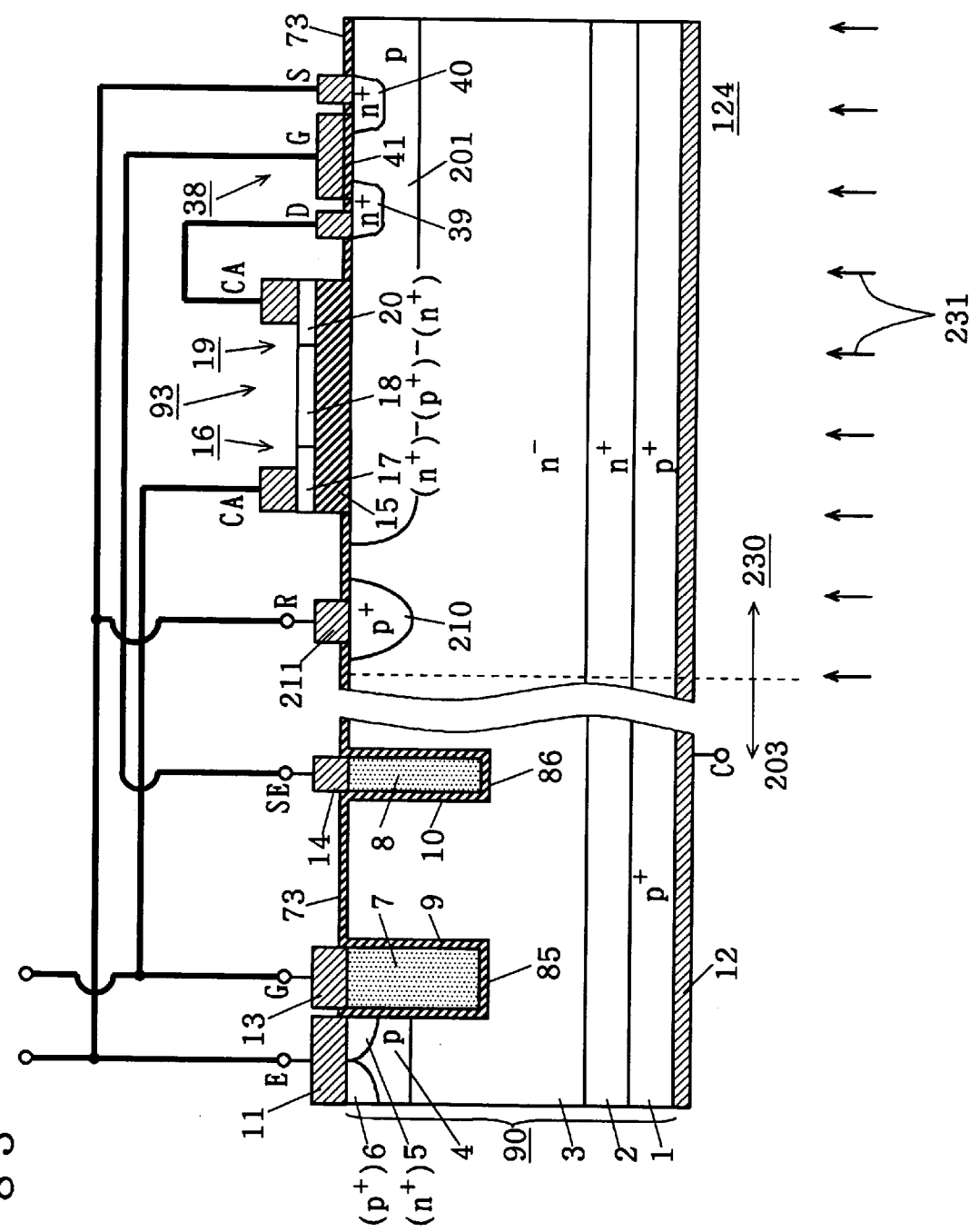
FIG. 83 is a view showing a process for manufacturing the device according to the twenty-fourth embodiment.

FIG. 83 is a view showing a preferred method for manufacturing the device 124.

In order to manufacture the device 124, an electron beam 231 is selectively irradiated on the region 230 after the device 122 according to the twenty-second embodiment is finished (the potential fixing electrode 202 does not always need to be provided) as shown in FIG. 83. As a result, the lifetime killer is introduced over the whole region 230.

A hydrogen ion beam may selectively be irradiated from a lower major surface of the semiconductor substrate 90 to the region 230 in place of the electron beam 231. A range of the hydrogen ion beam is not as long as that of the electron beam. Therefore, the lifetime killer is mainly introduced into a lower layer portion of the region 230. Even if the lifetime killer is introduced into a lower layer portion of the $n^-$ layer 3, a lifetime of holes acting as the minority carriers which are supplied from a $p^+$ collector layer 1 is shortened. It is also possible to select, as a time for executing the irradiation, a time before the device 122 is finished as well as a time thereafter.

Thus, the device 124 can also be manufactured without requiring especially complicated steps in a well-known wafer process. In addition, most of the manufacturing steps can be shared between the main element and the protecting circuit. Consequently, the number of manufacturing steps and a manufacturing cost can be reduced. Furthermore, stability of operation of the protecting circuit can effectively be enhanced simply by adding the step of irradiating electron beams or the like.

<25. Variant>

(1) The device according to each embodiment described above has a structure in which abnormalities generated on the main element are detected through the electric potential of the $n^-$ layer 3. More specifically, when the main element is formed as the IGBT or the EST except the MOSFET, an electric potential of a semiconductor region which is not directly connected with a pair of main electrodes, namely, any of the emitter electrode E and the collector electrode C, that is, an electric potential of another semiconductor region of a conductivity type different from a conductivity type of a semiconductor region directly connected with the electrodes is to be detected.

Consequently, a voltage to be applied to the sense electrode 14 is set lower than a voltage to be applied to the collector electrode C so that the protecting circuit such as the transistor M1 or the like can easily be formed. In an IGBT having a rated operating voltage of 1000 V, for example, the electric potential of the collector electrode C is varied within a range of 0 V to 1000 V even during normal operation. Also in this case, the voltage to be applied to the sense electrode 14 can be set within a range of 0 V to 5 V, for example, by forming the device in such a manner that the sense electrode 14 detects the electric potential of the $n^-$ layer 3.

Figure 84:
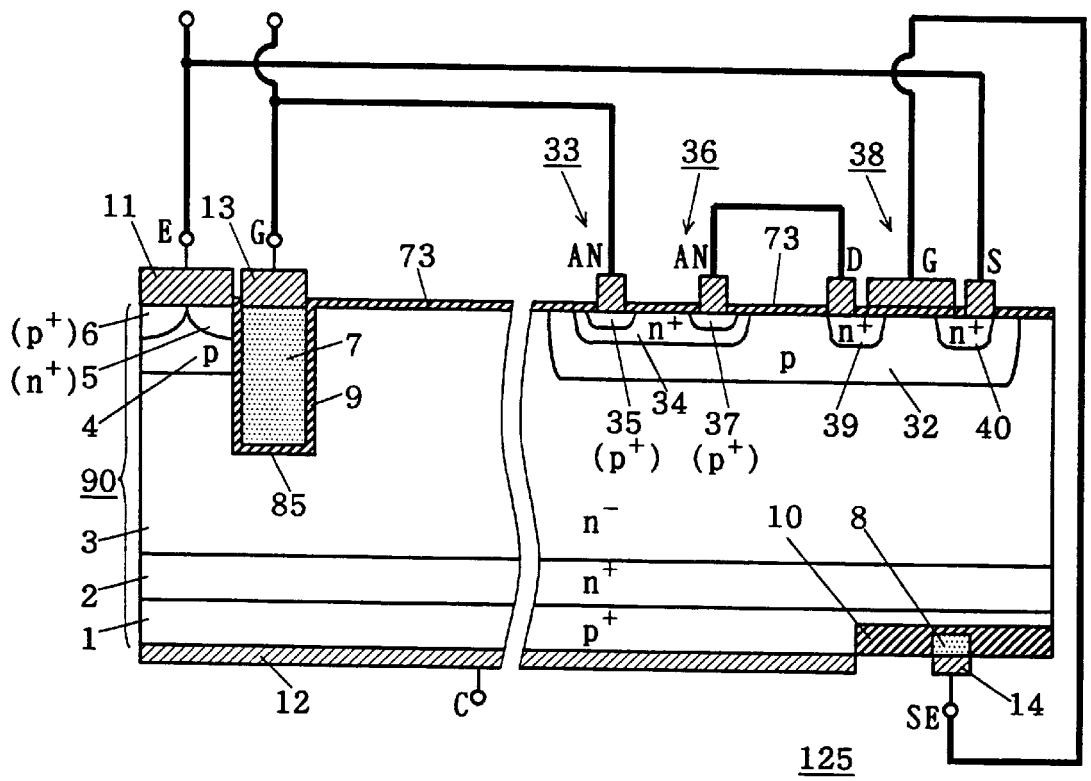
FIG. 84 is a sectional front view showing a device according to a variant.
Figure 85:
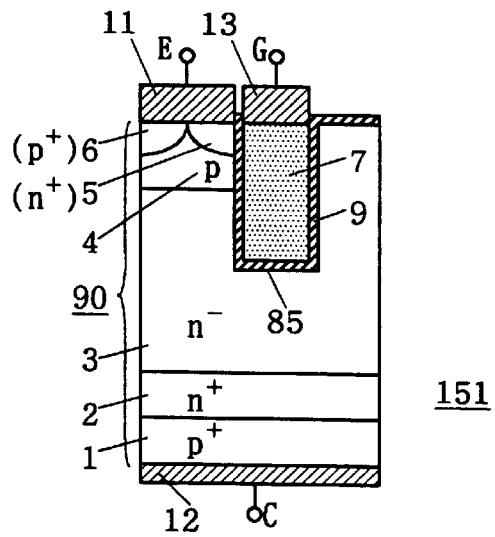
FIG. 85 is a sectional front view showing a first device according to the prior art.
Figure 86:
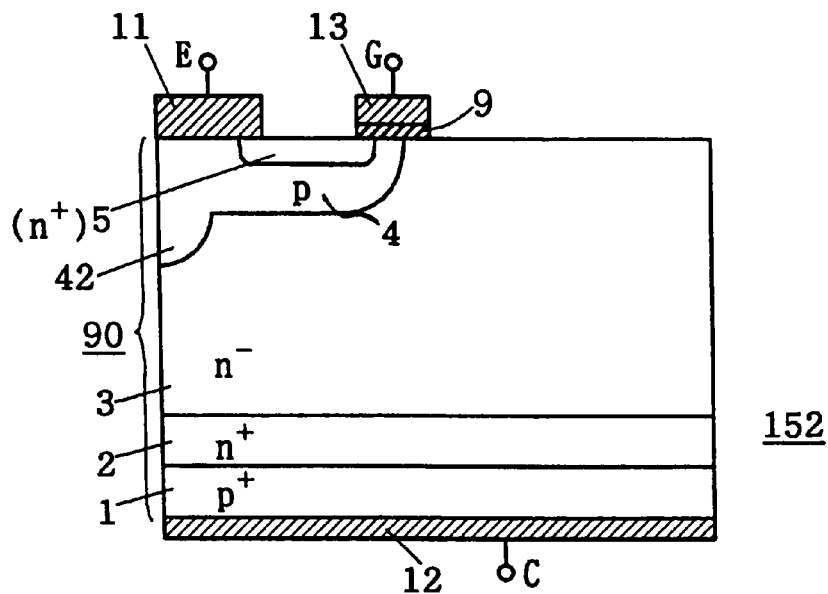
FIG. 86 is a sectional front view showing a second device according to the prior art.
Figure 87:
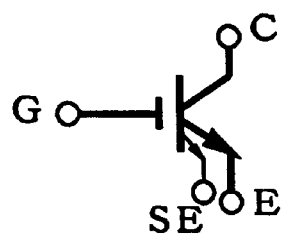
FIG. 87 is a diagram showing a circuit symbol of a third device according to the prior art.
Figure 88:
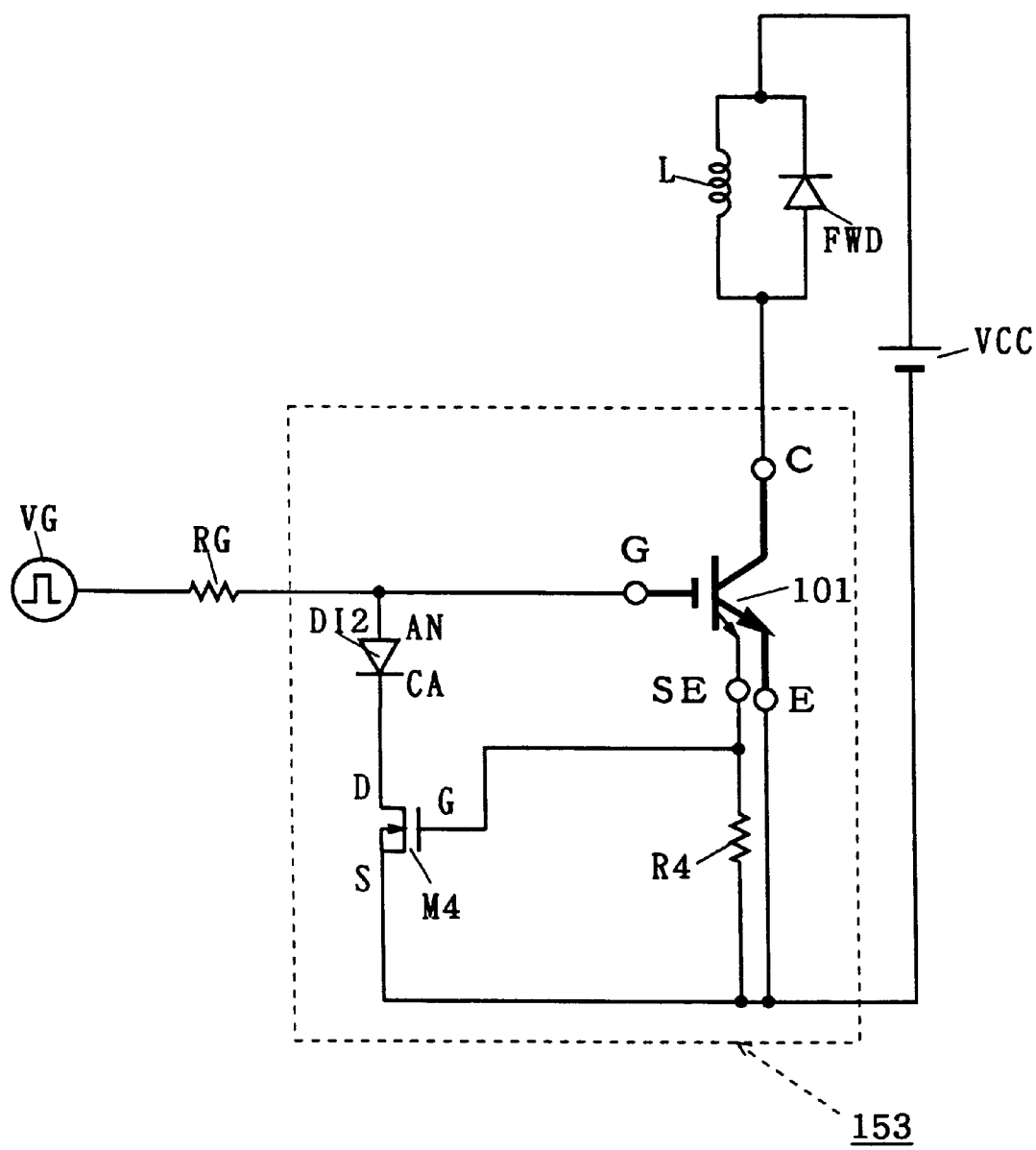
FIG. 88 is a circuit diagram showing the third device according to the prior art.

However, the device according to the present invention can generally be formed to detect an electric potential of a semiconductor region which is changed with a change in an electric potential of one of the main electrodes such as a collector electrode defining its reference value on an electric potential of the other main electrode such as an emitter electrode, that is, a ground potential. Accordingly, it is also possible to set, to a detection object, an electric potential of the semiconductor region directly connected with the main electrode which is not connected with the ground potential, that is, the collector electrode 12 in the examples of the IGBT and the EST, or an electric potential of the other semiconductor region joined with the above-mentioned semiconductor region having the same conductivity type. FIG. 84 is a sectional front view showing an example of the IGBT.

A device 125 is characteristically different from the device 107 (FIG. 28) in that a sense trench 86 is not provided on an upper major surface of a semiconductor substrate 90, and a buried sense electrode 8 is opposed to a semiconductor region exposed to a lower major surface of the semiconductor substrate 90, that is, a $p^+$ collector layer 1 with a sense oxide film 10 interposed therebetween. The device 117 is the same as the device 107 in that a sense electrode 14 is connected with the buried sense electrode 8 and is connected with a gate electrode G of a MOSFET 38 through a wiring.

More specifically, the sense electrode 14 detects an electric potential of the $p^+$ collector layer 1 which is a semiconductor layer directly connected with a collector electrode 12 in the device 125. Also in the device 125, generation of abnormalities on the IGBT acting as a main element can be detected through the sense electrode 14. Such form is also effective in an element having any rated operating voltage if a thickness of the sense oxide film 10 or the like is set in such a manner that the rated operating voltage is equal to or lower than a breakdown voltage of the sense oxide film 10. In particular, also in a case where a capacitance C (MOSFET) is large on the protecting circuit side as expressed by the Equation 1, a high detection sensitivity can be obtained.

(2) While the example in which the transistor M1 included in the protecting circuit is formed as a desirable MOSFET having the simplest structure has been described in the above-mentioned embodiments, the transistor M1 may generally be formed as a switching element which has an insulated gate and is turned ON/OFF in response to a voltage signal input to the insulated gate.

(3) While the preferred example in which the protecting circuit includes the Zener diode ZD having an excellent temperature characteristic has been described in the above-mentioned embodiments, a varistor for generating a constant voltage and other general voltage regulating elements can also be used in place of the Zener diode ZD. The voltage regulating element is provided between the transistor M1 and the gate electrode G of the main element in such a manner that a voltage drop generated by an ON-state current flowing in the transistor M1 can be kept constant when the transistor M1 is turned ON.

(4) While one polarity (conductivity type) such as the n-type IGBT or the like has been described in the above-mentioned embodiments, the present invention can easily be applied to a p-type IGBT or the like by changing a polarity or properly varying a relationship between quantities.

(5) While a power semiconductor device has generally been described in the above-mentioned embodiments, the present invention is not restricted thereto but can also be applied to a non-power semiconductor device such as a signal element.

(6) While examples of the main element being an insulated gate semiconductor element, e.g. IGBT, were shown in the foregoing embodiments, the present invention is not restricted thereto. For example, the present invention can be applied to the device which includes a bipolar transistor as a main element. In this configuration, the control electrode of the main element attached to the semiconductor substrate 90 is not a gate electrode which faces to the semiconductor substrate 90 with the insulating film interposed therebetween, but a base electrode which contacts with the semiconductor substrate 90.

While the invention has been described in detail, the foregoing description is in all aspects illustrative and not restrictive. It is understood that numerous other modifications and variations can be devised without departing from the scope of the invention.

I claim:

1. A semiconductor device comprising:
   a semiconductor substrate defining a major surface and including a plurality of semiconductor regions;
   first and second main electrodes contacting with said semiconductor substrate;
   a control electrode attached to said semiconductor substrate, a main current flowing in said semiconductor substrate across said first and second main electrodes being controlled in response to a signal input to said control electrode; and
   a voltage sensing section opposed to a portion of one of said semiconductor regions in which an electric potential is changed depending on a change in an electric potential of said second main electrode with reference-to an electric potential of said first main electrode with an insulating film interposed therebetween for sensing an electric potential of said portion.

2. The semiconductor device according to claim 1, wherein said voltage sensing section includes a conductor section forming a capacitor together with said portion and with said insulating film interposed therebetween.

3. The semiconductor device according to claim 2, further comprising a protecting circuit,
   said protecting circuit including a switching element having one main electrode and another main electrode and an insulated gate and serving to conduct and cut off said one main electrode and said other main electrode in response to a voltage signal input to said insulated gate, and
   said insulated gate being connected with said conductor section.

4. The semiconductor device according to claim 3, wherein said one main electrode is connected with said first main electrode, and said other main electrode is connected with said control electrode.

5. The semiconductor device according to claim 2, further comprising a protecting circuit,
   said protecting circuit including first to Nth (which is an integer not smaller than 2) switching elements,
   each of said 1st to Nth switching elements having one main electrode, the other main electrode and an insulated gate, and serving to conduct and cut off said one main electrodes and said other main electrode in response to a voltage signal input to said insulated gate,
   said first to Nth switching elements being connected with each other in such a manner that said Nth switching element is conducted and cut off if the first switching element is conducted and cut off, respectively,
   said insulated gate of said first switching element being connected with said conductor section, and
   said one main electrode and said other main electrode of said Nth switching element being connected with said first main electrode and said control electrode, respectively.

6. The semiconductor device according to claim 4, wherein said protecting circuit further includes a series circuit having a rectifying element and a voltage regulating element,
   said other main electrode is connected with said control electrode through said series circuit, and
   said rectifying element and said voltage regulating element are oriented in such a manner that an ON-state current of said switching element having said other main electrode connected with said control electrode flows in a forward direction in said rectifying element and a voltage drop caused by said ON-state current is kept constant by said voltage regulating element.

7. The semiconductor device according to claim 4, wherein said protecting circuit further includes a resistive element, and
   said other main electrode is connected with said control electrode through said resistive element.

8. The semiconductor device according to claim 3, wherein a gate threshold voltage of said switching element having said insulated gate connected with said conductor section is set to a value which is not larger than a maximum value of a voltage to be applied to said insulated gate within a range of a safety operating area defined by a voltage to be applied to said first and second main electrodes and a maximum value of said main current which can be cut off at said applied voltage.

9. The semiconductor device according to claim 3, further comprising an insulating layer formed on said major surface of said semiconductor substrate, wherein at least a part of said protecting circuit is formed as a thin film semiconductor circuit on said insulating layer.

10. The semiconductor device according to claim 9, wherein said conductor section and said insulated gate are integrally formed as one common portion.

11. The semiconductor device according to claim 3, wherein:
said semiconductor substrate includes a junction isolation region selectively formed in said major surface as one of said plurality of semiconductor regions;
said junction isolation region forms a pn-junction with a periphery surrounding the same; and
at least a part of said protecting circuit is formed in said junction isolation region.

12. The semiconductor device according to claim 2, wherein said conductor section is buried from a major surface to said major surface of said semiconductor substrate with said insulating film interposed therebetween.

13. The semiconductor device according to claim 12, wherein said control electrode is buried from said major surface to said inner portion of said semiconductor substrate with another insulating film interposed therebetween.

14. The semiconductor device according to claim 2, wherein said conductor section is opposed to said major surface of said semiconductor substrate with said insulating film interposed therebetween, and
said control electrode is opposed to said major surface of said semiconductor substrate with another insulating film interposed therebetween.

15. The semiconductor device according to claim 3, wherein said major surface of said semiconductor substrate is divided into M (=plural number) blocks,
said first main electrode, an second main electrode, said control electrode, said insulating film and said conductor section are divided into M unit first main electrodes, M unit second main electrodes, M unit control electrodes, M unit insulating films and M unit conductor sections, respectively,
said protecting circuit, said switching element, said one of main electrodes, said other main electrode and said insulated gate are divided into M unit protecting circuits, M unit switching elements, M unit main electrodes, M unit other main electrodes and M unit insulated gates, respectively,
said M unit first main electrodes, said M unit second main electrodes, said M unit control electrodes, said M unit insulating films, said M unit conductor sections, said M unit protecting circuits, said M unit switching elements, said M unit main electrodes, said M unit other main electrodes and said M unit insulated gates are respectively arranged with one-to-one correspondence in said M blocks, and
one of said M unit insulated gates and one of said M unit conductor sections which are arranged in each of said M blocks are connected with each other.

16. The semiconductor device according to claim 1, wherein said voltage sensing section includes a semiconductor section of a conductivity type which is opposed to said portion with said insulating film interposed therebetween and in which an inversion layer is formed by action of an electric potential of said portion.

17. The semiconductor device according to claim 16, wherein referring to said semiconductor section as a first semiconductor section, said device further comprising second and third semiconductor sections of conductivity types different from a conductivity type of said first semiconductor section which are formed on said insulating film and joined with said first semiconductor section interposed therebetween;
said second and third semiconductor sections being connected with said first main electrode and said control electrode, respectively.

18. The semiconductor device according to claim 16, wherein an impurity concentration of said semiconductor section is set such that an inversion layer is formed in said semiconductor section under rated conditions of said device.

19. The semiconductor device according to claim 17, further comprising a series circuit having a rectifying element and a voltage regulating element,
said third semiconductor section being coupled with said control electrode through said series circuit, and
said rectifying element and said voltage regulating element being oriented in such a manner that an ON-state current flowing in said first to third semiconductor sections flows in a forward direction in said rectifying element when an inversion layer is formed in said first semiconductor section, and a voltage drop caused by said ON-state current is kept constant by said voltage regulating element.

20. The semiconductor device according to claim 1, comprising said voltage sensing section being electrically isolated from said semiconductor regions and said semiconductor substrate by said insulating film.

* * * * *